(12) United States Patent
Murata et al.

(10) Patent No.: US 11,888,012 B2
(45) Date of Patent: Jan. 30, 2024

(54) SOLID-STATE IMAGE CAPTURING ELEMENT, SOLID-STATE IMAGE CAPTURING DEVICE, AND SOLID-STATE IMAGE CAPTURING ELEMENT READING METHOD

(71) Applicants: SONY CORPORATION, Tokyo (JP); SONY SEMICONDUCTOR SOLUTIONS CORPORATION, Kanagawa (JP)

(72) Inventors: Kenichi Murata, Kanagawa (JP); Masahiro Joei, Kanagawa (JP); Fumihiko Koga, Kanagawa (JP); Iwao Yagi, Kanagawa (JP); Shintarou Hirata, Kanagawa (JP); Hideaki Togashi, Kumamoto (JP); Yosuke Saito, Tokyo (JP); Shingo Takahashi, Kanagawa (JP)

(73) Assignees: SONY CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 539 days.

(21) Appl. No.: 17/261,221

(22) PCT Filed: Jul. 25, 2019

(86) PCT No.: PCT/JP2019/029324
§ 371 (c)(1),
(2) Date: Jan. 19, 2021

(87) PCT Pub. No.: WO2020/022462
PCT Pub. Date: Jan. 30, 2020

(65) Prior Publication Data
US 2021/0313381 A1 Oct. 7, 2021

(30) Foreign Application Priority Data

Jul. 26, 2018 (JP) .................................. 2018-140152

(51) Int. Cl.
*H01L 27/146* (2006.01)
*H04N 25/76* (2023.01)

(52) U.S. Cl.
CPC .. *H01L 27/14643* (2013.01); *H01L 27/14623* (2013.01); *H04N 25/76* (2023.01)

(58) Field of Classification Search
CPC ......... H01L 27/14643; H01L 27/14623; H01L 27/14627; H01L 27/14603;
(Continued)

(56) References Cited

U.S. PATENT DOCUMENTS 9,184,198 B1 11/2015 Miao et al.
2005/0263839 A1 12/2005 Suzuki
(Continued)

FOREIGN PATENT DOCUMENTS

JP 2016-062996 4/2016
JP 2016058559 A 4/2016
(Continued)

OTHER PUBLICATIONS

International Search Report prepared by the Japan Patent Office dated Sep. 30, 2019, for International Application No. PCT/JP2019/0293254.

*Primary Examiner* — Jack S Chen
(74) *Attorney, Agent, or Firm* — SHERIDAN ROSS P.C.

(57) ABSTRACT

Provided is a solid-state image capturing element including a semiconductor substrate and first and second photoelectric conversion parts configured to convert light into electric charge. The first and the second photoelectric conversion parts each have a laminated structure including an upper electrode, a lower electrode, a photoelectric conversion film
(Continued)

sandwiched between the upper electrode and the lower electrode, and an accumulation electrode facing the upper electrode through the photoelectric conversion film and an insulating film. The lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate.

20 Claims, 41 Drawing Sheets

(58) Field of Classification Search
CPC ......... H01L 27/14612; H01L 27/14636; H01L 27/14638; H01L 27/14641; H01L 27/14645; H01L 27/14665; H04N 25/76; H10K 39/32
See application file for complete search history.

(56) References Cited

U.S. PATENT DOCUMENTS

| | | | |
|---|---|---|---|
| 2016/0079464 | A1 | 3/2016 | Sasaki et al. |
| 2016/0240571 | A1 | 8/2016 | Baek |
| 2017/0148841 | A1 | 5/2017 | Matsumoto et al. |
| 2017/0257587 | A1 | 9/2017 | Hatano et al. |
| 2018/0219046 | A1 | 8/2018 | Yamaguchi et al. |
| 2019/0259815 | A1 | 8/2019 | Kataoka |
| 2021/0313381 | A1* | 10/2021 | Murata ............ H01L 27/14645 |

FOREIGN PATENT DOCUMENTS

| | | |
|---|---|---|
| JP | 2016-152417 | 8/2016 |
| JP | 2017-037952 | 2/2017 |
| JP | 2018-060910 | 4/2018 |
| TW | 201535697 A | 9/2015 |
| WO | WO 2016/002576 | 1/2016 |
| WO | WO-2016039152 A1 | 3/2016 |
| WO | WO-2017026109 A1 | 2/2017 |
| WO | WO-2018066256 A1 | 4/2018 |
| WO | WO 2018/096980 | 5/2019 |

\* cited by examiner

SOLID-STATE IMAGE CAPTURING ELEMENT, SOLID-STATE IMAGE CAPTURING DEVICE, AND SOLID-STATE IMAGE CAPTURING ELEMENT READING METHOD

CROSS REFERENCE TO RELATED APPLICATIONS

This application is a national stage application under 35 U.S.C. 371 and claims the benefit of PCT Application No. PCT/JP2019/029324 having an international filing date of 25 Jul. 2019, which designated the United States, which PCT application claimed the benefit of Japanese Patent Application No. 2018-140152 filed 26 Jul. 2018, the entire disclosures of each of which are incorporated herein by reference.

FIELD

The present disclosure relates to a solid-state image capturing element, a solid-state image capturing device, and a solid-state image capturing element reading method.

BACKGROUND

Recently disclosed charge coupled devices (CCD) image sensor and complementary metal-oxide-semiconductor (CMOS) image sensors (solid-state image capturing devices) include an image sensor in which three layers of photoelectric conversion films capable of performing photoelectric conversion of red light, green light, and blue light, respectively, are stacked in the longitudinal direction at each unit pixel (solid-state image capturing element) so that light of three colors can be detected by one unit pixel (for example, Patent Literatures 1 and 5 described below). Another exemplary image sensor in which light of three colors can be detected by one unit pixel is as follows. For example, as disclosed in Patent Literature 2 described below, the image sensor includes a semiconductor substrate on which two photodiodes (PDs) (photoelectric conversion elements) configured to detect red light and blue light, respectively, are stacked, and a photoelectric conversion film provided above the semiconductor substrate and capable of performing photoelectric conversion of green light.

For an image sensor including a semiconductor substrate on which two PDs are stacked and a photoelectric conversion film provided above the semiconductor substrate, a circuit configuration for taking out a pixel signal is as follows. For example, as disclosed in Patent Literature 3 described below, the circuit configuration has a back-surface irradiation structure in which a circuit formation layer is formed on a side opposite to a light-receiving surface of the image sensor, the above-described circuit being formed in the circuit formation layer.

Examples of other image sensors include an image sensor disclosed in Patent Literature 4 described below. Patent Literature 4 described below discloses a structure in which a semiconductor layer for accumulating and transferring electric charge obtained through photoelectric conversion and an accumulation electrode facing the above-described semiconductor layer through an insulating film are provided directly below a photoelectric conversion film provided above a semiconductor substrate. In this structure, electric charge generated through photoelectric conversion by the photoelectric conversion film can be efficiently stored in the photoelectric conversion film like a capacitor.

CITATION LIST

Patent Literature

Patent Literature 1: Japanese Patent Application Laid-open No. 2005-51115
Patent Literature 2: Japanese Patent Application Laid-open No. 2003-332551
Patent Literature 3: Japanese Patent Application Laid-open No. 2011-29337
Patent Literature 4: Japanese Patent Application Laid-open No. 2017-157816
Patent Literature 5: WO 2016/002576

SUMMARY

Technical Problem

When a plurality of PDs are provided at a unit pixel (solid-state image capturing element) as described above, an electric charge accumulation part (floating diffusion part) is provided for each PD in a semiconductor substrate to take out electric charge generated through photoelectric conversion at each PD. In addition, a penetration electrode, a wire, and the like penetrating through the above-described semiconductor substrate are provided for each PD to transfer electric charge generated through photoelectric conversion at the PD to the corresponding electric charge accumulation part. In such a laminated structure, for example, the size of an entrance surface for light incident on each PD provided in the semiconductor substrate decreases along with an increase in the area of fabrication of the semiconductor substrate due to formation of the penetration electrode. As a result, the amount of light incident on the above-described PD decreases, and thus the sensitivity characteristic of the PD decreases. When the size reduction of the entrance surface of the above-described PD is avoided, the area of a chip on which an image sensor (solid-state image capturing device) is mounted increases, and it becomes difficult to avoid an increase in manufacturing cost of the solid-state image capturing device.

In addition, in the above-described laminated structure, since the penetration electrode penetrating through the semiconductor substrate is formed for each PD, crystalline of the semiconductor substrate decreases, and it becomes difficult to avoid degradation of the dark current characteristic of the image sensor.

To solve such a situation, the present disclosure provides a solid-state image capturing element, a solid-state image capturing device, and a solid-state image capturing element reading method that are novel, modified, and capable of avoiding an increase in manufacturing cost as well as degradation of characteristics.

Solution to Problem

According to the present disclosure, a solid-state image capturing element includes: a semiconductor substrate; a first photoelectric conversion part provided above the semiconductor substrate and configured to convert light into electric charge; and a second photoelectric conversion part provided above the first photoelectric conversion part and configured to convert light into electric charge. In the solid-state image capturing element, the first and the second photoelectric conversion parts each have a laminated structure including an upper electrode, a lower electrode, a photoelectric conversion film sandwiched between the upper electrode and the lower electrode, and an accumulation electrode facing the upper electrode through the photoelectric conversion film and an insulating film, and the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part is provided in common to the first and the second photoelectric conversion parts in the semiconductor substrate.

Also, according to the present disclosure, a solid-state image capturing device includes a plurality of solid-state image capturing elements disposed in a matrix, each of the solid-state image capturing elements includes a semiconductor substrate, a first photoelectric conversion part provided above the semiconductor substrate and configured to convert light into electric charge, and a second photoelectric conversion part provided above the first photoelectric conversion part and configured to convert light into electric charge. In the solid-state image capturing device, the first and the second photoelectric conversion parts each have a laminated structure including an upper electrode, a lower electrode, a photoelectric conversion film sandwiched between the upper electrode and the lower electrode, and an accumulation electrode facing the upper electrode through the photoelectric conversion film and an insulating film, and the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part is provided in common to the first and the second photoelectric conversion parts in the semiconductor substrate.

Moreover, according to the present disclosure, a solid-state image capturing element includes a semiconductor substrate, a first photoelectric conversion part provided above the semiconductor substrate and configured to convert light into electric charge, and a second photoelectric conversion part provided above the first photoelectric conversion part and configured to convert light into electric charge, the first and the second photoelectric conversion parts each has a laminated structure including an upper electrode, a lower electrode, a photoelectric conversion film sandwiched between the upper electrode and the lower electrode, and an accumulation electrode facing the upper electrode through the photoelectric conversion film and an insulating film, and the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part is provided in common to the first and the second photoelectric conversion parts in the semiconductor substrate. And, a solid-state image capturing element reading method includes: controlling the accumulation electrode of each of the first and the second photoelectric conversion parts to sequentially transfer electric charge accumulated in the photoelectric conversion film of each of the first and the second photoelectric conversion parts to the lower electrode of each of the first and the second photoelectric conversion parts in a temporally sequential manner; and sequentially accumulating the electric charge sequentially transferred to the lower electrode of each of the first and the second photoelectric conversion parts in the common electric charge accumulation part and sequentially reading the accumulated electric charge.

Advantageous Effects of Invention

According to the present disclosure as described above, it is possible to provide a solid-state image capturing element, a solid-state image capturing device, and a solid-state image capturing element reading method that are capable of avoiding an increase in manufacturing cost as well as degradation of characteristics.

Note that the above-described effect is not necessarily restrictive, but any effect indicated in the present specification or any other effect that could be understood from the present specification may be achieved together with or in place of the above-described effect.

DESCRIPTION OF EMBODIMENTS

Figure 1:
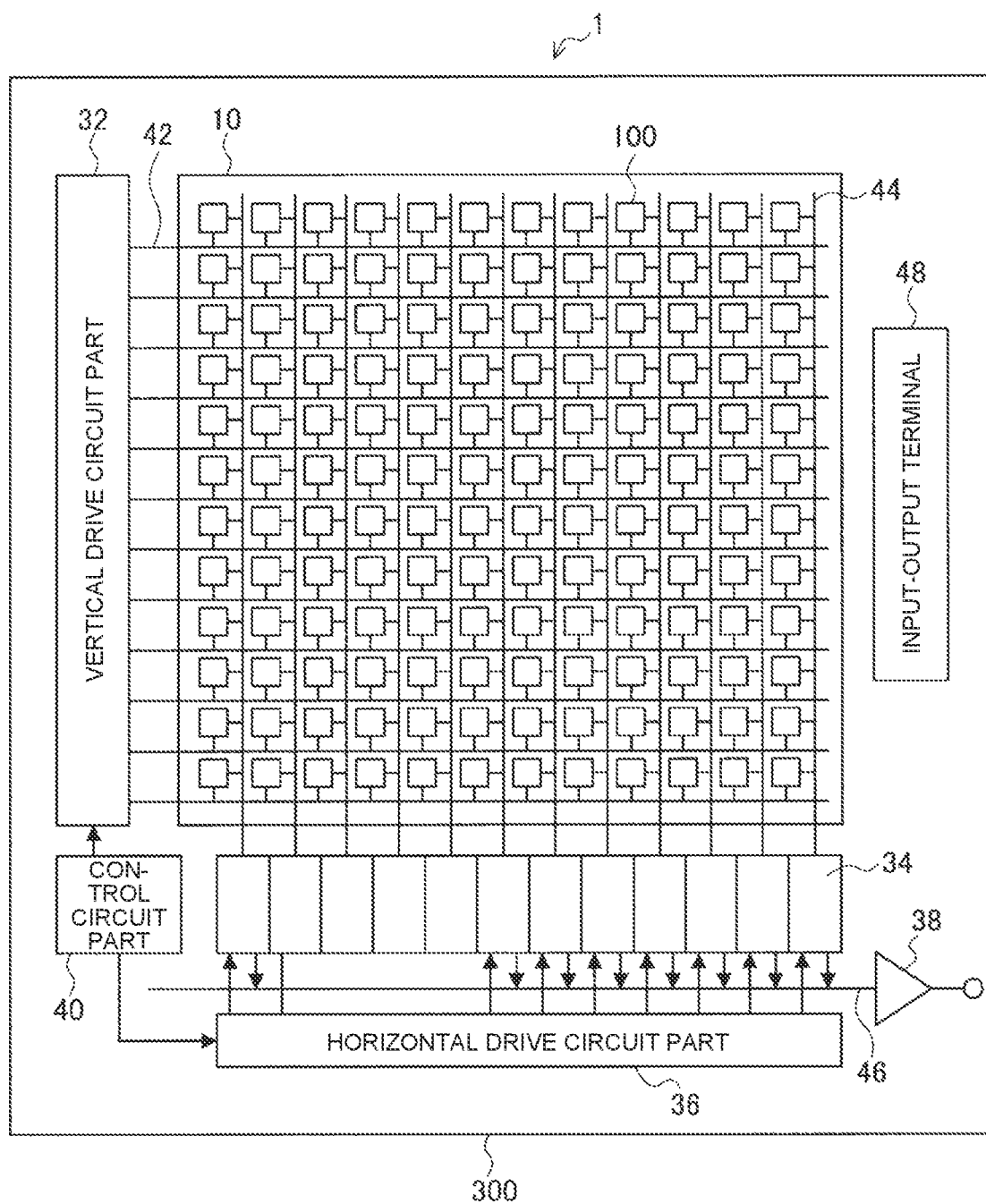
FIG. 1 is an explanatory diagram illustrating an exemplary planar configuration of a solid-state image capturing device 1 according to a first embodiment of the present disclosure.

Preferable embodiments of the present disclosure will be described below in detail with reference to the accompanying drawings. Note that in the present specification and drawings, components having functional configurations identical to each other in effect are denoted by an identical reference sign, and duplication description thereof will be omitted.

In the present specification and drawings, similar components in different embodiments may be denoted by an identical reference sign followed by different alphabets to distinguish the components. However, the similar components are denoted by only the identical reference sign when not needed to be distinguished from each other.

The drawings to be referred to in the following description are drawings for facilitating description and understanding of the embodiments of the present disclosure, and shapes, dimensions, ratios, and the like illustrated in the drawings are different from those in reality in some cases for simplicity. In addition, a solid-state image capturing element and a solid-state image capturing device illustrated in the drawings may be changed in designing as appropriate based on the following description and well-known technologies. In description using a cross-sectional view of a solid-state image capturing element, the up-down direction of a laminated structure of the solid-state image capturing element corresponds to a relative direction when an entrance surface through which light is incident on the solid-state image capturing element is placed on the upper side, and is different from an up-down direction in accordance with the gravitational acceleration in some cases.

In the following description of a circuit configuration, "electrical connection" means connection of a plurality of elements to allow electrical conduction therebetween unless otherwise stated. In addition, "electrical connection" in the following description includes not only direct and electrical connection of a plurality of elements but also indirect and electrical connection through another element.

In the following description, "sharing" is use of one element (for example, an electrode) by elements (for example, PDs) different from each other, more specifically, use of one element by different elements through electrical connection with the one element.

In the following description, a "gate" means the gate electrode of field effect transistor (FET). A "drain" means the drain electrode or drain region of the FET, and a "source" means the source electrode or source region of the FET.

Note that the following description will be performed in an order as follows.

Figure 13:
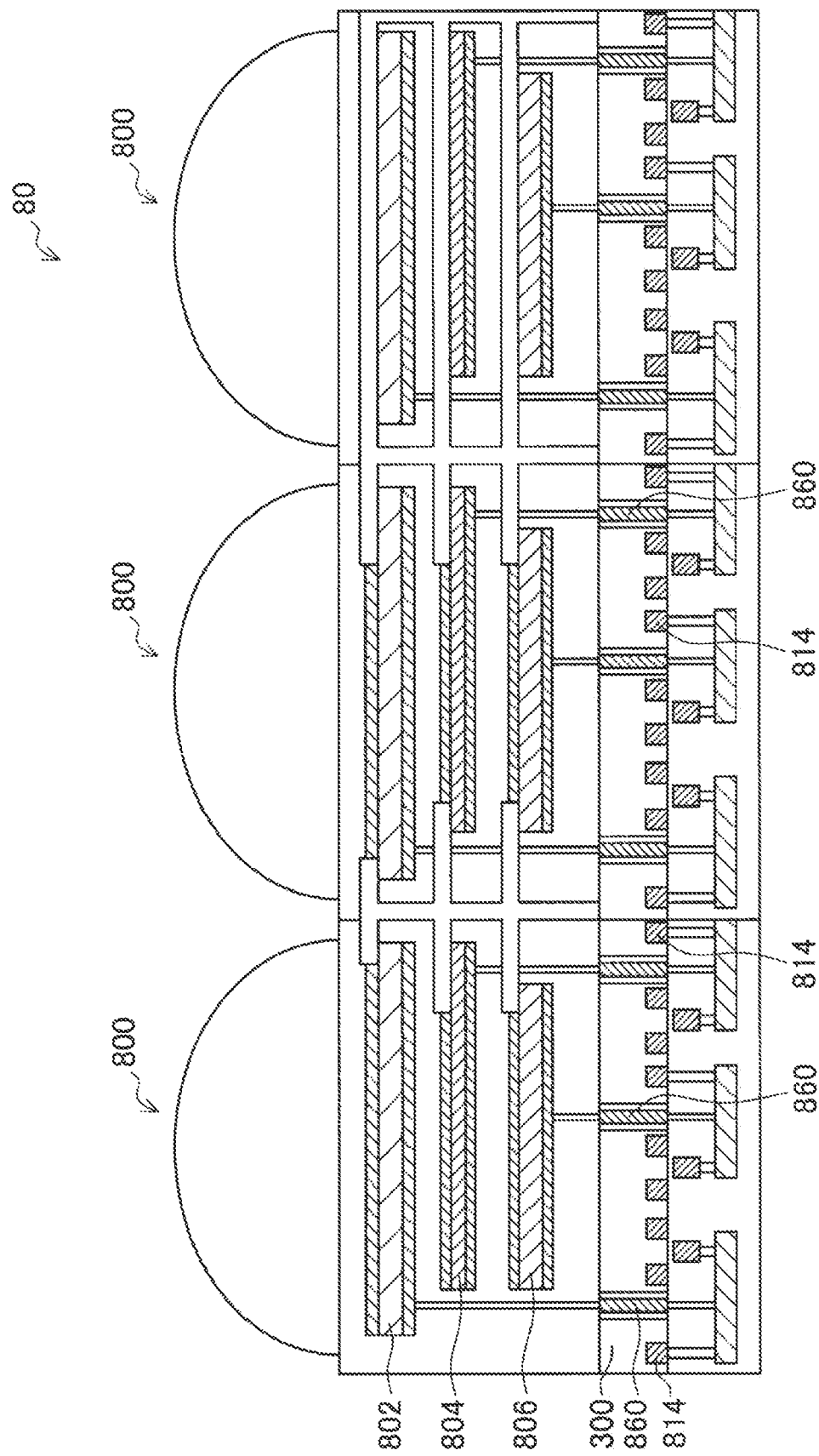
FIG. 13 is a cross-sectional view of a pixel array part 80 according to a comparative example.

1. Background of creation of embodiments of the present disclosure by the inventors
2. First Embodiment
2.1 Schematic configuration of solid-state image capturing device 1
2.2 Laminated structure of solid-state image capturing element 100
2.3 Arrangement configuration of solid-state image capturing element 100
2.4 Equivalent circuit of solid-state image capturing element 100
2.5 Reading method for solid-state image capturing element 100
3. Second Embodiment
4. Third Embodiment
5. Fourth Embodiment
6. Fifth Embodiment
7. Sixth Embodiment
8. Seventh Embodiment
9. Exemplary application to endoscope operation system
10. Exemplary application to moving object
11. Summary
12. Supplement 1. Background of Creation of Embodiments of the Present Disclosure by the Inventors First, the background of creation of embodiments of the present disclosure by the inventors will be described below with reference to FIG. 13 before description of details of each embodiment of the present disclosure. FIG. 13 is a cross-sectional view of a pixel array part 80 according to a comparative example. The comparative example means a solid-state image capturing device (image sensor) that was discussed by the inventors before creation of the embodiments of the present disclosure.

Recently, the size of each pixel in an image sensor has been required to be reduced, but the amount of light incident on a unit pixel decreases along with reduction of the pixel size, and thus the sensitivity of each pixel decreases, and the signal/noise (S/N) ratio decreases.

In an image sensor, a configuration (for example, a Bayer array) in which pixels including primary color filters and configured to detect red, green, and blue light, respectively, are arrayed on a plane has been widely used. In such a configuration, for example, green light and blue light are unlikely transmit through a color filter included in a pixel configured to detect red light, and thus are not photoelectrically converted, in other words, detected at the pixel. Thus, in the above-described configuration, since each pixel can detect light of one particular color but cannot detect light of the other colors, light incident on the pixel is not sufficiently used, in other words, a loss occurs from a viewpoint of pixel sensitivity. In addition, in the above-described configuration, interpolation processing between pixels is performed, and thus a false color occurs due to color signal generation through interpolation.

Examples of a method of solving the above-described situation include an image sensor in which three layers of photoelectric conversion films capable of performing photoelectric conversion of red light, green light, and blue light, respectively, are stacked in the longitudinal direction at each unit pixel so that light of three colors can be detected by one unit pixel (for example, Patent Literatures 1 and 5 described above). Another image sensor in which light of three colors can be detected by one unit pixel is as follows. For example, as disclosed in Patent Literature 2 described above, such an image sensor includes a semiconductor substrate on which two PDs configured to detect, red light and blue light, respectively, are stacked and a photoelectric conversion film provided above the semiconductor substrate and capable of performing photoelectric conversion of green light.

For an image sensor including a semiconductor substrate on which two PDs are stacked and a photoelectric conversion film provided above the semiconductor substrate, a circuit configuration for taking out a pixel signal is as follows. For example, as disclosed in Patent Literature 3 described above, the circuit configuration has a back-surface irradiation structure in which a circuit formation layer is formed on a side opposite to a light-receiving surface of the image sensor, the above-described circuit being formed in the circuit formation layer. In a case of the above-described structure, for example, no circuit nor wire are provided between each PD in the semiconductor substrate and the photoelectric conversion film provided above the semiconductor substrate. Thus, with this structure, it is possible to shorten the distance between each PD and the photoelectric conversion film in the stacking direction (longitudinal direction) in an identical pixel. As a result, in this structure, F value dependency of each color can be reduced, and the sensitivity difference among colors can be reduced.

Another image sensor is, for example, an image sensor disclosed in Patent Literature 4 described above. Patent Literature 4 described above discloses a structure in which a semiconductor layer for accumulating and transferring electric charge obtained through photoelectric conversion and an accumulation electrode facing the above-described semiconductor layer through an insulating film are provided directly below a photoelectric conversion film provided above a semiconductor substrate. In this structure, electric charge generated through photoelectric conversion by the photoelectric conversion film can be efficiently stored in the photoelectric conversion film like a capacitor. In addition, in the above-described structure, since electric charge can be accumulated in the photoelectric conversion film, an electric charge accumulation part (floating diffusion part) provided in the semiconductor substrate can be completely depleted to delete electric charge at exposure start. As a result, with this structure, it is possible to prevent occurrence of a phenomenon in which random noise increases along with an increase in kTC noise (noise generated through thermal fluctuation of electric charge) due to electric charge at the above-described electric charge accumulation part and thus the quality of an image captured by the image sensor degrades.

When a plurality of PDs are provided at each unit pixel as described above (for example, Patent Literature 5 described above), the electric charge accumulation part is provided for each PD in the semiconductor substrate to take out electric charge generated through photoelectric conversion at the PD. In addition, a penetration electrode, a wire, and the like penetrating through the above-described semiconductor substrate are provided for each PD to transfer electric charge generated through photoelectric conversion at the PD to the corresponding electric charge accumulation part. A solid-state image capturing element 800 having such a structure will be described below with reference to FIG. 13. FIG. 13 is a cross-sectional view of the pixel array part 80 including a plurality of solid-state image capturing elements 800 two-dimensionally disposed in a matrix on a semiconductor substrate 300 in the solid-state image capturing device according to the comparative example. FIG. 13 illustrates the solid-state image capturing element 800 so that an entrance surface through which light is incident on the solid-state image capturing element 800 is positioned on the upper side.

Specifically, in the comparative example, PDs 802, 804, and 806 are stacked on the semiconductor substrate 300 as illustrated in FIG. 13. In the comparative example, the PDs 802, 804, and 806 are each electrically connected with a floating diffusion part (electric charge accumulation part) 814 provided in the semiconductor substrate 300 to temporarily accumulate generated electric charge. More specifically, in the comparative example, the PDs 802, 804, and 806 are each electrically connected with the corresponding floating diffusion part 814 through a penetration electrode 860 provided penetrating through the semiconductor substrate 300.

In such a comparative example, for example, the size of an entrance surface (length in the right-left direction in FIG. 13) for light incident on each of the PDs 802, 804, and 806 reduces due to provision of a plurality of the penetration electrodes 860, and accordingly, the amount of light incident on each of the PDs 802, 804, and 806 decreases. As a result, in the comparative example, the amount of light incident on the above-described PDs 802, 804, and 806 decreases, and thus the sensitivity characteristics of the PDs 802, 804, and 806 degrade. When the size reduction of the entrance surfaces of the above-described PDs 802, 804, and 806 is avoided, the area of a chip on which an image sensor (solid-state image capturing device) is mounted increases, and it becomes difficult to avoid an increase in manufacturing cost of the image sensor.

In addition, in the comparative example, the number of penetration electrodes 860 penetrating through the semiconductor substrate 300 is equal to the number of PDs 802, 804, and 806, and thus, crystalline of the semiconductor substrate 300 decreases, and it becomes difficult to avoid degradation of the dark current characteristic of the image sensor.

To solve the above-described situation, the inventors performed diligent discussion on a solid-state image capturing element capable of avoiding an increase in manufacturing cost as well as degradation of characteristics. During the discussion, the inventors have found out that one electric charge accumulation part and one penetration electrode can be shared between different PDs by using a feature that electric charge can be temporarily accumulated in the photoelectric conversion film of each PD by using the above-described accumulation electrode. When one electric charge accumulation part and one penetration electrode can be shared by different PDs, it is possible to avoid size reduction of the entrance surface of each PD due to provision of a plurality of penetration electrodes, thereby avoiding decrease of the amount of light incident on each PD. Thus, through the above-described sharing between different PDs, it is possible to avoid decrease of the sensitivity characteristic of each PD. In addition, when one electric charge accumulation part and one penetration electrode can be shared between different PDs as described above, it is possible to avoid an increase in the area of a chip on which an image sensor is mounted, and thus it is possible to avoid an increase in manufacturing cost of the solid-state image capturing device. In addition, when one penetration electrode can be shared between different PDs, the number of penetration electrodes penetrating through a semiconductor substrate can be reduced, and thus it is possible to avoid degradation of the dark current characteristic of the image sensor due to decrease of crystalline of the semiconductor substrate.

Accordingly, the inventors have reached creation of the embodiments of the present disclosure, starting at the above-described idea. Details of the embodiments of the present disclosure will be sequentially described below.

2. First Embodiment

<2.1 Schematic Configuration of Solid-State Image Capturing Device 1>

The following first describes a schematic configuration of a solid-state image capturing device 1 according to a first embodiment of the present disclosure with reference to FIG. 1. FIG. 1 is an explanatory diagram illustrating an exemplary planar configuration of the solid-state image capturing device 1 according to the present embodiment. As illustrated in FIG. 1, the solid-state image capturing device 1 according to the present embodiment includes a pixel array part 10, a vertical drive circuit part 32, a column signal processing circuit part 34, a horizontal drive circuit part 36, an output circuit part 38, a control circuit part 40, and the like, which are provided on the semiconductor substrate 300 made of, for example, silicon. Each block of the solid-state image capturing device 1 according to the present embodiment will be described below in detail.

(Pixel Array Part 10)

The pixel array part 10 includes a plurality of solid-state image capturing elements (pixels) 100 two-dimensionally disposed in a matrix on the semiconductor substrate 300. Each solid-state image capturing element 100 means a solid-state image capturing element (unit pixel) that can be regarded as one unit configured to detect light of colors and output one result for each color when outputting detection result. Each solid-state image capturing element 100 includes a plurality of photoelectric conversion elements (PDs) (not illustrated) and the plurality of pixel transistors (for example, metal-oxide-semiconductor (MOS) transistors) (not illustrated). More specifically, this pixel transistor may include, for example, a transfer transistor, a selection transistor, a reset transistor, and an amplification transistor. Details of a circuit (connection configuration) of the pixel transistors will be described later.

(Vertical Drive Circuit Part 32)

The vertical drive circuit part 32 is formed of, for example, a shift register, selects a pixel drive wire 42, supplies a pulse for driving the solid-state image capturing elements 100 to the selected pixel drive wire 42, and drives the solid-state image capturing elements 100 in units of rows. Specifically, the vertical drive circuit part 32 sequentially selects and scans the solid-state image capturing elements 100 of the pixel array part 10 in units of rows in a vertical direction (up-down direction in FIG. 1), and supplies a pixel signal based on electric charge generated in accordance with the received-light quantity of each PD of each solid-state image capturing element 100 to the column signal processing circuit part 34 to be described later through a vertical signal line 44.

(Column Signal Processing Circuit Part 34)

The column signal processing circuit part 34 is disposed for each column of the solid-state image capturing element 100 and performs signal processing such as noise removal on a pixel signal in the corresponding pixel column among pixel signals output from the solid-state image capturing elements 100 in one row. For example, the column signal processing circuit part 34 performs signal processing such as correlated double sampling (CDS) and analog-digital (AD) conversion to remove fixed pattern noise unique to a pixel.

(Horizontal Drive Circuit Part 36)

The horizontal drive circuit part 36 is formed of, for example, a shift register and sequentially selects the above-described column signal processing circuit parts 34 by sequentially outputting horizontal scanning pulses so that a pixel signal can be output from each column signal processing circuit part 34 to a horizontal signal line 46.

(Output Circuit Part 38)

The output circuit part 38 can perform signal processing on pixel signals sequentially supplied from the above-described column signal processing circuit part 34 through the horizontal signal line 46 and can output the pixel signals. The output circuit part 38 may function as, for example, a functional component configured to perform buffering or may perform processing such as black level adjustment, column variance correction, and various kinds of digital signal processing. The buffering is temporary storage of a pixel signal to compensate differences in processing speed and transfer speed in communication of the pixel signal. An input-output terminal 48 is a terminal for transmitting and receiving signals with an external device.

(Control Circuit Part 40)

The control circuit part 40 can receive an input clock and data that commands an operation mode or the like and can output data such as internal information of each solid-state image capturing element 100. Specifically, the control circuit part 40 generates, based on a vertical synchronizing signal, a horizontal synchronizing signal, and a master clock, a clock signal as a reference for operation of the vertical drive circuit part 32, each column signal processing circuit part 34, the horizontal drive circuit part 36, and the like, and a control signal. Then, the control circuit part 40 outputs the generated clock signal and control signal to the vertical drive circuit part 32, each column signal processing circuit part 34, the horizontal drive circuit part 36, and the like.

Note that the exemplary planar configuration of the solid-state image capturing device 1 according to the present embodiment is not limited to the example illustrated in FIG. 1, but for example, may include another circuit or the like and is not particularly limited.

<2.2 Laminated Structure of Solid-State Image Capturing Element 100>

Figure 2:
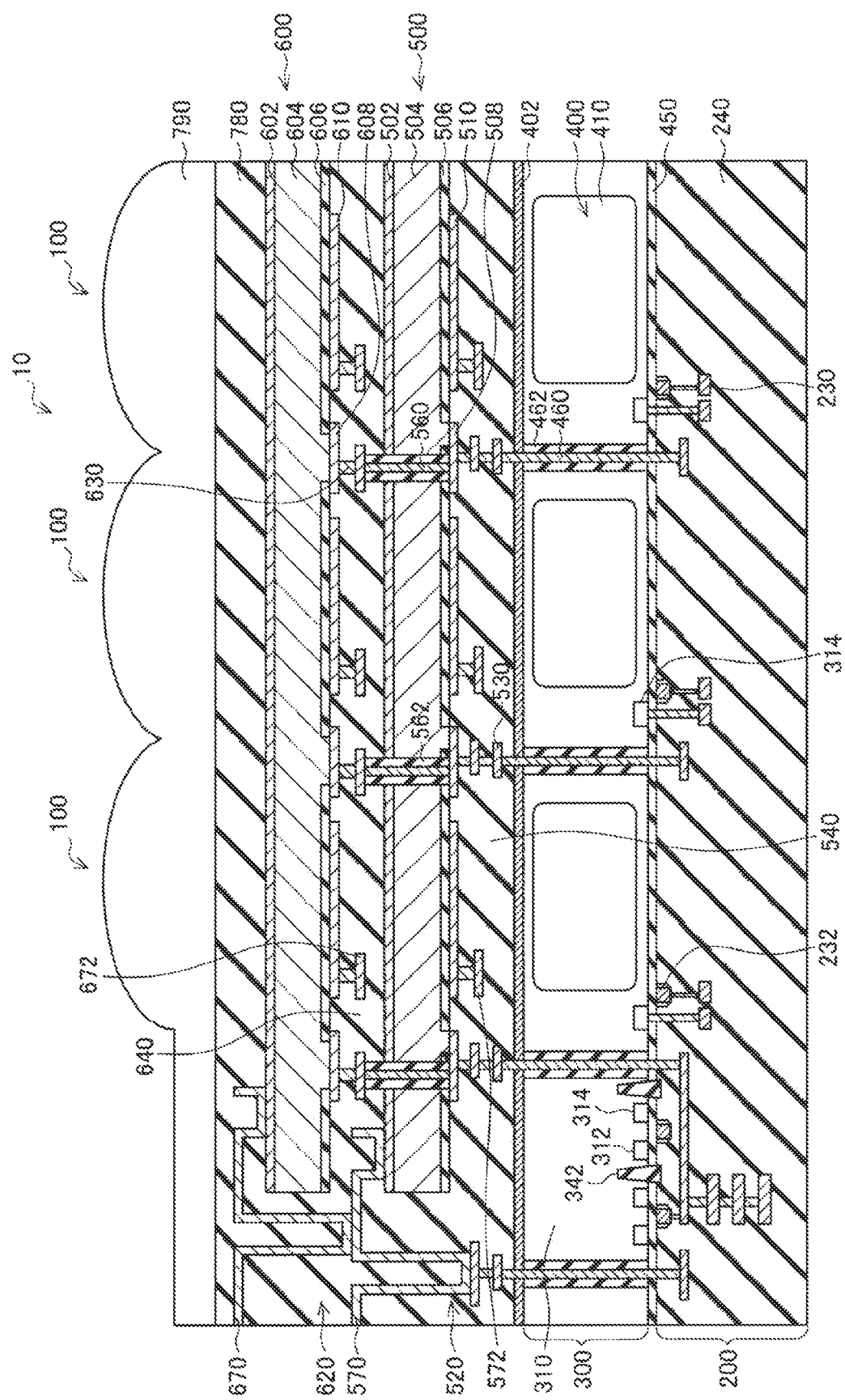
FIG. 2 is a cross-sectional view of a pixel array part 10 according to the first embodiment of the present disclosure.

The schematic configuration of the solid-state image capturing device 1 according to the present embodiment is described above. The following describes a laminated structure of each solid-state image capturing element 100 according to the present embodiment with reference to FIG. 2. FIG. 2 is a cross-sectional view of the pixel array part 10 according to the present embodiment. In FIG. 2, the solid-state image capturing element 100 is illustrated so that an entrance surface through which light is incident on the solid-state image capturing element 100 is positioned on the upper side. In the following, the laminated structure of the solid-state image capturing element 100 will be described in the order from the semiconductor substrate 300 positioned on the lower side of the solid-state image capturing element 100 to a PD 500 (first photoelectric conversion part) provided above the semiconductor substrate 300, and a PD 600 (second photoelectric conversion part) provided above the PD 500.

Specifically, as illustrated in FIG. 2, in the solid-state image capturing element 100, a semiconductor region 310 of a first conduction type (for example, the P type) of the semiconductor substrate 300 made of, for example, silicon includes a semiconductor region 410 of a second conduction type (for example, the N type). A PD 400 (fourth photoelectric conversion part) configured to convert light into electric charge is formed in the semiconductor substrate 300 by a PN junction due to the semiconductor region 410. Note that, in the present embodiment, the PD 400 is, for example, a photoelectric conversion element configured to absorb red light (for example, light having a wavelength of 600 nm to 700 nm) and generate electric charge.

In addition, a wiring layer 200 including a wire 230 formed of tungsten (W), aluminum (Al), copper (Cu), cobalt (Co), ruthenium (Ru), or the like, and an interlayer insulating film 240 formed of oxide silicon ($SiO_2$) or the like is provided on a side (in FIG. 2, the lower side) of the semiconductor substrate 300, which is opposite to the entrance surface. In addition, in the wiring layer 200, a plurality of electrodes 232 formed of W, Al, Cu, or the like are provided as gate electrodes of the plurality of pixel transistors for reading electric charge generated at the PDs 400, 500, and 600. Specifically, the electrodes 232 are provided facing, through an insulating film 450, the semiconductor region 310 of the first conduction type (for example, the P type) in the semiconductor substrate 300. In addition, in the semiconductor substrate 300, a semiconductor region 312 of the second conduction type (for example, the N type) is provided adjacent to the above-described semiconductor region 310 of the first conduction type, and the semiconductor region 312 functions as the source-drain region of each above-described pixel transistor. Note that, in the present embodiment, some pixel transistors provided in the semiconductor substrate 300 are shared by the PDs 500 and 600 provided above the semiconductor substrate 300. Specifically, in the present embodiment, some of the plurality of pixel transistors are common pixel transistors shared by the PDs 500 and 600.

In addition, a floating diffusion part (common electric charge accumulation part) 314 as a semiconductor region of the second conduction type (for example, the N type) is provided in the semiconductor substrate 300. The floating diffusion part 314 can temporarily accumulate electric charge generated at the PDs 400, 500, and 600. In the present embodiment, some of a plurality of the floating diffusion parts 314 are provided in common to the PDs 500 and 600, in other words, shared by the PDs 500 and 600 to temporarily accumulate electric charge generated at the PDs 500 and 600. In the present embodiment, in the semiconductor substrate 300, a separation insulating film 342 formed of $SiO_2$ or the like may be provided adjacent to the floating diffusion part 314 and the semiconductor region 312 as the source-drain region of each pixel transistor described above.

In the present embodiment, as illustrated in FIG. 2, a penetration electrode (common penetration electrode) 460 shared by the PDs 500 and 600 for taking, out to the wire 230, electric charge generated at the PDs 500 and 600 to be described later, is provided penetrating through the semiconductor substrate 300. The penetration electrode 460 may be formed of a metal film made of Cu, W, Al, or the like. In addition, an insulating film 462 made of $SiO_2$ or the like is provided covering the outer periphery of the penetration electrode 460 to prevent short-circuiting between the penetration electrode 460 and the semiconductor substrate 300. In addition, in the present embodiment, a barrier metal film (not illustrated) may be provided between the penetration electrode 460 and the insulating film 462 surrounding the outer periphery of the penetration electrode 460. The barrier metal film may be formed of a material such as titanium nitride (TiN), tungsten nitride (WN), titanium (Ti), tantalum nitride (TaN), tantalum (Ta), zirconium (Zr), Ru, or Co.

The above-described penetration electrode 460 can electrically connect reading electrodes (lower electrodes) 508 and 608 of the PDs 500 and 600 to be described later to the floating diffusion part 314 provided at the semiconductor substrate 300 through the wire 230 provided at the above-described wiring layer 200. Thus, the above-described floating diffusion part 314 can temporarily accumulate, through the penetration electrode 460, electric charge generated through photoelectric conversion at the PDs 500 and 600. In addition, the penetration electrode 460 can electrically connect the reading electrodes 508 and 608 of the PDs 500 and 600 to the corresponding pixel transistor provided at the semiconductor substrate 300.

Note that the above-described penetration electrode 460 can be formed as described below. For example, a through-hole penetrating through the semiconductor substrate 300 is produced, and the insulating film 462 and the above-described barrier metal are deposited by a physical vapor deposition (PVD) method, a chemical vapor deposition (CVD) method, an atomic layer deposition (ALD) method, or the like to cover the inner wall of the through-hole. In addition, for example, the deposited insulating film 462 and above-described barrier metal are etched, and then a metal film made of Cu, W, Al, or the like is deposited by a plating method, the CVD method, the PVD method, or the ALD method to block the through-hole. In this manner, the penetration electrode 460 can be formed.

In the present embodiment, a semiconductor region (not illustrated) of the first conduction type (for example, the P type) may be provided on the entrance surface of the semiconductor substrate 300, and in addition, an antireflection film 402 made of aluminum oxide ($Al_2O_3$) may be provided on the semiconductor region.

In the present embodiment, as illustrated in FIG. 2, for example, an insulating film 540 made of $SiO_2$ or the like and capable of transmitting light and a wiring layer (first wiring layer) 520 including a wire (first wire) 530 formed of W or the like are provided being sandwiched between the semiconductor substrate 300 and the PD 500. Since the insulating film 540 can transmit light, the PD 400 provided below the insulating film 540 can receive light and perform photoelectric conversion, in other words, detect the light. The reading electrodes 508 and 608 of the PDs 500 and 600 to be described later are electrically connected with the above-described penetration electrode 460 through the wire 530.

In the present embodiment, a photoelectric conversion film 504 is provided on the wiring layer 520 and sandwiched between a common electrode (upper electrode) 502 shared between the solid-state image capturing elements 100 adjacent to each other (specifically, adjacent to each other in the right-left direction in FIG. 2), and the reading electrode 508 through which electric charge generated at the photoelectric conversion film 504 is read. The common electrode 502, the photoelectric conversion film 504, and the reading electrode 508 are part of a laminated structure of the PD 500 (first photoelectric conversion part) configured to convert light into electric charge. In the present embodiment, the PD 500 is, for example, a photoelectric conversion element configured to absorb green light (for example, light having a wavelength of 500 nm to 600 nm) and generate (photoelectrically convert) electric charge. Note that details of the materials of the common electrode 502, the photoelectric conversion film 504, and the reading electrode 508 will be described later.

In the present embodiment, as illustrated in FIG. 2, the PD 500 includes an accumulation electrode 510 facing the common electrode 502 through the photoelectric conversion film 504 and an insulating film 506 to temporarily accumulate, in the photoelectric conversion film 504, electric charge generated at the photoelectric conversion film 504. In the present embodiment, the accumulation electrode 510 may face the common electrode 502 further through a semiconductor layer (not illustrated) provided being sandwiched between the photoelectric conversion film 504 and the insulating film 506. The above-described semiconductor layer is provided to more efficiently accumulate electric charge and preferably formed of an oxide semiconductor material capable of transmitting light. Note that details of the materials of the accumulation electrode 510, the insulating film 506, and the semiconductor layer will be described later.

As illustrated in FIG. 2, the reading electrode 508 contacting the photoelectric conversion film 504 is electrically connected with the floating diffusion part 314 provided at the semiconductor substrate 300 through the penetration electrode 460. The common electrode 502 is electrically connected with a wire 570 through which desired potential is applied to the common electrode 502. The accumulation electrode 510 is electrically connected with a wire 572 through which desired potential is applied to the accumulation electrode 510.

Thus, in the present embodiment, electric charge generated at the photoelectric conversion film 504 can be accumulated at an interface of the photoelectric conversion film 504 or the photoelectric conversion film 504 and taken out to the floating diffusion part 314 by controlling potential applied to the common electrode 502, the reading electrode 508, and the accumulation electrode 510. In other words, the accumulation electrode 510 can function as an electric charge accumulation electrode for attracting electric charge generated at the photoelectric conversion film 504 and accumulating the electric charge in the photoelectric conversion film 504 in accordance with applied potential. Note that in the present embodiment, to effectively use light incident on the solid-state image capturing element 100, the accumulation electrode 510 is preferably provided to have an area larger than that of the reading electrode 508 when the solid-state image capturing element 100 is viewed from above the entrance surface.

In the present embodiment, as illustrated in FIG. 2, for example, an insulating film 640 made of $SiO_2$ or the like and capable of transmitting light and a wiring layer (second wiring layer) 620 including a wire (second wire) 630 formed of W or the like are provided being sandwiched between the PD 500 and the PD 600. Since the insulating film 640 can transmit light, the PD 500 provided below the insulating film 640 can receive the light and perform photoelectric conversion, in other words, detect the light. The reading electrode 608 of the PD 600 to be described later is electrically connected with a penetration electrode (first penetration electrode) 560 to be described later through the wire 630.

In the present embodiment, as illustrated in FIG. 2, the penetration electrode 560 is provided penetrating through part of the wiring layer 620 and the PD 500 from the wire 630 to the reading electrode 508 of the PD 500. Specifically, the reading electrode 608 of the PD 600 is electrically connected with the reading electrode 508 of the PD 500 through the penetration electrode 560. In addition, the reading electrode 608 of the PD 600 is electrically connected with the floating diffusion part 314 provided at the semiconductor substrate 300 through the penetration electrode 560 and the penetration electrode 460. Thus, the above-described floating diffusion part 314 can temporarily accumulate, with the penetration electrodes 460 and 560, electric charge generated through photoelectric conversion at the PD 600. In addition, the reading electrode 608 of the PD 600 can be electrically connected with the corresponding pixel transistor provided at the semiconductor substrate 300 through the penetration electrode 560 and the penetration electrode 460. Note that in the present embodiment, the penetration electrode 560 may penetrate through part of the wiring layer 620 and the PD 500 or may penetrate through the PD 500 only, and thus is not particularly limited.

In the present embodiment, the penetration electrode 560 may be formed of a metal film made of Cu, W, Al, or the like. Alternatively, the penetration electrode 560 may be formed of a transparent conductive film of indium tin oxide (ITO), indium zinc oxide (IZO), or the like. In addition, an insulating film 562 made of $SiO_2$ or the like may be provided on the outer periphery of the penetration electrode 560 to prevent short-circuiting between the penetration electrode 560 and the PD 500. In addition, in the present embodiment, a barrier metal film (not illustrated) may be provided between the penetration electrode 560 and the insulating film 562 surrounding the outer periphery of the penetration electrode 560. The barrier metal film may be formed of a material such as TiN.

Note that the above-described penetration electrode 560 can be formed as described below. For example, a through-hole penetrating through the PD 500 is produced and the insulating film 562 is deposited by the PVD method, the CVD method, the ALD method, or the like to cover the inner wall of the through-hole. In addition, for example, the deposited insulating film 562 is etched, and then a metal film made of Cu or the like is deposited by the plating method, the CVD method, the PVD method, or the ALD method to block the through-hole. In this manner, the penetration electrode 560 can be formed.

In the present embodiment, the PD 600 (second photoelectric conversion part) configured to convert light into electric charge is provided on the wiring layer 620. The PD 600 is, for example, a photoelectric conversion element configured to absorb blue light (for example, light having a wavelength of 400 nm to 500 nm) and generate (photoelectrically convert) electric charge. Specifically, a common electrode (upper electrode) 602, a photoelectric conversion film 604, an insulating film 606, a reading electrode (lower electrode) 608, and an accumulation electrode 610 are sequentially stacked as the PD 600.

The reading electrode 608 contacting the photoelectric conversion film 604 is electrically connected with the penetration electrode 460 through the penetration electrode 560. The common electrode 602 is electrically connected with a wire 670 through which desired potential is applied to the common electrode 602. The accumulation electrode 610 is electrically connected with a wire 672 through which desired potential is applied to the accumulation electrode 610.

Accordingly, as illustrated in FIG. 2, the PD 500 and the PD 600 include the common electrodes 502 and 602, the photoelectric conversion films 504 and 604, the reading electrodes 508 and 508, respectively. In addition, the order in which the above-described layers are stacked is identical between the laminated structures of the PD 500 and the PD 600. In other words, the reading electrodes 508 and 608, the photoelectric conversion films 504 and 604, and the common electrodes 502 and 602 are sequentially stacked from below in the photoelectric conversion laminated structures of the PDs 500 and 600, respectively.

Note that in the present embodiment, the stacking order of the layers in the PD 500 and the PD 600 does not need to be the above-described order, but the layers may be stacked in the order of a symmetric relation in the stacking direction. In the present embodiment, the reading electrodes 508 and 608, the accumulation electrodes 510 and 610, and the like of the PD 500 and the PD 600 do not need to completely overlap with each other when the solid-state image capturing element 100 is viewed from above the entrance surface. Thus, in the present embodiment, arrangement of the layers included in the PDs 500 and 600 when the solid-state image capturing element 100 is viewed from above the entrance surface is not particularly limited.

The above-described photoelectric conversion films 504 and 604 may be formed of an organic material (organic photoelectric conversion film) or an inorganic material (inorganic photoelectric conversion film). For example, when the photoelectric conversion films are formed of an organic material, any of the four forms of (a) a P-type organic semiconductor material, (b) an N-type organic semiconductor material, (c) a laminated structure of at least two of a P-type organic semiconductor material layer, an N-type organic semiconductor material layer, and a mixed layer (bulk heterostructure) of a P-type organic semiconductor material and an N-type organic semiconductor material, and a (d) a mixed layer of a P-type organic semiconductor material and an N-type organic semiconductor material may be selected. Note that a photoelectric conversion film made of an organic material includes, for example, a laminated structure in which an electron-blocking and buffer film contacting the reading electrodes 508 and 608, a photoelectric conversion film, a hole-blocking film, a hole-blocking and buffer film, and a work-function adjustment film are stacked.

Specifically, examples of the P-type organic semiconductor material include a naphthalene derivative, an anthracene derivative, a phenanthrene derivative, a pyrene derivative, a perylene derivative, a tetracene derivative, a pentacene derivative, a quinacridone derivative, a coumarin derivative, a pyrromethene derivative, a pyrane derivative, a phenoxazone derivative, a thiophene derivative, a thieno thiophene derivative, a benzo thiophene derivative, a benzo thieno benzo thiophene (BTBT) derivative, a dinaphtho thieno thiophene (DNTT) derivative, a dianthraceno thieno thiophene (DATT) derivative, a benzo bis benzo thiophene (BBBT) derivative, a naphthalene bis benzo thiophene (NBBT), a thieno bis benzo thiophene (TBBT) derivative, a dibenzo thieno bis benzo thiophene (DTBDT) derivative, a dithieno benzo dithiophene (DTBDT) derivative, a dibenzo thieno dithiophene (DBTDT) derivative, a benzo dithiophene (BDT) derivative, a naphtho dithiophene (NDT) derivative, a an anthraceno dithiophene (ADT) derivative, a tetraceno dithiophene (TDT) derivative, a pentaceno dithiophene (PDT) derivative, a triallyl amine derivative, a carbazole derivative, a picene derivative, a chrysene derivative, a fluoranthene derivative, a phthalocyanine derivative, a sub phthalocyanine derivative, a sub porphyrazine derivative, a metal complex including a heterocyclic compound as a ligand, a polythiophene derivative, a poly benzothiadiazole derivative, and a polyfluorene derivative.

Examples of the N-type organic semiconductor material include fullerene, a fullerene derivative (for example, fullerene (high-order fullerene) such as C60, C70, and C74, endohedral fullerene) or a fullerene derivative (for example, fullerene fluoride, a phenyl-$C_{61}$-butyric acid methyl ester (PCBM) fullerene compound, a fullerene multimeric complex)), an organic semiconductor having a highest occupied molecular orbital (HOMO) and a lowest unoccupied molecular orbital (LUMO) deeper than those of the P-type organic semiconductor, and an inorganic metallic oxide capable of transmitting light. More specifically, examples of the N-type organic semiconductor material include an organic molecule, an organic metal complex, and a sub phthalocyanine derivative containing, at part of a molecular skeleton, a heterocyclic compound containing a nitrogen atom, an oxygen atom, and a sulfur atom, for example, a pyridine derivative, a pyrromethene derivative, a pyrazine derivative, a pyrimidine derivative, a triazine derivative, a quinoline derivative, a quinozaline derivative, an isoquinoline derivative, a coumarin derivative, a pyrane derivative, a phenoxazone derivative, a perylene derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a carbazole derivative, a benzofuran derivative, a dibenzofuran derivative, a sub porphyrazine derivative, a polyphenylenevinylene derivative, a polybenzothiadiazole derivative, a polyfluorene derivative, or the like. Examples of radicals included in a fullerene derivative include a bifurcating or cyclic alkyl radical or phenyl radical; a radical containing a linear or condensed aromatic compound; a radical containing halide; a partial fluoro alkyl radical; a perfluoro alkyl radical; a silyl alkyl radical; silyl alkoxy radical; an allele silyl radical; an allele sulphanilic radical; an alkyl sulphanilic radical; an allele sulfonyl radical; an alkyl sulfonyl radical; an allele sulfide radical; an alkyl sulfide radical; an amino radical; an alkyl amino radical; an allele amino radical; a hydroxy radical; an alkoxy radical; an acyl amino radical; an acyl oxy radical; a carbonyl radical; a carboxy radical; a carboxyso amide radical; a carbo alkoxy radical; an acyl radical; a sulfonyl radical; a cyano radical; a nitro radical; a radical containing chalcogenide; a phosphine radical; a phosphonic radical; and their derivatives. Note that the film thickness of a photoelectric conversion film formed of an organic material is not limited but is, for example, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m. Although organic semiconductor materials are classified into the P-type and the N-type in the above description, the P-type means that holes are likely to be transferred, and the N-type means that electrons are likely to be transferred. Specifically, an organic semiconductor material is not limited to interpretation that holes or electrons are contained as major carriers of thermal excitation like an inorganic semiconductor material.

The photoelectric conversion films 504 and 604 may be formed of polymer such as phenylenevinylene, fluorene, carbazole, indole, pyrene, pyrrol, picoline, thiophene, acetylene, or diacetylene, or a derivative thereof.

When the photoelectric conversion films 504 and 604 are formed of an inorganic material, examples of an inorganic semiconductor material include crystal silicon, amorphous silicon, microcrystal silicon, crystal selenium, amorphous selenium, chalcopyrite compounds such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, III-V compounds such as GaAs, InP, AlGaAs, InGaP, AlGaInP, and InGaAsP, and compound semiconductors such as CdSe, CdS, $In_2Se_3$, $In_2S_3$, $Bi_2Se_3$, $Bi_2S_3$, ZnSe, ZnS, PbSe, and PbS. In the present embodiment, quantum dots made of the above-described materials may be used as the photoelectric conversion films 504 and 604.

In addition, to detect blue light and green light, the photoelectric conversion films 504 and 604 may preferably use, for example, metal complex pigment, rhodamine-based pigment, quinacridone-based pigment, cyanine-based pigment, merocyanine-based pigment, phenyl xanthene-based pigment, triphenylmethane-based pigment, rhodacyanine-based pigment, xanthene-based pigment, macrocyclic azaannulene-based pigment, azulene-based pigment, naphthoquinone, anthraquinone-based pigment, a chain compound having condensed polycyclic aromatic series and aromatic rings such as anthracene and pyrene or condensed heterocyclic compound, two nitrogen-containing hetero rings of quinoline, benzo thiazole, benzo oxazole, and the like having a squarylium radical and a croconium methine radical as bonding chains, or pigment similar to cyanine-based pigment connected by a squarylium radical and a croconium methine radical. The above-described metal complex pigment is preferably dithiol metal complex-based pigment, metal phthalocyanine pigment, metal porphyrin pigment, or ruthenium complex pigment, and is preferably, ruthenium complex pigment, in particular, but is not limited to the above description.

Note that in the present embodiment, the photoelectric conversion films 504 and 604 may be formed by mixing or stacking several kinds of materials for characteristic improvement. Alternatively, in the present embodiment, the photoelectric conversion films 504 and 604 may be formed by stacking or mixing materials that do not directly contribute to photoelectric conversion for characteristic improvement.

In the present embodiment, the common electrodes 502 and 602, the reading electrodes 508 and 608, and the accumulation electrodes 510 and 610 may be formed of, for example, a transparent conductive film such as an indium tin oxide (ITO; including crystalline ITO and amorphous ITO) film, which is capable of transmitting light. However, in the present embodiment, the common electrodes 502 and 602, the reading electrodes 508 and 608, and the accumulation electrodes 510 and 610 are not limited to ITO as described above but may be made of another material. For example, the transparent conductive film is preferably made of a material having a bandgap of 2.5 eV or larger, preferably 3.1 eV or larger. Examples of the transparent conductive film include tin-oxide materials of tin oxide, antimony-tin oxide ($SnO_2$ with Sb added as a dopant; for example, ATO), and fluorine-tin oxide ($SnO_2$ with F added as a dopant; for example, FTO). Examples of zinc-oxide materials include aluminum-zinc oxide (ZnO with Al added as a dopant; for example, AZO), gallium-zinc oxide (ZnO with Ga added as a dopant; for example, GZO), indium-zinc oxide (ZnO with In added as a dopant; for example, IZO), indium-gallium-zinc oxide ($ZnO_4$ with In and Ga added as dopants; for example, IGZO), and indium-tin-zinc oxide (ZnO with In and Sn added as dopants; for example, ITZO). Other examples include indium-gallium oxide ($Ga_2O_3$ with In added as a dopant; for example, IGO), $CuInO_2$, $MgIn_2O_4$, CuI, $InSbO_4$, ZnMgO, CdO, $ZnSnO_3$, and graphene.

In the present embodiment, the insulating films 506 and 606 may be formed of, for example, $SiO_2$, $Al_2O_3$, or silicon nitride ($Si_3N_4$), which is capable of transmitting light, and are not particularly limited.

In the present embodiment, each semiconductor layer (not illustrated) included in the PDs 500 and 600 is preferably formed of a material having an electric charge mobility higher and a bandgap larger than those of the photoelectric conversion films 504 and 604. For example, the configuration material of the semiconductor layer preferably has a bandgap of 3.0 eV or larger. Examples of such a material include an oxide semiconductor material such as IGZO and an organic semiconductor material. Examples of the organic semiconductor material include transition metal di-chalcogenide, silicon carbide, diamond, graphene, carbon nano tube, condensed polycyclic hydrocarbon compound, and condensed heterocyclic compound. The semiconductor layer may be achieved by a single film or may be achieved by stacking a plurality of films.

In the present embodiment, as illustrated in FIG. 2, for example, an insulating film 780 made of a material such as a $SiO_2$ film and capable of transmitting light is provided on the PD 600. In addition, an on-chip lens 790 is provided on the insulating film 780 for each solid-state image capturing element 100. The on-chip lens 790 may be formed of, for example, $Si_3N_4$ or a resin-based material such as styrene-based resin, acrylic-based resin, styrene-acrylic copolymerization-based resin, or siloxane-based resin.

As described above, the solid-state image capturing element 100 according to the present embodiment has a laminated structure in which the PD 400, the PD 500, and the PD 600 configured to detect light of three colors, respectively, are stacked. Specifically, the above-described solid-state image capturing element 100 is, for example, a longitudinal-direction spectroscopic solid-state image capturing element in which blue light is photoelectrically converted by the photoelectric conversion film 604 (PD 600) formed above the semiconductor substrate 300, green light is photoelectrically converted by the photoelectric conversion film 504 (PD 500) provided below the PD 600, and red light is photoelectrically converted by the PD 400 provided in the semiconductor substrate 300. Note that in the present embodiment, the above-described solid-state image capturing element 100 is not limited to the above-described longitudinal-direction spectroscopic laminated structure. For example, green light may be photoelectrically converted by the photoelectric conversion film 604 (PD 600) formed above the semiconductor substrate 300, and blue light may be photoelectrically converted by the photoelectric conversion film 504 (PD 500) provided below the PD 600.

<2.3 Arrangement Configuration of Solid-State Image Capturing Element 100>

Figure 3:
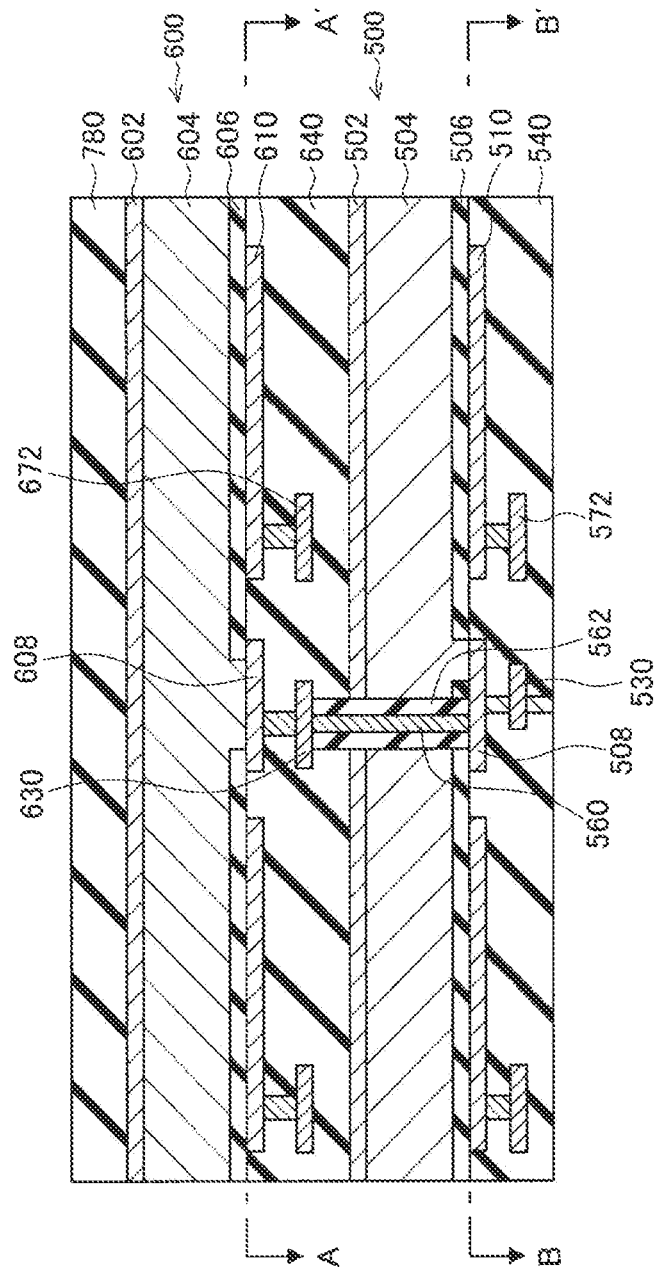
FIG. 3 is an explanatory diagram illustrating a partial cross-sectional view of a solid-state image capturing element 100 according to the first embodiment of the present disclosure.
Figure 4:
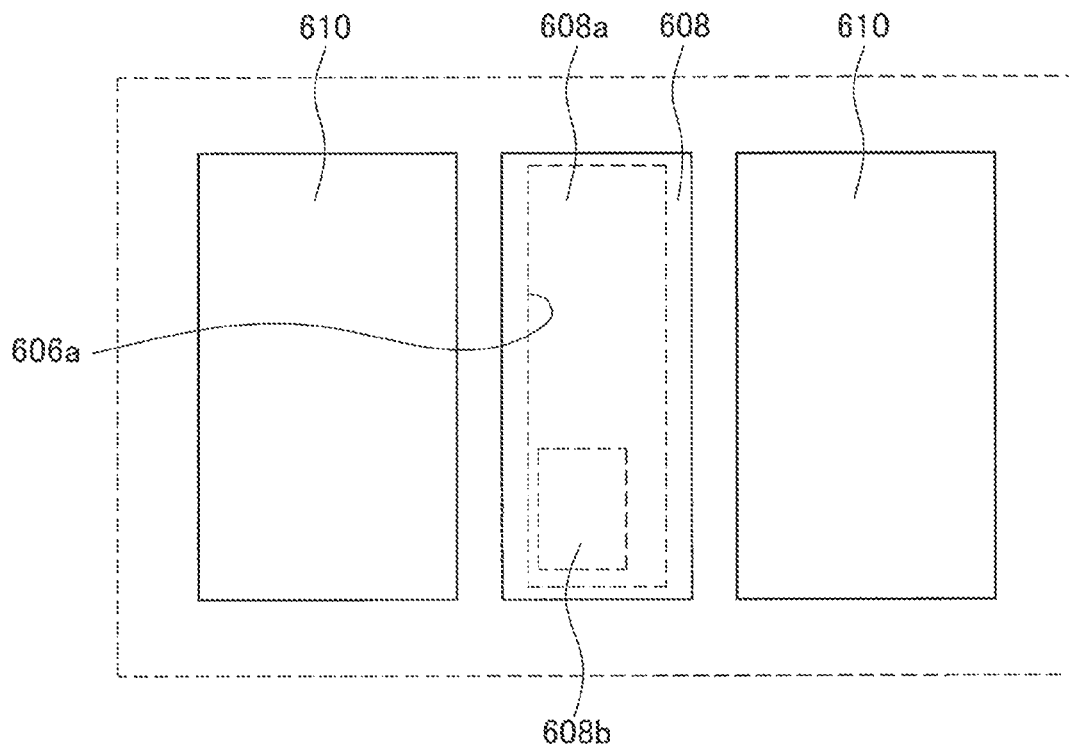
FIG. 4 is a cross-sectional view of the solid-state image capturing element 100 being cut along line A-A' in FIG. 3.
Figure 5:
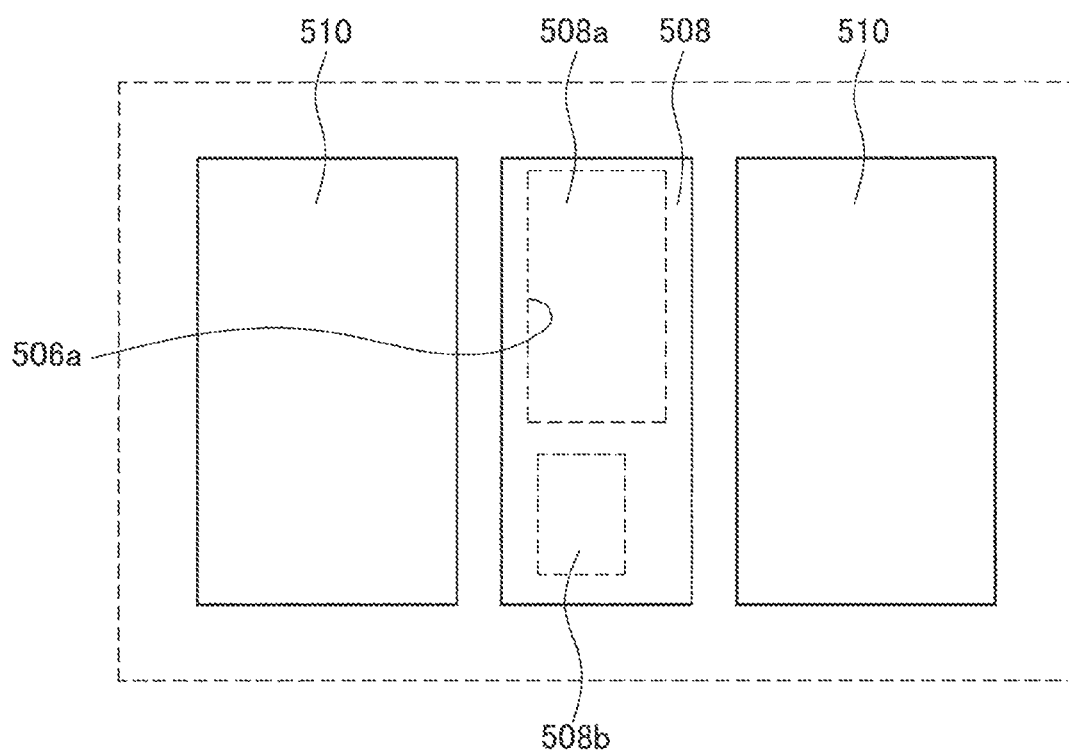
FIG. 5 is a cross-sectional view of the solid-state image capturing element 100 being cut along line B-B' in FIG. 3.

The laminated structure of the solid-state image capturing element 100 according to the present embodiment is described above. The following describes an arrangement configuration of the solid-state image capturing element 100 according to the present embodiment with reference to FIGS. 3 to 5. FIG. 3 is an explanatory diagram illustrating a partial cross-sectional view of the solid-state image capturing element 100 according to the present embodiment, specifically, mainly illustrating the PD 500 and the PD 600. FIG. 4 is a cross-sectional view of the solid-state image capturing element 100 being cut along line A-A' in FIG. 3. FIG. 5 is a cross-sectional view of the solid-state image capturing element 100 being cut along line B-B' in FIG. 3.

As described above, in the present embodiment, the PD 500 and the PD 600 have structures in which the common electrodes 502 and 602, the photoelectric conversion films 504 and 604, the reading electrodes 508 and 608, the insulating films 506 and 606, and the accumulation electrodes 510 and 610 are sequentially stacked as illustrated in FIG. 3. The reading electrode 608 of the PD 600 and the reading electrode 508 of the PD 500 are electrically connected with each other through the wire 530 and the penetration electrode 560. The reading electrode 608 of the PD 600 and the reading electrode 508 of the PD 500 are electrically connected with the penetration electrode 460 through the wire 530.

Specifically, as understood from FIG. 4, which illustrates the solid-state image capturing element 100 being cut along line A-A' (the interface between the insulating film 606 and the accumulation electrode 610) illustrated in FIG. 3 when the plane of the cutting is viewed from above the solid-state image capturing element 100, an exposure region (second exposure region) 608a that is exposed through an opening 606a provided at the insulating film 606 and contacts the photoelectric conversion film 604 is provided at the reading electrode 608. In addition, a contact region (second contact region) 608b electrically connected with the wire 630 connected with the penetration electrode 560 is provided at part of the exposure region 608a.

Specifically, as understood from FIG. 5, which illustrates the solid-state image capturing element 100 being cut along line B-B' (the interface between the insulating film 506 and the accumulation electrode 510) illustrated in FIG. 3 when the plane of the cutting is viewed from above the solid-state image capturing element 100, an exposure region (first exposure region) 508a that is exposed through an opening 506a provided at the insulating film 506 and contacts the photoelectric conversion film 504 is provided at the reading electrode 508. In addition, a contact region (first contact region) 508b contacting the penetration electrode 560 and electrically connected with the penetration electrode 560 is provided at part of the remaining region of the reading electrode 508. The contact region 508b is also electrically connected with the wire 530 connected with the penetration electrode 460.

As described above, in the present embodiment, the PDs 500 and 600 different from each other share one floating diffusion part 314 and one penetration electrode 460. Thus, according to the present embodiment, it is possible to avoid an increase in the area of fabrication of the semiconductor substrate 300 due to formation of the penetration electrode 460 and avoid size reduction of the entrance surface of the PD 400, and thus the amount of light incident on the PD 400 does not decrease, thereby avoiding decrease of the sensitivity characteristic of the PD 400. In addition, according to the present embodiment, since the PDs 500 and 600 different from each other share the floating diffusion part 314 and the penetration electrode 460, it is possible to avoid an increase in the area of a chip on which the solid-state image capturing device 1 is mounted. As a result, according to the present embodiment, it is possible to avoid an increase in manufacturing cost of the solid-state image capturing device 1. In addition, according to the present embodiment, since the PDs 500 and 600 different from each other share one penetration electrode 460, it is possible to reduce the number of penetration electrodes 460 penetrating through the semiconductor substrate 300. As a result, according to the present embodiment, it is possible to avoid degradation of the dark-current characteristic of the solid-state image capturing device 1, which is attributable to decrease of crystalline of the semiconductor substrate 300.

<2.4 Equivalent Circuit of Solid-State Image Capturing Element 100>

Figure 6:
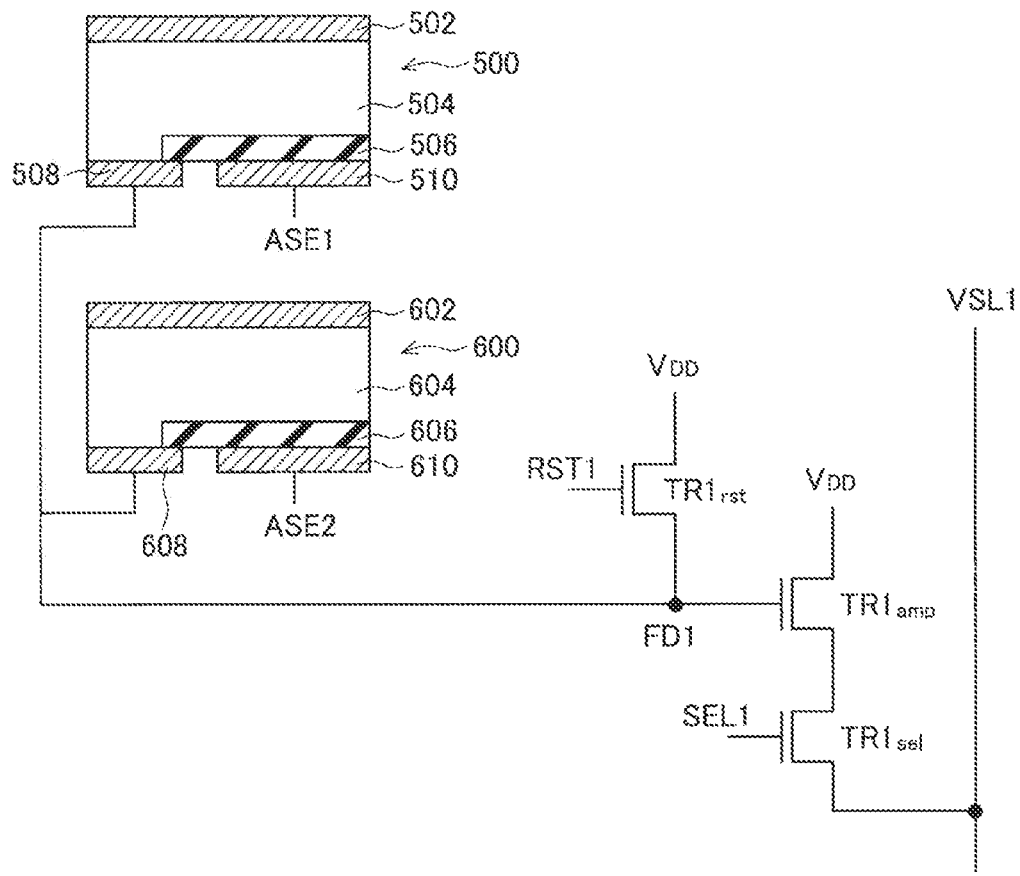
FIG. 6 is an equivalent circuit diagram of PDs 500 and 600 of the solid-state image capturing element 100 according to the first embodiment of the present disclosure.

The arrangement configuration of each solid-state image capturing element 100 according to the present embodiment is described above. The following describes an equivalent circuit of the solid-state image capturing element 100 according to the present embodiment, specifically, equivalent circuits of the PDs 500 and 600 with reference to FIG. 6. FIG. 6 is an equivalent circuit diagram of the PDs 500 and 600 of the solid-state image capturing element 100 according to the present embodiment.

As described above, in the present embodiment, the PDs 500 and 600 include the common electrodes 502 and 602, the reading electrodes 508 and 508, and the photoelectric conversion films 504 and 604 sandwiched therebetween, respectively. In addition, the PDs 500 and 600 include the accumulation electrodes 510 and 610 contacting the photoelectric conversion films 504 and 604 through the insulating films 506 and 606, respectively.

As illustrated in FIG. 6, the reading electrodes 508 and 608 are electrically connected with one of the drain and source of a reset transistor $TR1_{rst}$ for resetting accumulated electric charge through a wire or the like. The gate of the reset transistor $TR1_{rst}$ is electrically connected with a reset signal line RST1 and also electrically connected with the vertical drive circuit part 32 described above. The other (side not connected with the reading electrodes 508 and 608) of the drain and source of the reset transistor $TR1_{Rst}$ is electrically connected with a power circuit (power potential $V_{DD}$). Specifically, in the present embodiment, the reset transistor $TR1_{rst}$ is a common pixel transistor shared between the PDs 500 and 600 as illustrated in FIG. 6.

In addition, the reading electrodes 508 and 608 are electrically connected with, through a wire, the gate of an amplification transistor $TR1_{amp}$ configured to convert electric charge into voltage and output the voltage as a pixel signal. A node FD1 connecting the reading electrodes 508 and 608, the gate of the amplification transistor $TR1_{amp}$, and the one of the drain and source of the reset transistor $TR1_{rst}$ is part of the reset transistor $TR1_{rst}$. The node FD1 also functions as the floating diffusion part 314 shared between the PDs 500 and 600. Electric charge from the reading electrodes 508 and 608 changes the potential of the node FD1 and is converted into voltage by the amplification transistor $TR1_{amp}$. One of the source and drain of the amplification transistor $TR1_{amp}$ is electrically connected with, through a wire, one of the source and drain of a selection transistor $TR1_{sel}$ configured to output the above-described pixel signal acquired through conversion to a signal line VSL1 in accordance with a selection signal. The other (side not connected with the selection transistor TR1$_{sel}$) of the source and drain of the amplification transistor TR1$_{amp}$ is electrically connected with the power circuit (power potential V$_{DD}$). Specifically, in the present embodiment, the amplification transistor TR1$_{amp}$ and the selection transistor TR1$_{sel}$ are common pixel transistors shared between the PDs 500 and 600.

The other (side not connected with the amplification transistor TR1$_{amp}$) of the source and drain of the selection transistor TR1$_{sel}$ is electrically connected with the above-described signal line VSL1 through which converted voltage is transferred as a pixel signal, and is also electrically connected with the column signal processing circuit part 34 described above. The gate of the selection transistor TR1$_{sel}$ is electrically connected with a selection line SEL1 that selects a row from which pixel signals are to be output, and is also electrically connected with the vertical drive circuit part 32 described above.

As illustrated in FIG. 6, the accumulation electrodes 510 and 610 are electrically connected with voltage application lines ASE1 and ASE2, respectively. As described above, in accordance with applied potential, the accumulation electrodes 510 and 610 can attract electric charge generated at the photoelectric conversion films 504 and 604 and can accumulate the electric charge in the photoelectric conversion films 504 and 604 or transfer the electric charge to the reading electrodes 508 and 608. The common electrodes 502 and 602 are also electrically connected with a selection line (not illustrated) that selects a column from which pixel signals are output.

Figure 7:
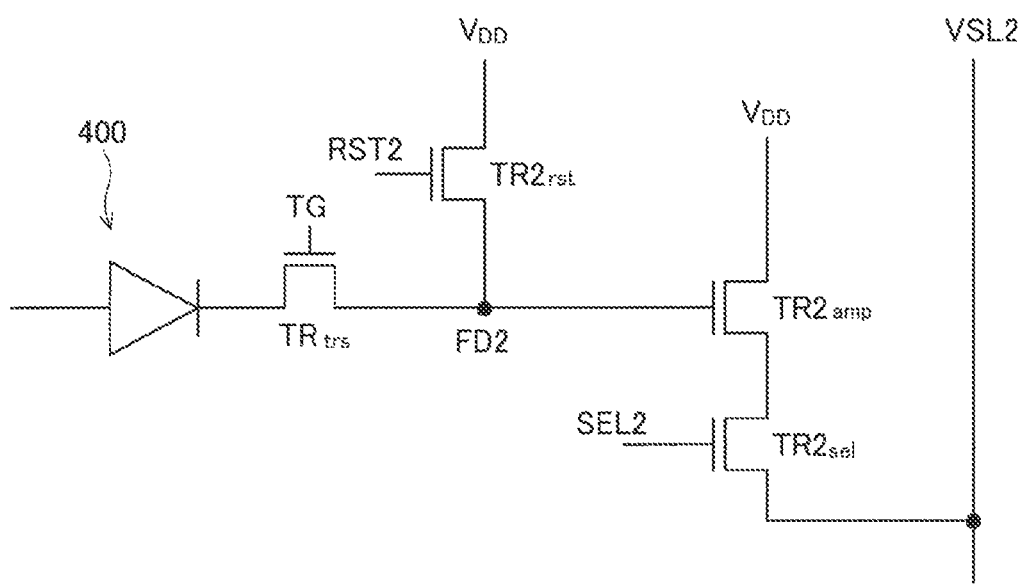
FIG. 7 is an equivalent circuit diagram of a PD 400 included in the solid-state image capturing element 100 according to the first embodiment of the present disclosure.

For reference, the following describes an equivalent circuit of the PD 400 with reference to FIG. 7. FIG. 7 is an equivalent circuit diagram of the PD 400 included in the solid-state image capturing element 100 according to the present embodiment.

As illustrated in FIG. 7, the PD 400 provided in the semiconductor substrate 300 is connected with, through wires, pixel transistors (an amplification transistor TR2$_{amp}$, a transfer transistor TR$_{trs}$, a reset transistor TR2$_{rst}$, and a selection transistor TR2$_{sel}$) provided in the semiconductor substrate 300. Specifically, one side of the PD 400 is electrically connected with, through a wire, one of the source and drain of the transfer transistor TR$_{trs}$ configured to transfer electric charge. The other (side not connected with the PD 400) of the source and drain of the transfer transistor TR$_{trs}$ is electrically connected with one of the source and drain of the reset transistor TR2$_{rst}$ through a wire. The gate of the transfer transistor TR$_{trs}$ is electrically connected with a transfer gate line TG and also connected with the vertical drive circuit part 32 described above. The other (side not connected with the transfer transistor TR$_{trs}$) of the source and drain of the reset transistor TR2$_{rst}$ is electrically connected with the power circuit (power potential V$_{DD}$). The gate of the reset transistor TR2$_{rst}$ is electrically connected with a reset line RST2 and also connected with the vertical drive circuit part 32 described above.

The other (side not connected with the PD 400) of the source and drain of the transfer transistor TR$_{trs}$ is also electrically connected with, through a wire, the gate of the amplification transistor TR2$_{amp}$ configured to amplify (convert) electric charge and output the electric charge as a pixel signal. One of the source and drain of the amplification transistor TR2$_{amp}$ is electrically connected with, through a wire, one of the source and drain of the selection transistor TR2$_{sel}$ configured to output the above-described pixel signal to a signal line VSL2 in accordance with a selection signal. The other (side not connected with the selection transistor TR2$_{sel}$) of the source and drain of the amplification transistor TR2$_{amp}$ is electrically connected with the power circuit (power potential V$_{DD}$). The other (side not connected with the amplification transistor TR2$_{amp}$) of the source and drain of the selection transistor TR2$_{sel}$ is electrically connected with the above-described signal line VSL2 and also electrically connected with the column signal processing circuit part 34 described above. The gate of the selection transistor TR2$_{sel}$ is electrically connected with a selection line SEL2 and also electrically connected with the vertical drive circuit part 32 described above.

<2.5 Reading Method for Solid-State Image Capturing Element 100>

Figure 8:
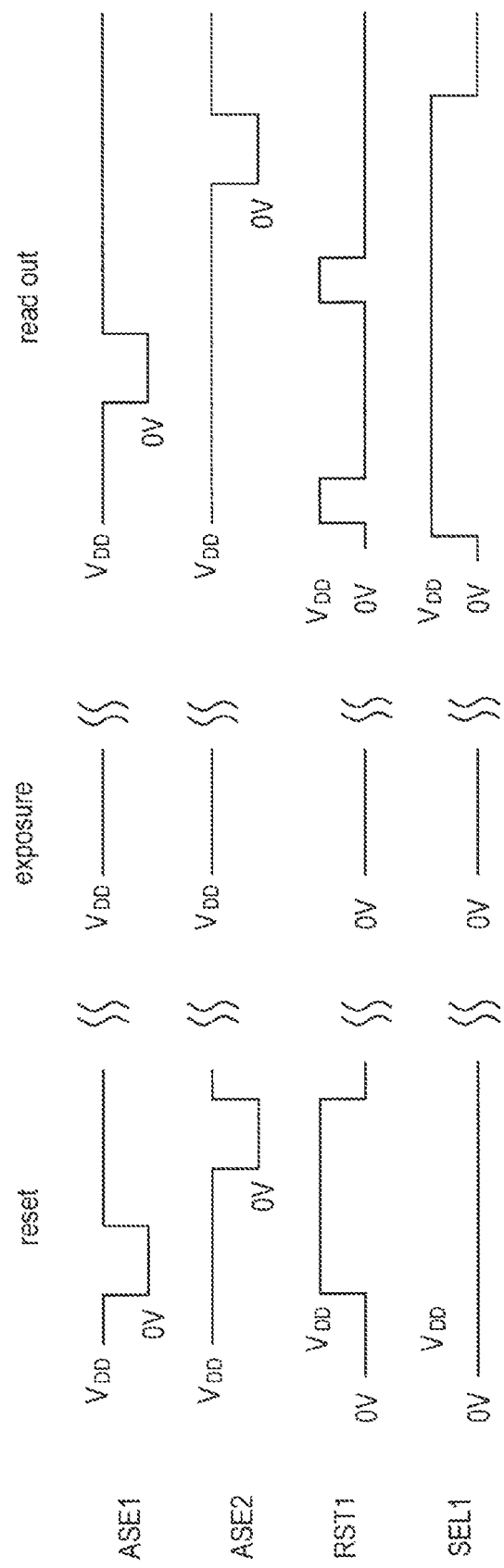
FIG. 8 is an explanatory diagram for description of a reading method for the solid-state image capturing element 100 according to the first embodiment of the present disclosure.

The equivalent circuit of the solid-state image capturing element 100 according to the present embodiment is described above. The following describes a reading method for the solid-state image capturing element 100 according to the present embodiment with reference to FIG. 8. FIG. 8 is an explanatory diagram for description of the reading method for the solid-state image capturing element 100 according to the present embodiment.

First, in the present embodiment, reset operation is performed as illustrated the left side in FIG. 8. In the reset operation, the potential of the selection line SEL1 is set to be 0 V, and the potential of the reset line RST1 is set to be 0 V at start and then switched to the power potential V$_{DD}$. Simultaneously with the switching of the potential of the reset line RST1 to the power potential V$_{DD}$, the potential of the accumulation electrode 510 of the PD 500 is switched from the power potential V$_{DD}$ to 0 V through the voltage application line ASE1 and returned to the power potential V$_{DD}$ again after elapse of a predetermined time. Then, simultaneously with the returning of the potential of the accumulation electrode 510 of the PD 500 to the power potential V$_{DD}$ again, the potential of the accumulation electrode 610 of the PD 600 is switched from the power potential V$_{DD}$ to 0 V through a voltage application line ASE2 and returned to the power potential V$_{DD}$ again after elapse of a predetermined time. Simultaneously with the returning of the potential of the accumulation electrode 610 of the PD 600 to the power potential V$_{DD}$ again, the potential of the reset line RST1 is returned to 0 V again. Through such a reset operation, electric charge accumulated in the photoelectric conversion films 504 and 604 of the PDs 500 and 600 can be reset.

Subsequently, in the present embodiment, exposure, in other words, exposure operation in which electric charge is accumulated in the photoelectric conversion films 504 and 604 of the PDs 500 and 600 through photoelectric conversion is performed as illustrated at the center in FIG. 8. In the exposure operation, the potential of the selection line SEL1 and the potential of the reset line RST1 are maintained at 0 V. The potential of the accumulation electrode 510 of the PD 500 and the potential of the accumulation electrode 610 of the PD 600 are maintained at the power potential V$_{DD}$ through the voltage application lines ASE1 and ASE2. Through such an exposure operation, electric charge is attracted to the accumulation electrodes 510 and 610 and accumulated in the photoelectric conversion films 504 and 604 of the PDs 500 and 600.

In addition, in the present embodiment, an operation of reading electric charge accumulated in the photoelectric conversion films 504 and 604 of the PDs 500 and 600 is performed as illustrated on the right side in FIG. 8. In the reading operation, the potential of the selection line SEL1 is maintained at the power potential V$_{DD}$, and a solid-state image capturing element 100 from which reading is to be performed is selected. Then, the potential of the reset line RST1 is switched from 0 V to the power potential $V_{DD}$ and returned to 0 V again after elapse of a predetermined time. In this manner, electric charge accumulated at the floating diffusion part 314 is reset. Then, the potential of the accumulation electrode 510 of the PD 500 is switched from the power potential $V_{DD}$ to 0 V through the voltage application line ASE1 and returned to the power potential $V_{DD}$ again after elapse of a predetermined time. In this manner, electric charge attracted to the accumulation electrode 510 and accumulated in the photoelectric conversion film 504 is transferred to the floating diffusion part 314 through the reading electrode 508. Then, the electric charge transferred to the floating diffusion part 314 is read as a pixel signal through conversion to voltage by the above-described amplification transistor $TR1_{amp}$.

Subsequently, the potential of the reset line RST1 is switched from 0 V to the power potential $V_{DD}$ and returned to 0 V again after elapse of a predetermined time. In this manner, electric charge accumulated at the floating diffusion part 314 is reset. Then, the potential of the accumulation electrode 610 of the PD 600 is switched from the power potential $V_{DD}$ to 0 V through the voltage application line ASE2 and returned to the power potential $V_{DD}$ again after elapse of a predetermined time. In this manner, electric charge attracted to the accumulation electrode 610 and accumulated in the photoelectric conversion film 604 is transferred to the floating diffusion part 314 through the reading electrode 608. Accordingly, the electric charge accumulated in the photoelectric conversion film 604 of the PD 600 is read. Then, the electric charge transferred to the floating diffusion part 314 is read as a pixel signal through conversion into voltage by the above-described amplification transistor $TR1_{amp}$.

Accordingly, the series of operations, namely, the reset operation, the exposure operation, and the reading operation are completed. Specifically, in the reading method according to the present embodiment, the potential applied to each of the accumulation electrodes 510 and 610 can be controlled to sequentially transfer electric charge accumulated in the corresponding one of the photoelectric conversion films 504 and 604 to the corresponding one of the reading electrodes 508 and 608 in a temporally sequential manner. In addition, in the present embodiment, the electric charge sequentially transferred to the reading electrodes 508 and 608 can be sequentially accumulated in the floating diffusion part 314 and sequentially read.

As described above, in the present embodiment, through the above-described operations, electric charge can be temporarily accumulated in the photoelectric conversion films 504 and 604 of the PDs 500 and 600. Then, in the present embodiment, through the above-described operations, the electric charge accumulated in each of the photoelectric conversion films 504 and 604 can be sequentially transferred to the corresponding one of the reading electrodes 508 and 608 in a temporally sequential manner and sequentially accumulated in the floating diffusion part 314 in a temporally sequential manner. Thus, according to the present embodiment, since electric charge can be sequentially transferred in a temporally sequential manner, one floating diffusion part 314 and one penetration electrode 460 be can shared between the PDs 500 and 600 different from each other.

As a result, in the present embodiment, the PDs 500 and 600 different from each other can share one floating diffusion part 314 and one penetration electrode 460. Thus, according to the present embodiment, it is possible to avoid an increase in the area of fabrication of the semiconductor substrate 300 due to formation of the penetration electrode 460 and avoid size reduction of the entrance surface of the PD 400, and thus the amount of light incident on the PD 400 does not decrease, thereby avoiding decrease of the sensitivity characteristic of the PD 400. In addition, according to the present embodiment, since the PDs 500 and 600 different from each other share the floating diffusion part 314 and the penetration electrode 460, it is possible to avoid an increase in the area of a chip on which the solid-state image capturing device 1 is mounted. As a result, according to the present embodiment, it is possible to avoid an increase in manufacturing cost of the solid-state image capturing device 1. In addition, according to the present embodiment, since the penetration electrode 460 is shared between the PDs 500 and 600 different from each other, it is possible to reduce the number of penetration electrodes 460 penetrating through the semiconductor substrate 300. As a result, according to the present embodiment, it is possible to avoid degradation of the dark-current characteristic of the solid-state image capturing device 1, which is attributable to decrease of crystalline of the semiconductor substrate 300.

3. Second Embodiment

Figure 9:
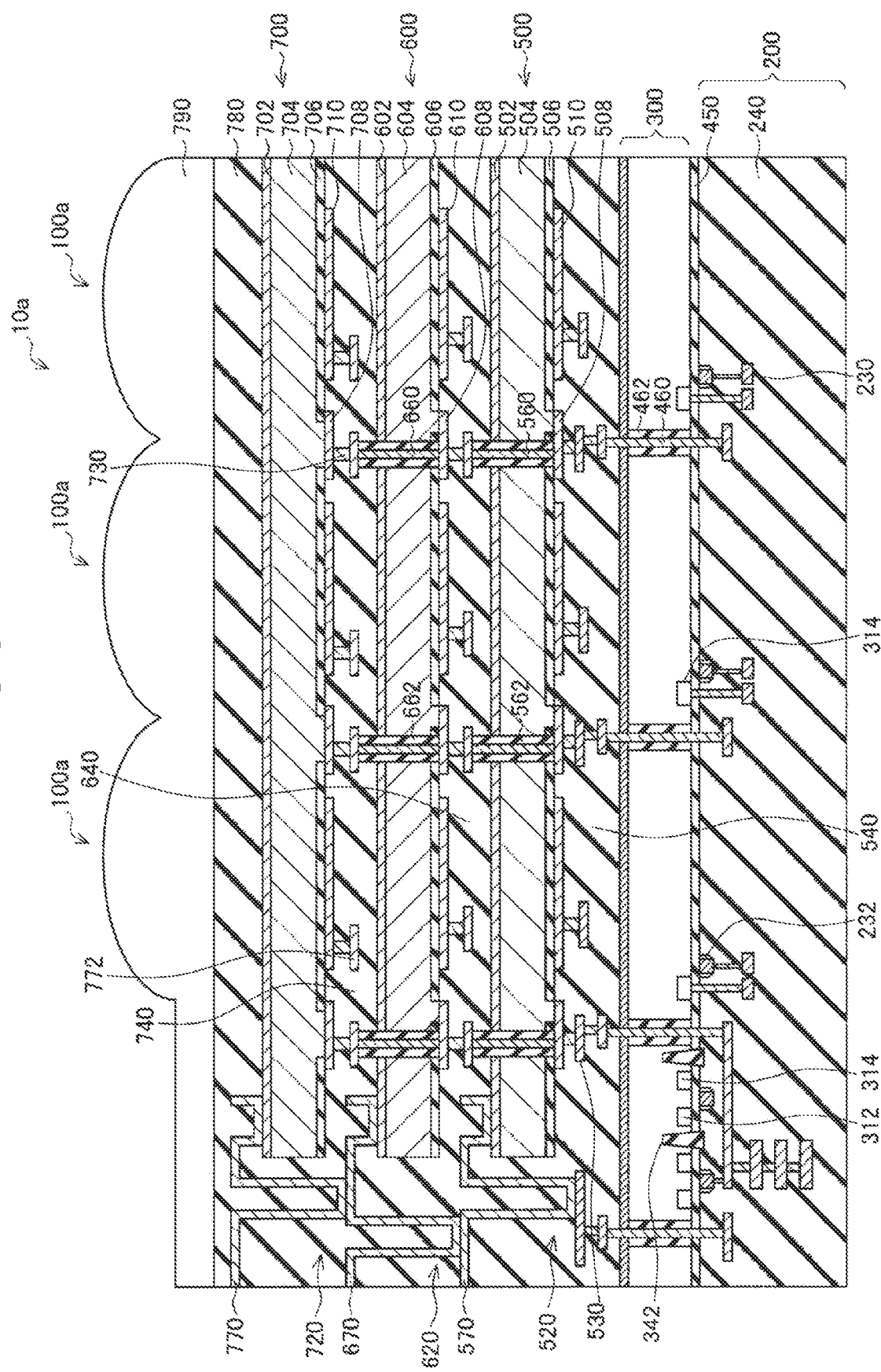
FIG. 9 is a cross-sectional view of a pixel array part 10a according to a second embodiment of the present disclosure.

In the above-described the first embodiment, each solid-state image capturing element 100 is a solid-state image capturing element in which blue light is photoelectrically converted in the photoelectric conversion film 604 above formed the semiconductor substrate 300, green light is photoelectrically converted in the photoelectric conversion film 504 provided below the PD 600, and red light is photoelectrically converted at the PD 400 provided in the semiconductor substrate 300. However, the embodiments of the present disclosure are not limited to such a configuration, but a solid-state image capturing element 100a in which blue light, green light, and red light are photoelectrically converted in three photoelectric conversion films stacked on the semiconductor substrate 300 is applicable. The following describes, as a second embodiment of the present disclosure, a laminated structure of the solid-state image capturing element 100a including the three photoelectric conversion films 504, 604, and 704 stacked on the semiconductor substrate 300 with reference to FIG. 9. FIG. 9 is a cross-sectional view of a pixel array part 10a according to the present embodiment, and specifically, the solid-state image capturing elements 100a each including the three photoelectric conversion films 504, 604, and 704 stacked on the semiconductor substrate 300 are arrayed in a matrix in the pixel array part 10a.

Specifically, as illustrated in FIG. 9, the solid-state image capturing element 100a according to the present embodiment has a configuration same as that of the first embodiment described above from the wiring layer 200 to the PD 600 except that no PD 400 is provided in the semiconductor substrate 300. Thus, description of a detailed configuration from the wiring layer 200 to the PD 600 is omitted below.

In the present embodiment, as illustrated in FIG. 9, an insulating film 740 made of $SiO_2$ or the like and capable of transmitting light, and a wiring layer (third wiring layer) 720 including a wire (third wire) 730 formed of W or the like are provided being sandwiched between the PD 600 and a PD 700 (third photoelectric conversion part). A reading electrode 708 of the PD 700 to be described later is electrically connected with a penetration electrode (second penetration electrode) 660 to be described later through the wire 730.

In the present embodiment, the penetration electrode 660 is provided penetrating through part of the wiring layer 720 and the PD 600 from the wire 730 to the reading electrode 608 of the PD 600 as illustrated in FIG. 9. Specifically, the reading electrode 708 of the PD 700 is electrically connected with the reading electrode 608 of the PD 600 through the penetration electrode 660. The reading electrode 708 of the PD 700 is also electrically connected with the floating diffusion part 314 provided at the semiconductor substrate 300 through the penetration electrodes 460, 560, and 660. Thus, the above-described floating diffusion part 314 can temporarily accumulate, with the penetration electrodes 460, 560, and 660, electric charge generated through photoelectric conversion at the PD 700. The penetration electrode 660 can electrically connect the reading electrode 708 of the PD 700 to the pixel transistors provided at the semiconductor substrate 300 through the penetration electrode 560 and the penetration electrode 460. Note that in the present embodiment, the penetration electrode 660 may penetrate through part of the wiring layer 720 and the PD 600 or may penetrate through the PD 600 only, and thus is not particularly limited.

In the present embodiment, similarly to the above-described penetration electrode 560, the penetration electrode 660 may be formed of, for example, a metal film of Cu or the like. Similarly to the above-described penetration electrode 560, an insulating film 662 made of $SiO_2$ or the like may be provided at the outer periphery of the penetration electrode 660 to prevent short-circuiting between the penetration electrode 660 and the PD 600. Note that the penetration electrode 660 is same as the above-described penetration electrode 560, and thus detailed description thereof is omitted below.

In the present embodiment, the PD 700 (third photoelectric conversion part) configured to convert light into electric charge is provided on the wiring layer 720. Specifically, similarly to the above-described PDs 500 and 600, a common electrode (upper electrode) 702, a photoelectric conversion film 704, an insulating film 706, a reading electrode (lower electrode) 708, and an accumulation electrode 710 are sequentially stacked as the PD 700. Note that the common electrode 702, the photoelectric conversion film 704, the insulating film 706, the reading electrode 708, and the accumulation electrode 710 are same as those of the above-described PDs 500 and 600, and thus detailed description thereof is omitted below.

As illustrated in FIG. 9, the reading electrode 708 is electrically connected with the penetration electrode 560 through the penetration electrode 660. The common electrode 702 is electrically connected with a wire 770 through which desired potential is applied to the common electrode 702. The accumulation electrode 710 is also electrically connected with a wire 772 through which desired potential is applied to the accumulation electrode 710.

For example, the solid-state image capturing element 100a according to the present embodiment can photoelectrically convert blue light at the photoelectric conversion film 704 (PD 700) above formed the semiconductor substrate 300, photoelectrically convert green light at the photoelectric conversion film 604 (PD 600) provided below the PD 700, and photoelectrically convert red light at the photoelectric conversion film 504 (PD 500) provided below the PD 600.

Note that, when the photoelectric conversion film 504 functions as a photoelectric conversion film configured to detect red light, the photoelectric conversion film 504 may contain, for example, phthalocyanine-based pigment and subphthalocyanine-based pigment (subphthalocyanine derivative).

According to the present embodiment, similarly to the first embodiment, the solid-state image capturing element 100a including the three photoelectric conversion films 504, 604, and 704 stacked on the semiconductor substrate 300 is capable of avoiding an increase in manufacturing cost as well as degradation of characteristics.

Specifically, in the present embodiment, it is possible to temporarily accumulate, with the accumulation electrodes 510, 610, and 710, electric charge in the photoelectric conversion films 504, 604, and 704 of the PDs 500, 600, and 700 by performing an operation such as the reading method for the solid-state image capturing element 100 of the above-described the first embodiment. Thus, according to the present embodiment, the floating diffusion part 314 and the penetration electrode 460 can be shared among the PDs 500, 600, and 700 different from one another.

As a result, in the present embodiment as well, it is possible to avoid an increase in the area of fabrication of the semiconductor substrate 300 due to formation of the penetration electrode 460 and avoid size reduction of the entrance surface of the PD 400, thereby avoiding decrease of the sensitivity characteristic of the PD 400. In addition, according to the present embodiment, since the PDs 500, 600, and 700 different from one another share the floating diffusion part 314 and the penetration electrode 460, it is possible to avoid an increase in the area of a chip on which the solid-state image capturing device 1 is mounted and thus avoid an increase in manufacturing cost. In addition, according to the present embodiment, since the PDs 500, 600, and 700 different from one another share the penetration electrode 460, it is possible to reduce the number of penetration electrodes 460 penetrating through the semiconductor substrate 300. As a result, according to the present embodiment as well, it is possible to avoid degradation of the dark-current characteristic of the solid-state image capturing device 1, which is attributable to decrease of crystalline of the semiconductor substrate 300.

Note that the present embodiment is not limited to the solid-state image capturing element 100a including the three photoelectric conversion films 504, 604, and 704 stacked on the semiconductor substrate 300 but may be, for example, a solid-state image capturing element including four or more photoelectric conversion films stacked on the semiconductor substrate 300.

4. Third Embodiment

Figure 10:
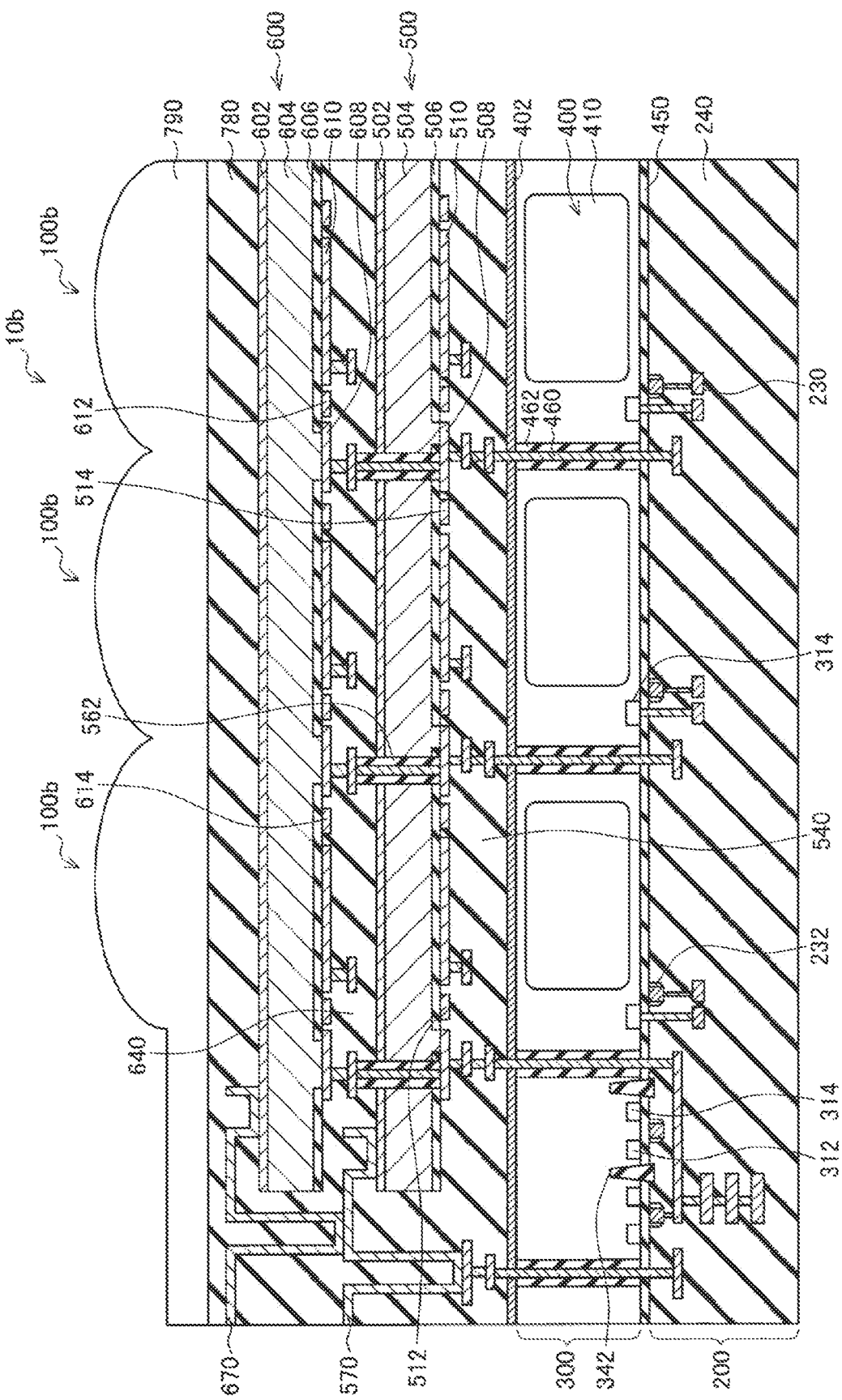
FIG. 10 is a cross-sectional view of a pixel array part 10b according to a third embodiment of the present disclosure.

In the embodiments of the present disclosure, the PDs 500 and 600 may include transfer electrodes 512 and 612 and shield electrodes 514 and 614, respectively. The following describes, as a third embodiment of the present disclosure, a laminated structure of a solid-state image capturing element 100b including the PDs 500 and 600 including the transfer electrodes 512 and 612 and the shield electrodes 514 and 614 with reference to FIG. 10. FIG. 10 is a cross-sectional view of a pixel array part 10b according to the present embodiment, and specifically, the solid-state image capturing elements 100b each including the PDs 500 and 600 including the transfer electrodes 512 and 612 and the shield electrodes 514 and 614 are arrayed in a matrix in the pixel array part 10b.

Specifically, in the present embodiment, the PD 500 or 600 further includes the transfer electrode 512 or 612, respectively, provided between the reading electrode 508 or 608 and the accumulation electrode 510 or 610 and facing the common electrode 502 or 602 through the photoelectric conversion film 504 or 604 and the insulating film 506 or 606 as illustrated in FIG. 10. The above-described transfer electrode 512 or 612 is an electrode provided between the reading electrode 508 or 608 and the accumulation electrode 510 or 610, respectively, and configured to control electric charge transferring. More specifically, during an accumulation duration in which electric charge is accumulated in the photoelectric conversion films 504 and 604, the transfer electrodes 512 and 612 receive predetermined potential application and can dam accumulated electric charge so as to be attracted to the accumulation electrodes 510 and 510. During a transferring duration in which electric charge is transferred, the transfer electrodes 512 and 612 are opened and can easily transfer accumulated electric charge by the reading electrodes 508 and 608.

In the present embodiment, as illustrated in FIG. 10, the PDs 500 and 600 of each solid-state image capturing element 100b may further include the shield electrodes 514 and 614 provided between the solid-state image capturing elements 100b adjacent to each other when the pixel array part 10b is viewed from above. For example, the above-described shield electrodes 514 and 614 can be maintained at a predetermined potential to prevent electric charge leakage from or to an adjacent solid-state image capturing element 100b.

Note that the transfer electrodes 512 and 612 and the shield electrodes 514 and 614 may be formed of materials same as those of the reading electrodes 508 and 608 and the accumulation electrodes 510 and 610 described above. In addition, the transfer electrodes 512 and 612 and the shield electrodes 514 and 614 may be formed simultaneously with the reading electrodes 508 and 608 and the accumulation electrodes 510 and 610 described above.

As described above, according to the present embodiment, since the PDs 500 and 600 include the transfer electrodes 512 and 612 and the shield electrodes 514 and 614, it is possible to further improve the characteristics of the PDs 500 and 600.

5. Fourth Embodiment

Figure 11:
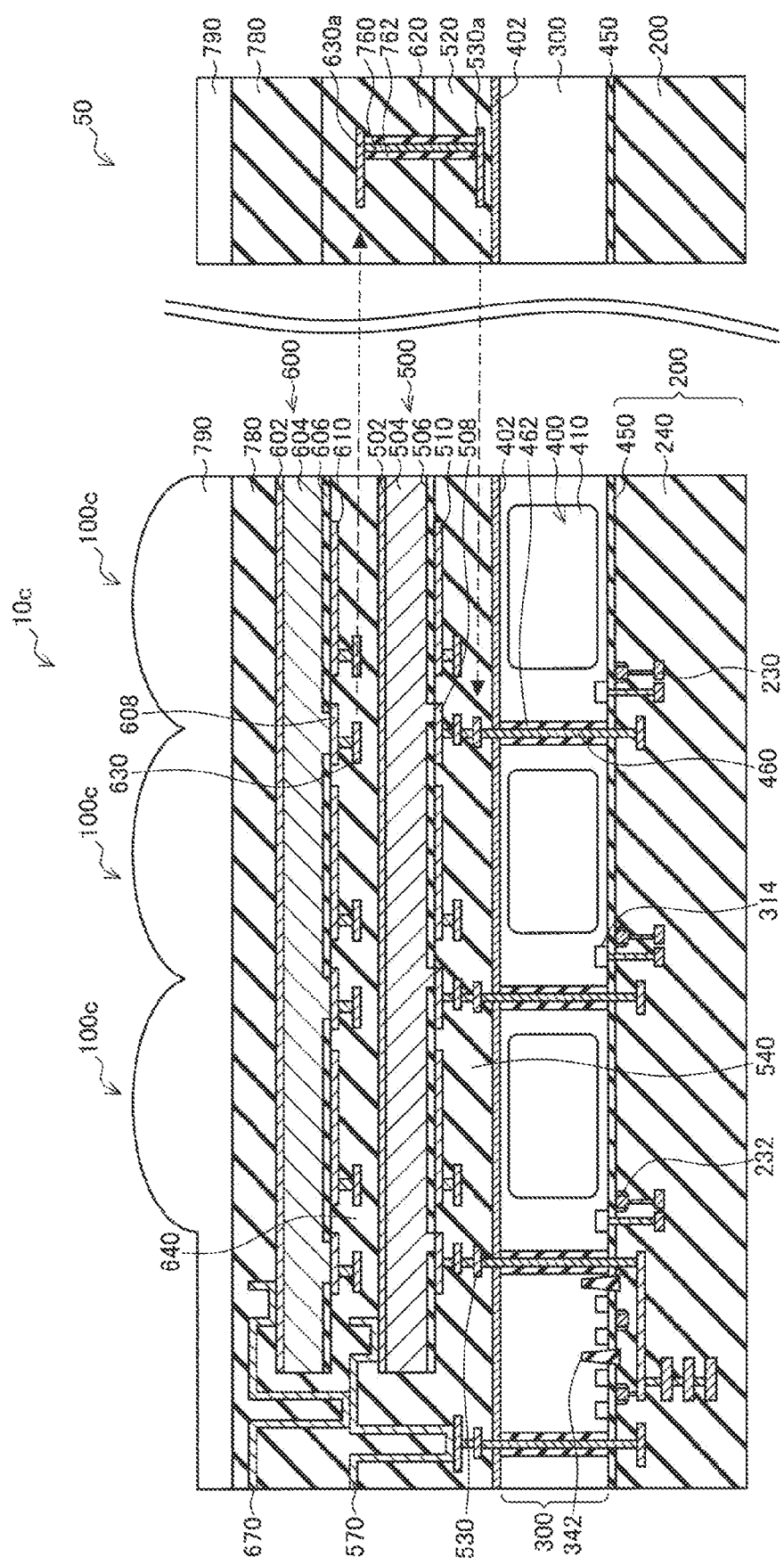
FIG. 11 is a cross-sectional view of a pixel array part 10c and an outer peripheral part 50 according to a fourth embodiment of the present disclosure.

In the above-described the first embodiment, each solid-state image capturing element 100 includes, from the wire 630 to the reading electrode 508 of the PD 500, the penetration electrode 560 provided penetrating through part of the wiring layer 620 and the PD 500. In the first embodiment, the reading electrode 608 of the PD 600 is electrically connected with the reading electrode 508 of the PD 500 through the penetration electrode 560. However, in the embodiments of the present disclosure, a penetration electrode that electrically connects the reading electrode 608 to the reading electrode 508 is not limited to a penetration electrode provided penetrating through the PD 500. For example, the penetration electrode that electrically connects the reading electrode 608 to the reading electrode 508 may be a penetration electrode 760 provided at an outer peripheral part 50 positioned at the outer periphery of the pixel array part 10. Thus, the following describes, as a fourth embodiment of the present disclosure, the penetration electrode (third penetration electrode) 760 provided at the outer peripheral part 50 with reference to FIG. 11. FIG. 11 is a cross-sectional view of a pixel array part 10c and the outer peripheral part 50 according to the present embodiment, and specifically, the outer peripheral part 50 is positioned at an outer periphery surrounding the above-described pixel array part (pixel region) 10c in which a plurality of the solid-state image capturing elements 100c are arrayed.

Specifically, in the present embodiment, as illustrated in FIG. 11, the penetration electrode 760 is provided at the outer peripheral part 50, penetrating through part of the wiring layers 620 and 520 from a wire 630a electrically connected with the wire 630 of the wiring layer 620 through a routing wire (not illustrated) to an electrode 530a electrically connected with the reading electrode 508 of the PD 500 through a routing wire (not illustrated). In the present embodiment as well, an insulating film 762 is preferably provided at the outer periphery of the penetration electrode 760. Through the above-described penetration electrode 760, the reading electrode 608 of the PD 600 can be electrically connected with the reading electrode 508 of the PD 500 and also electrically connected with the penetration electrode 460. Note that the penetration electrode 760 according to the present embodiment is same as the penetration electrode 560 described above, and thus detailed description thereof is omitted below.

In the present embodiment, since the penetration electrode 760 does not penetrate through the PD 500, it is possible to further avoid degradation of the photoelectric conversion film 504 of the PD 500 due to formation of the penetration electrode 760. As a result, according to the present embodiment, it is possible to further avoid degradation of the characteristics of the photoelectric conversion film 504 of the PD 500.

6. Fifth Embodiment

Figure 12:
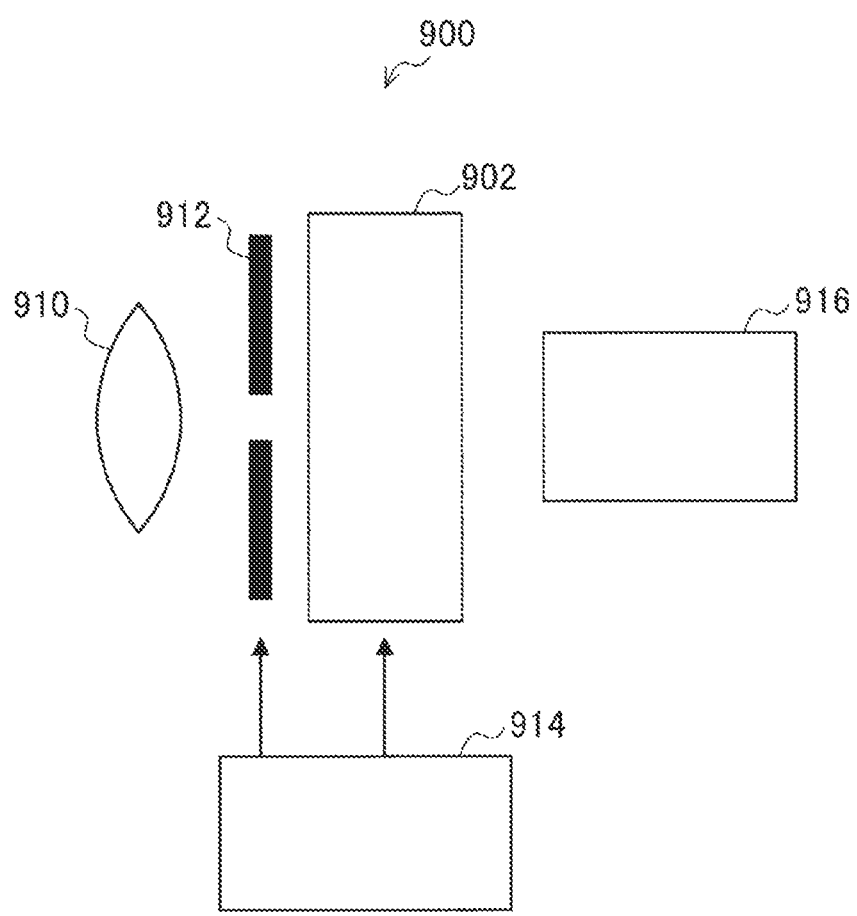
FIG. 12 is an explanatory diagram illustrating an exemplary electronic device 900 according to a fifth embodiment of the present disclosure.

The solid-state image capturing device 1 according to the embodiments of the present disclosure described above is applicable to general electronic devices including an image capturing device as an image acquisition unit, for example, image capturing devices such as a digital still camera and a video camera, a portable terminal device having an image capturing function, and a copier including a solid-state image capturing element as an image reading unit. In addition, the embodiments of the present disclosure are applicable to a robot, a drone, an automobile, a medical instrument (endoscope), and the like including the above-described solid-state image capturing device 1. Note that the solid-state image capturing device 1 according to the present embodiment may be formed as one chip or may be a module that had an image capturing function and in which an image capturing unit and a signal processing unit or an optical system are packaged as one. The following describes, as a fifth embodiment of the present disclosure, an exemplary electronic device 900 including an image capturing device 902 including the solid-state image capturing device 1 described above, with reference to FIG. 12. FIG. 12 is an explanatory diagram illustrating an exemplary electronic device 900 according to the present embodiment.

As illustrated in FIG. 12, the electronic device 900 includes the image capturing device 902, an optical lens 910, a shutter mechanism 912, a drive circuit unit 914, and a signal processing circuit unit 916. The optical lens 910 images image light (incident light) from an object onto an imaging plane of the image capturing device 902. Accordingly, signal electric charge is accumulated in solid-state image capturing elements 100 of the image capturing device 902 for a certain duration. The shutter mechanism 912 opens and closes to control the durations of irradiation and shielding of light to the image capturing device 902. The drive circuit unit 914 supplies drive signals for controlling a signal transferring operation of the image capturing device 902, a shutter operation of the shutter mechanism 912, and the like to these components. Specifically, the image capturing device 902 performs signal transferring based on a drive signal (timing signal) supplied from the drive circuit unit 914. The signal processing circuit unit 916 performs various kinds of signal processing. For example, the signal processing circuit unit 916 outputs an image signal provided with signal processing to a storage medium (not illustrated) such as a memory or to a display unit (not illustrated).

7. Sixth Embodiment

In the embodiments of the present disclosure described above, the size of the solid-state image capturing device 1 is reduced by stacking the plurality of photoelectric conversion elements 400, 500, and 600 (refer to FIG. 2, for example). However, since the plurality of photoelectric conversion elements 400, 500, and 600 are stacked in such a structure, the solid-state image capturing device 1 has an increased height (thickness) in the stacking direction. As a result, in such a structure, it is sometimes difficult to sufficiently acquire, at the photoelectric conversion elements 500 and 400 positioned on the lower side, light having transmitted through the photoelectric conversion element 600 positioned on the upper side. In addition, in such a structure, crosstalk of obliquely incident light to an adjacent solid-state image capturing element (pixel) 100 is likely to occur due to the increased height in the stacking direction in some cases.

Thus, the following discloses, as a sixth embodiment of the present disclosure, a structure through which light having transmitted through the photoelectric conversion element 600 positioned on the upper side can be condensed onto the photoelectric conversion elements 500 and 400 positioned on the lower side at high efficiency. Specifically, in the present embodiment described below, a light condensation element (specifically, a waveguide, an inner lens, a partition, or the like) for light condensation is provided between each two of the plurality of photoelectric conversion elements 400, 500, and 600 in the stacking direction. According to the present embodiment, since such a light condensation element is provided between each two of the plurality of photoelectric conversion elements 400, 500, and 600, light can be condensed onto the photoelectric conversion elements 500 and 400 positioned on the lower side at high efficiency. As a result, according to the present embodiment, it is possible to improve the sensitivity characteristic of the solid-state image capturing device 1 and also prevent generation of the above-described crosstalk. Details of the present embodiment will be sequentially described below.

Figure 14:
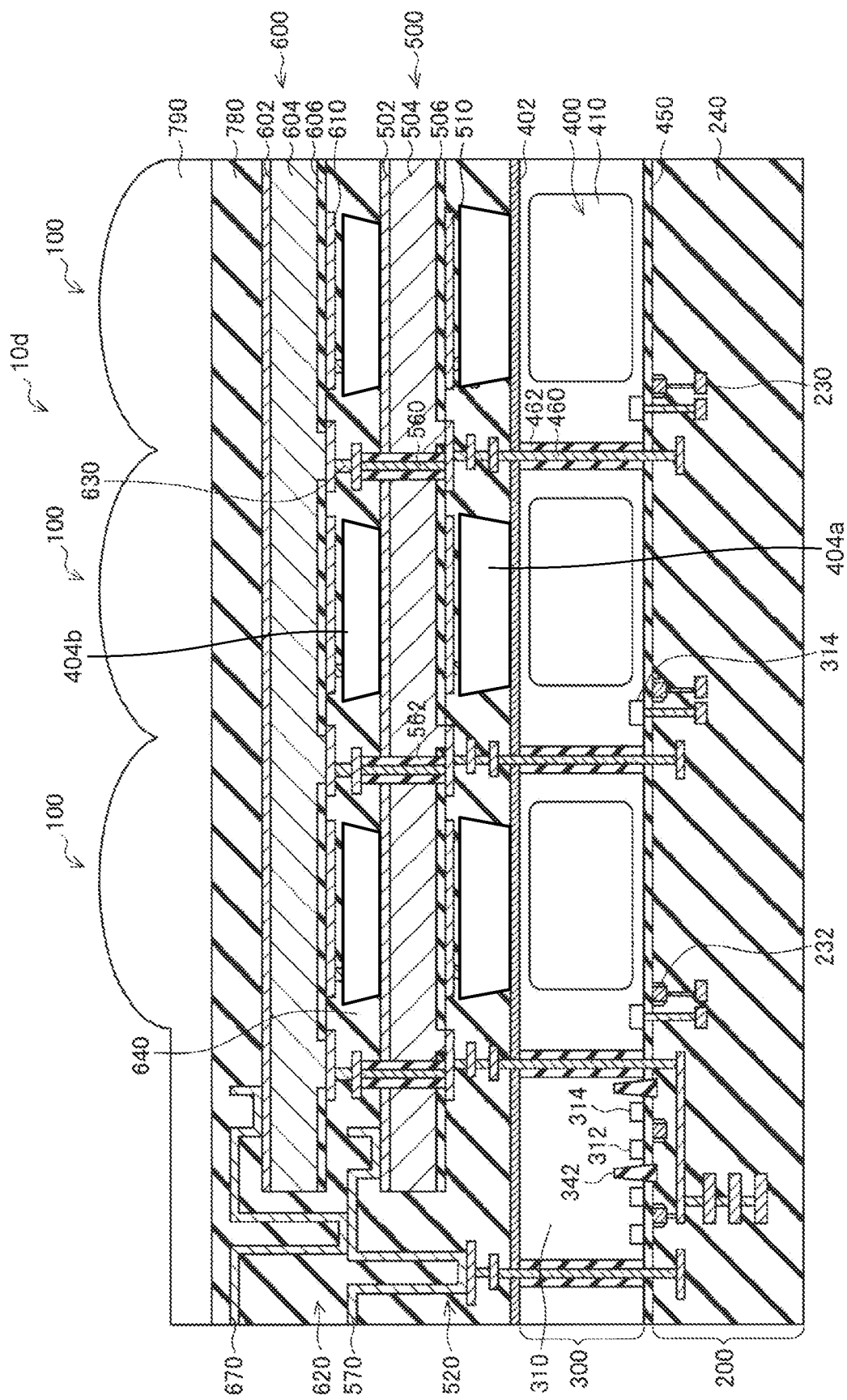
FIG. 14 is a cross-sectional view of a pixel array part 10d according to a sixth embodiment of the present disclosure.

First, one exemplary structure of the present embodiment will be described with reference to FIG. 14. FIG. 14 is a cross-sectional view of a pixel array part 10d according to the present embodiment. Specifically, in the present embodiment, as illustrated in FIG. 14, a waveguide 404a as the above-described light condensation element is provided in the insulating film 540 made of $SiO_2$ or the like, capable of transmitting light, and provided on the antireflection film 402. In addition, in the present embodiment, a waveguide 404b as the above-described light condensation element is provided in the insulating film 640 on the photoelectric conversion element 500. Specifically, in the present embodiment, the waveguides 404a and 404b, which are capable of condensing light on the photoelectric conversion elements 500 and 400 positioned on the lower side, are each provided between the corresponding two of the photoelectric conversion elements 400, 500, and 600 in the stacking direction of the solid-state image capturing element 100. The wave-guides 404a and 404b are preferably formed by using, for example, $Si_3N_4$ (having a refractive index of 1.9 approximately), and in this case, the insulating films 540 and 640 are formed of $SiO_2$ (having a refractive index of 1.4 approximately) to enable light condensation on the waveguides 404a and 404b due to the refractive index difference therebetween. Note that in the present embodiment, the materials of the waveguides 404a and 404b and the insulating films 540 and 640 are not particularly limited. However, in the present embodiment, the refractive index of the material of the waveguides 404a and 404b and the refractive index of the material of the insulating films 540 and 640 preferably have a difference of approximately 0.2 or larger, and in this manner, it is possible to further improve the light condensation efficiency of the waveguides 404a and 404b. In addition, the exemplary structure illustrated in FIG. 14 may be formed by various semiconductor process technologies.

As described above, according to the present embodiment, since the above-described waveguides 404a and 404b are each provided between the corresponding two of the plurality of the photoelectric conversion elements 400, 500, and 600, it is possible to condense light on the photoelectric conversion elements 500 and 400 positioned on the lower side at high efficiency. As a result, according to the present embodiment, it is possible to improve the sensitivity characteristic of the solid-state image capturing device 1 and prevent generation of the above-described crosstalk.

Figure 15:
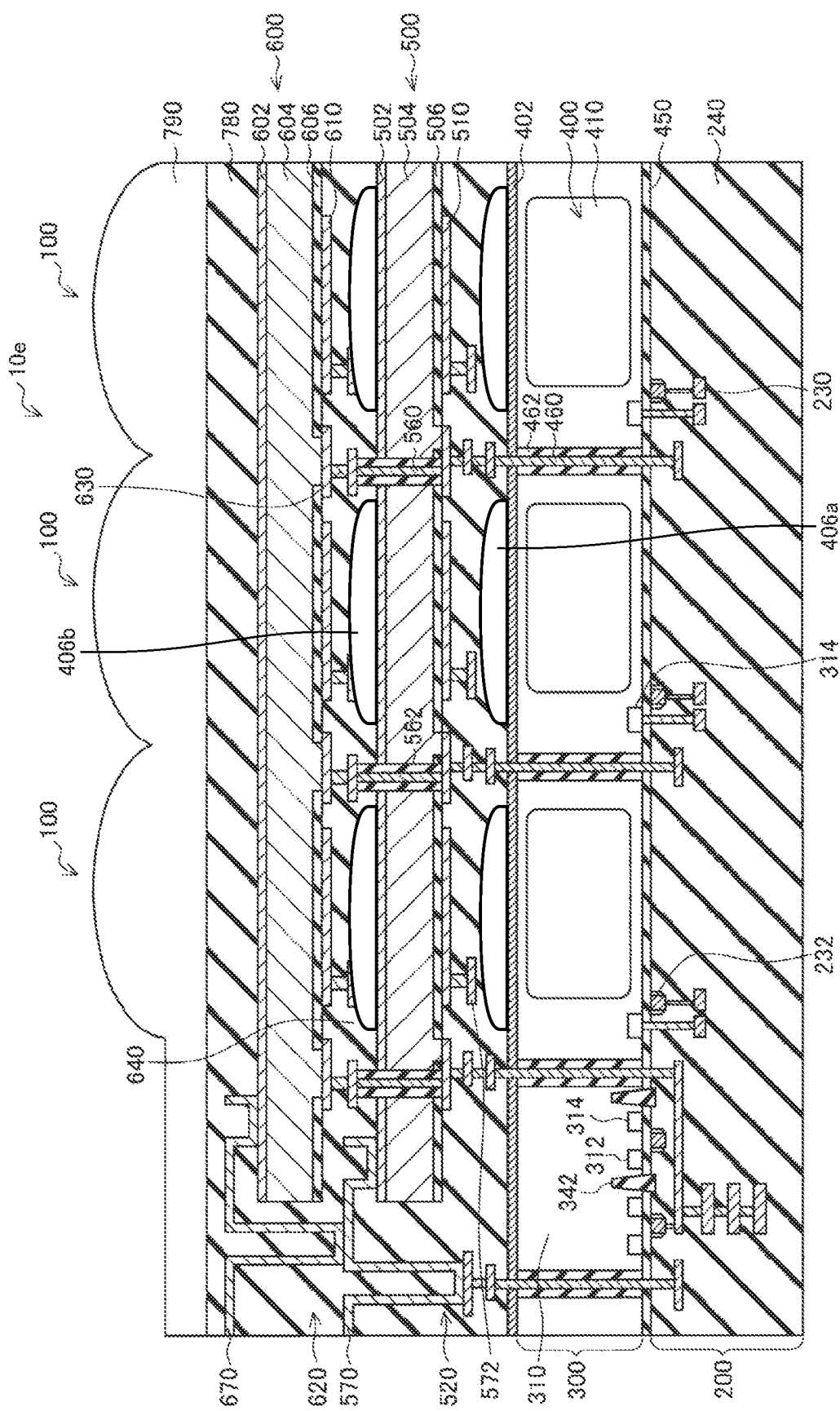
FIG. 15 is a cross-sectional view of a pixel array part 10e according to a first modification of the sixth embodiment of the present disclosure.

The present embodiment may be modified as illustrated in FIG. 15. A first modification of the exemplary structure of the present embodiment will be described below with reference to FIG. 15. FIG. 15 is a cross-sectional view of a pixel array part 10e according to the first modification of the present embodiment. Specifically, in the present first modification, inner lenses 406a and 406b capable of condensing light on the photoelectric conversion elements 500 and 400 positioned on the lower side are provided in place of the above-described waveguides 404a and 404b. The inner lenses 406a and 406b are preferably formed of a material having a refractive index higher than the refractive index, 1.4 to 1.6 approximately, of the material of the insulating films 540 and 640, more preferably formed of a material having a refractive index of 1.8 or higher. The material of the inner lenses 406a and 406b is a coating high-refractive-index material, for example, a material film of siloxane-based resin containing transparent metal-oxide-film fine particles such as $TiO_x$ or $ZnO_x$; a SiN film, a SiON film, or a TiOx film formed by the CVD method.

The structure illustrated in FIG. 15 may be formed, for example, as described below. A high-refractive-index layer (not illustrated) made of a high-refractive-index material is formed on the antireflection film 402, and a resist for forming the inner lenses 406a and 406b is formed on the high-refractive-index layer. Then, after the resist formation, a lens pattern is formed by lithography, and thermal treatment (reflow) is performed to form a knoll-shaped resist corresponding to the outer shapes of the inner lenses 406a and 406b. Thereafter, entire surface etching back is performed by dry etching to transfer the shape of the above-described resist onto the high-refractive-index layer, thereby forming the inner lenses 406a and 406b. Note that etching gas used for the above-described etching is fluorocarbon gas such as $CF_4$ or $C_4F_8$, oxygen gas $O_2$, or the like.

As described above, according to the exemplary structure illustrated in FIG. 15, since the inner lenses 406a and 406b are each provided between the corresponding two of the plurality of the photoelectric conversion elements 400, 500, and 600, it is possible to condense light on the photoelectric conversion elements 500 and 400 positioned on the lower side at high efficiency. As a result, according to the present modification, it is possible to improve the sensitivity characteristic of the solid-state image capturing device 1 and prevent generation of the above-described crosstalk.

Figure 16:
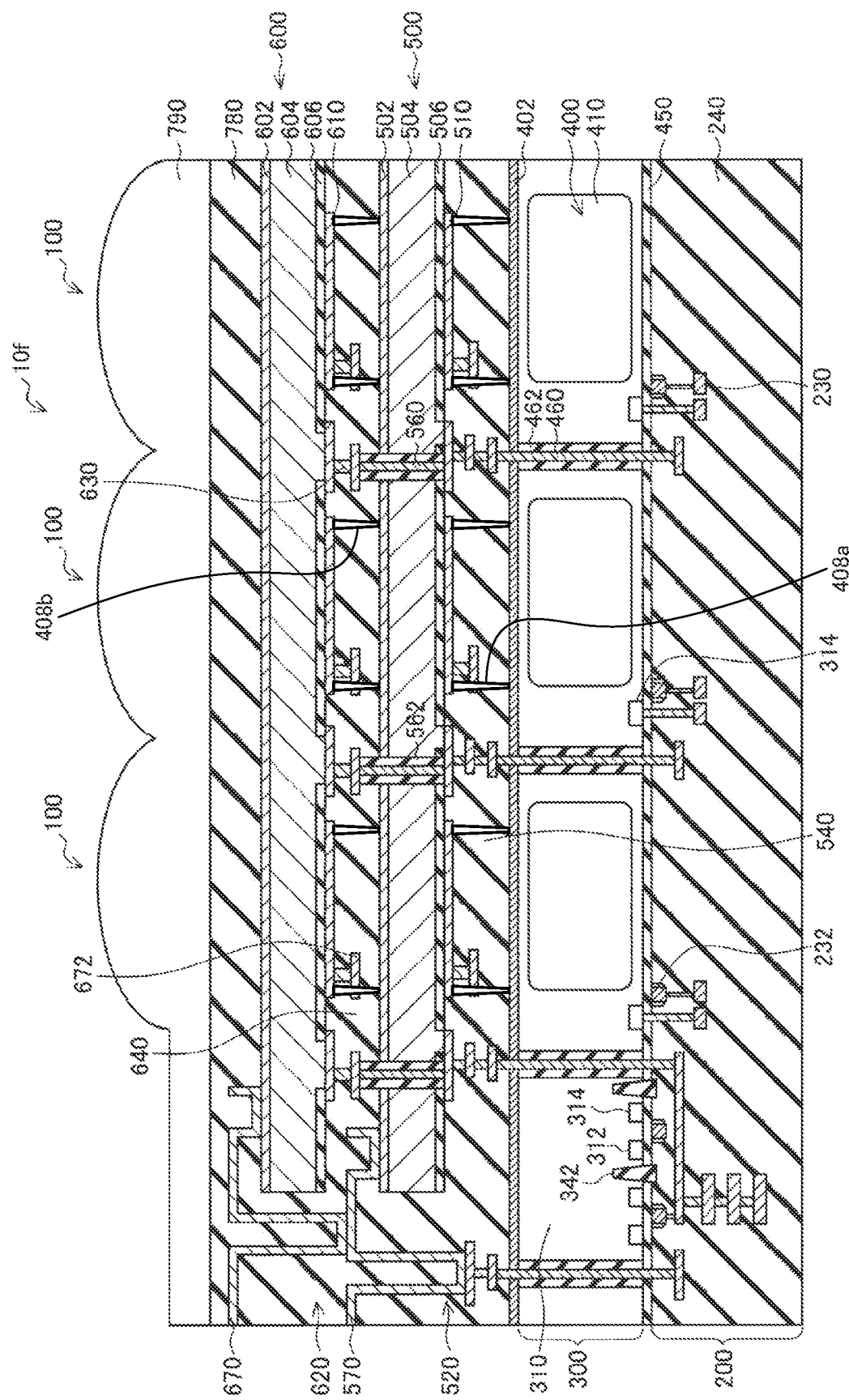
FIG. 16 is a cross-sectional view of a pixel array part 10f according to a second modification of the sixth embodiment of the present disclosure.

The present embodiment may be modified as illustrated in FIG. 16. A second modification of the exemplary structure of the present embodiment will be described below with reference to FIG. 16. FIG. 16 is a cross-sectional view of a pixel array part 10f according to the second modification of the present embodiment. Specifically, in the present second modification, partitions 408a and 408b are provided in place of the above-described waveguides 404a and 404b. For example, when the insulating films 540 and 640 are formed of $SiO_2$ (having a refractive index of 1.4 approximately), the partitions 408a and 408b are preferably formed of $Si_3N_4$ (having a refractive index of 1.9 approximately). In the present modification, the material of the partitions 408a and 408b is not particularly limited, but the refractive index of the material of the partitions 408a and 408b and the refractive index of the material of the insulating films 540 and 640 preferably have a difference of approximately 0.2 or larger, and in this manner, it is possible to further improve the light condensation efficiency. A metal material (Al, W, Ti, TiN, TiAl (titanium-aluminum), Cu, Ta (tantalum), TaN, Co, Ru, or a material including these elements) may be used as the material of the partitions 408a and 408b.

As described above, according to the exemplary structure illustrated in FIG. 16, since the partitions 408a and 408b are each provided between the corresponding two of the plurality of the photoelectric conversion elements 400, 500, and 600, it is possible to condense light on the photoelectric conversion elements 500 and 400 positioned on the lower side at high efficiency. As a result, according to the present modification, it is possible to improve the sensitivity characteristic of the solid-state image capturing device 1 and also prevent generation of the above-described crosstalk.

In addition, in the present disclosure, the present embodiment and the first and the second modifications described above may be combined as appropriate. In the present embodiment, positions at which the waveguides 404a and 404b, the inner lenses 406a and 406b, and the partitions 408a and 408b are provided are not limited to the above-described positions but may be provided at any other position, and thus are not particularly limited.

8. Seventh Embodiment

In the embodiments of the present disclosure described above, the plurality of photoelectric conversion elements 500 and 600 are stacked, and the penetration electrode 560 is provided to electrically connect the photoelectric conversion elements 500 and 600. In the embodiments of the present disclosure described above, for example, since one penetration electrode 560 is shared between the photoelectric conversion elements 500 and 600, it is possible to reduce the area of fabrication and increase the area of the pixel transistors. However, in the embodiments of the present disclosure described above, as understood from FIG. 2, it is difficult to avoid an increase in the size of the reading electrode 508 to ensure electrical connection between the penetration electrode 560 connected with the photoelectric conversion element 600, and the photoelectric conversion element 500 (specifically, the photoelectric conversion film 504 exposed through an opening). As a result, in the embodiments of the present disclosure described above, due to an increase in the size of the reading electrode 508, it is difficult to avoid reduction of the size of the entrance surface through which light is incident on the photoelectric conversion elements 500 and 400 in some cases.

Thus, a seventh embodiment of the present disclosure, which makes it possible to avoid reduction of the size of the entrance surface through which light is incident on the photoelectric conversion elements 500 and 400 will be described below. In the embodiment described below, a structure in which a transparent conductive layer 480 electrically connected with the photoelectric conversion element 500 (specifically, the photoelectric conversion film 504) is provided and a penetration electrode 560a connected with the photoelectric conversion element 600 (specifically, the photoelectric conversion film 604) is electrically connected with the transparent conductive layer 480 is disclosed. In addition, in the present embodiment, a structure in which the penetration electrode 560a is electrically connected with, through the above-described transparent conductive layer 480, a penetration electrode 460a penetrating through the semiconductor substrate 300 is disclosed (refer to FIG. 17). With such a structure, electrical connection between the photoelectric conversion elements 500 and 600 can be ensured through the penetration electrode 560a and the transparent conductive layer 480. In addition, with such a structure, the penetration electrode 560a and the penetration electrode 460a can be disposed at the same position, in other words, the penetration electrodes 560a and 460a can be placed one over another when a pixel array part 10g is viewed from above. Thus, an opening through which the surface of the photoelectric conversion film 504 is exposed to ensure the above-described electrical connection is unnecessary, and thus an increase in the size of the reading electrode 508 can be avoided or the reading electrode 508 can be made unnecessary. As a result, according to the present embodiment, since an increase in the size of the reading electrode 508 can be avoided or the reading electrode 508 can be made unnecessary, it is possible to avoid size reduction of the above-described entrance surface. Details of the present embodiment will be sequentially described below.

Figure 17:
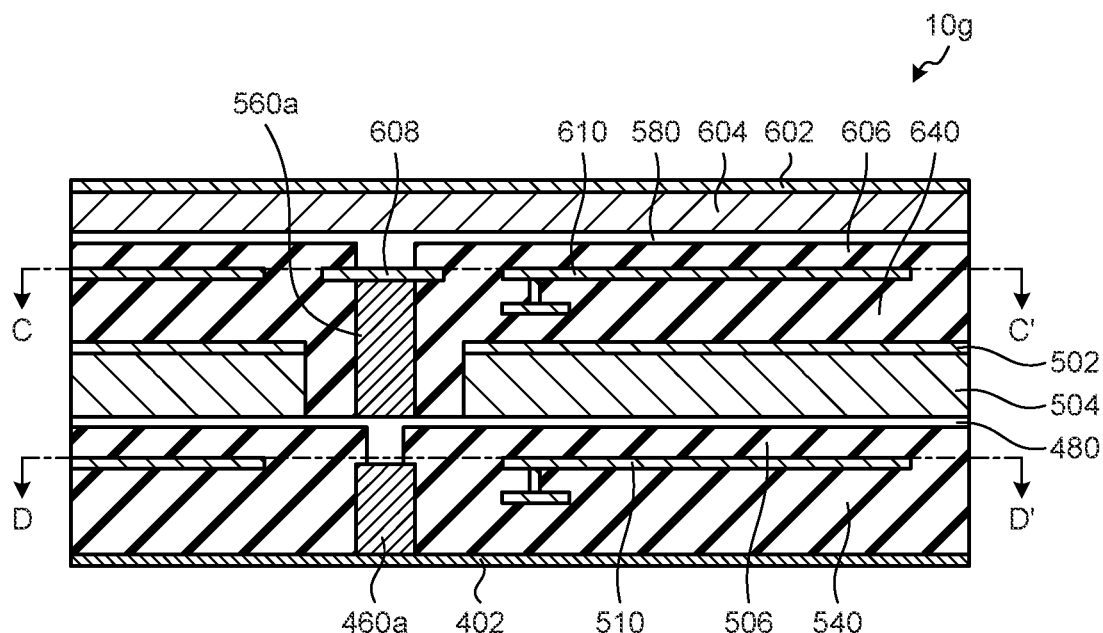
FIG. 17 is a cross-sectional view of a main part of a pixel array part 10g according to a seventh embodiment of the present disclosure.

First, one exemplary structure of the present embodiment will be described with reference to FIG. 17. FIG. 17 is a cross-sectional view of the pixel array part 10g according to the present embodiment, illustrating only a main part of the present embodiment for simplicity. Specifically, in the present embodiment, as illustrated in FIG. 17, a transparent conductive layer 580 electrically connected with the photoelectric conversion film 604 is provided below the photoelectric conversion film 604 of the photoelectric conversion element 600. The transparent conductive layer 580 is electrically connected with, through the reading electrode 608, the penetration electrode 560a penetrating through the insulating film 640 and the photoelectric conversion film 504 of the photoelectric conversion element 500. In the present embodiment, the transparent conductive layer 480 electrically connected with the photoelectric conversion film 504 is provided below the photoelectric conversion film 504. The transparent conductive layer 480 is electrically connected with the penetration electrode 460a penetrating through the semiconductor substrate 300. The above-described penetration electrode 560a is electrically connected with the penetration electrode 460a through the transparent conductive layer 480. In the present embodiment, the penetration electrode 560a and the penetration electrode 460a are disposed at the same position, in other words, the penetration electrodes 560a and 460a overlap when the pixel array part 10g is viewed from above.

In the present embodiment, the transparent conductive layers 480 and 580 may be formed of an oxide semiconductor material such as IGZO (indium-gallium-zinc oxide), an organic semiconductor material, or the like. Examples of oxide semiconductor materials other than IGZO include ZTO (zinc-tin oxide), IGZTO (indium-gallium-zinc-tin oxide), GTO (gallium-tin oxide), and IGO (indium-gallium oxide). Note that in the present embodiment, IGZO is preferably selected from a viewpoint of characteristics and production easiness. Note that, in the transparent conductive layer 480, a region of connection with the penetration electrode 560a preferably has low resistance. Thus, in the present embodiment, for example, when the transparent conductive layer 480 is provided with an opening for electrical connection with the penetration electrode 560a, hydrogen plasma processing is preferably performed on the surface of the transparent conductive layer 480 exposed through the opening after formation of the opening.

In the present embodiment, examples of a metallic material used for the penetration electrode 560a include W, TiN/W, Co, CoWB (cobalt-tungsten-boron), and CoBP (cobalt-boron-phosphorus).

Figure 18:
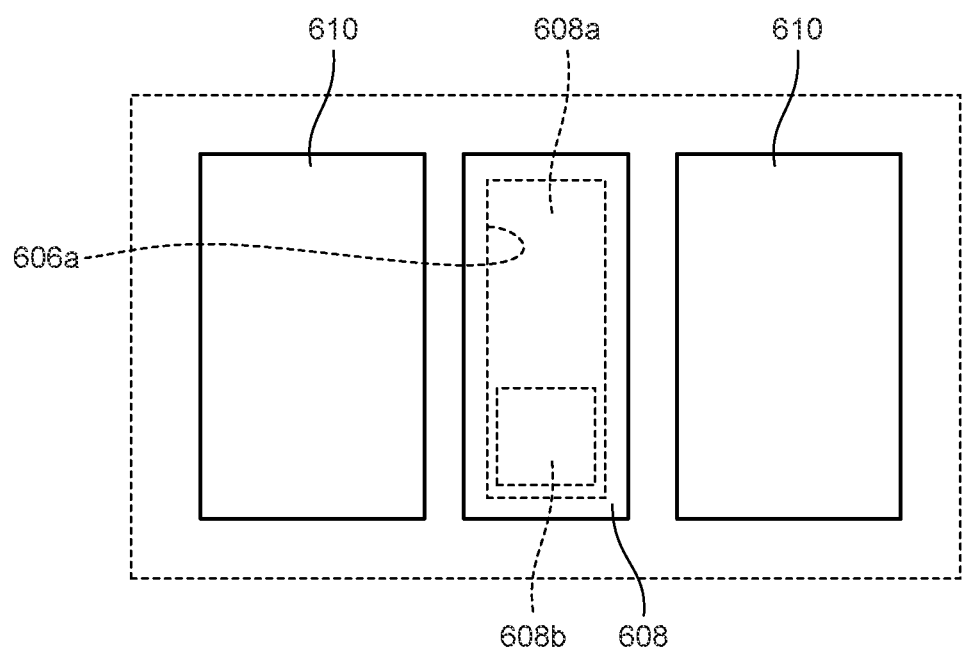
FIG. 18 is a cross-sectional view of the solid-state image capturing element 100 being cut along line C-C' in FIG. 17 in two-pixel sharing.
Figure 19:
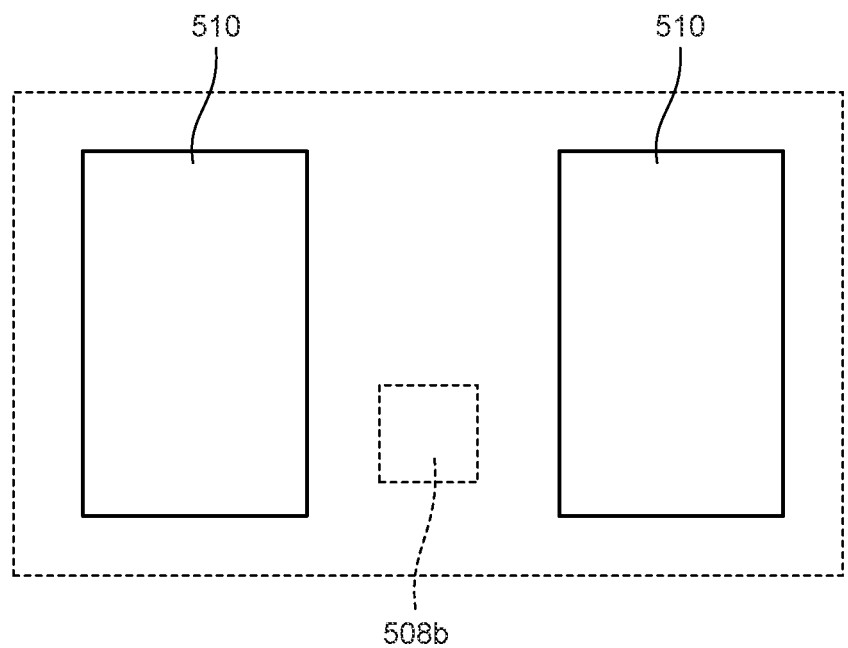
FIG. 19 is a cross-sectional view of the solid-state image capturing element 100 being cut along line D-D' in FIG. 17 in two-pixel sharing.

The following describes an arrangement configuration when the penetration electrodes 460a and 560a are shared between two pixels (solid-state image capturing elements) 100 (two-pixel sharing) in the present embodiment with reference to FIGS. 18 and 19. FIG. 18 is a cross-sectional view of the solid-state image capturing element 100 being cut along line C-C' in FIG. 17 in two-pixel sharing, and FIG. 19 is a cross-sectional view of the solid-state image capturing element 100 being cut along line D-D' in FIG. 17 in two-pixel sharing. Specifically, as illustrated in FIG. 18, in the present embodiment, the reading electrode 608 includes the exposure region 608a exposed through the opening 606a provided at the insulating film 606 and contacting the photoelectric conversion film 604 through the transparent conductive layer 580. In addition, in the present embodiment, a contact region 608b electrically connected with the penetration electrode 560a is provided at part of the exposure region 608a. As illustrated in FIG. 19, in the present embodiment, the contact region 508b electrically connected with the penetration electrode 460a through the transparent conductive layer 480 is provided between the two accumulation electrodes 510.

Figure 20:
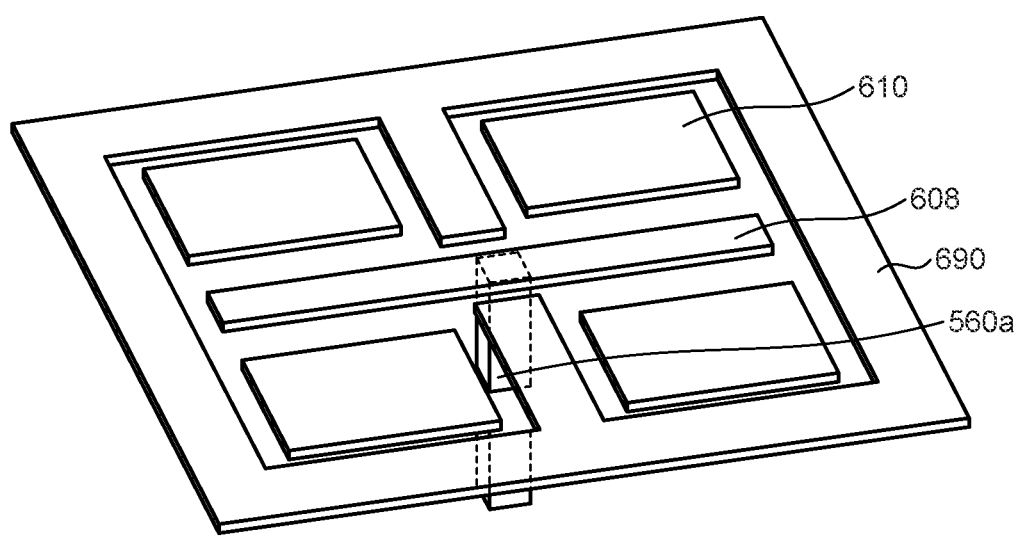
FIG. 20 is a sectional perspective view of the solid-state image capturing element 100 being cut along line C-C' in FIG. 17 in four-pixel sharing.
Figure 21:
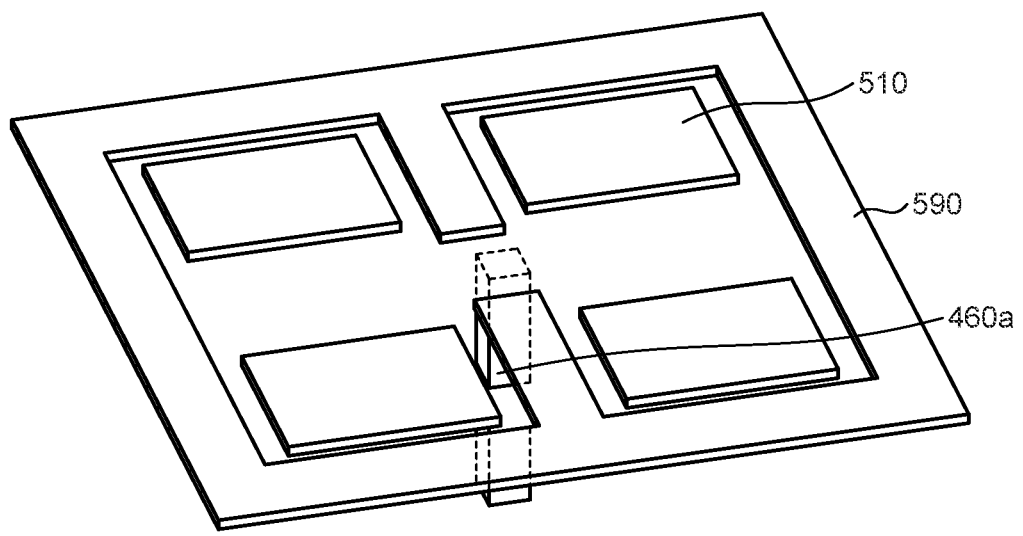
FIG. 21 is a sectional perspective view of the solid-state image capturing element 100 being cut along line D-D' in FIG. 17 in four-pixel sharing.

The following describes an arrangement configuration when the penetration electrodes 460a and 560a are shared among four pixels 100 (four-pixel sharing) in the present embodiment with reference to FIGS. 20 and 21. FIG. 20 is a sectional perspective view of the solid-state image capturing element 100 being cut along line C-C' in FIG. 17 in four-pixel sharing, and FIG. 21 is a sectional perspective view of the solid-state image capturing element 100 being cut along line D-D' in FIG. 17 in four-pixel sharing. As illustrated in FIG. 20, in the present embodiment, a shield pattern 690 is provided surrounding the accumulation electrodes 610 of the four pixels 100, and in addition, the reading electrode 608 is provided at the center of the four accumulation electrodes 610 to partition the accumulation electrodes 610 into pairs. In the present embodiment, as illustrated in FIG. 20, the penetration electrode 560a extending downward is provided below the center of the reading electrode 608. In the present embodiment, as illustrated in FIG. 21, a shield pattern 590 is provided surrounding the accumulation electrodes 510 of the four pixels 100, and the penetration electrode 460a extending downward is provided below the center surrounded by the four accumulation electrodes 510. In the present embodiment, as illustrated in FIGS. 20 and 21, the penetration electrode 560a and the penetration electrode 460a overlap when the pixel array part 10g is viewed from above.

Note that the arrangement configuration illustrated in FIGS. 18 to 21 is an example of the present embodiment, and for example, in each modification of the present embodiment to be described later, the arrangement configuration illustrated in FIGS. 18 to 21 may be modified as appropriate in accordance with the modification.

The following describes a manufacturing method for the solid-state image capturing element 100 according to the present embodiment with reference to FIGS. 22 to 28. FIGS. 22 to 28 are cross-sectional views for description of the manufacturing method for the solid-state image capturing element 100 according to the present embodiment, and only the main part of the present embodiment is illustrated in these drawings.

Figure 22:
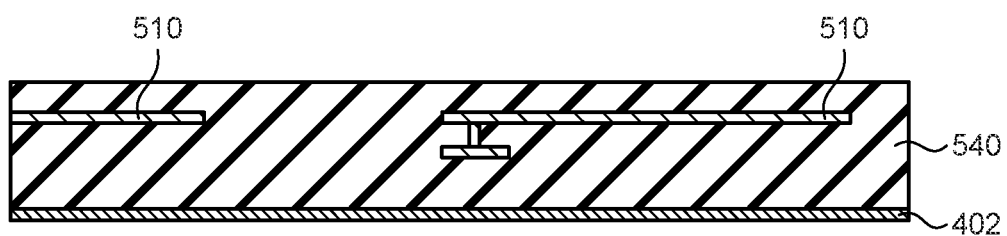
FIG. 22 is a cross-sectional view (1) for description of a manufacturing method for the solid-state image capturing element 100 according to the seventh embodiment of the present disclosure.
Figure 23:
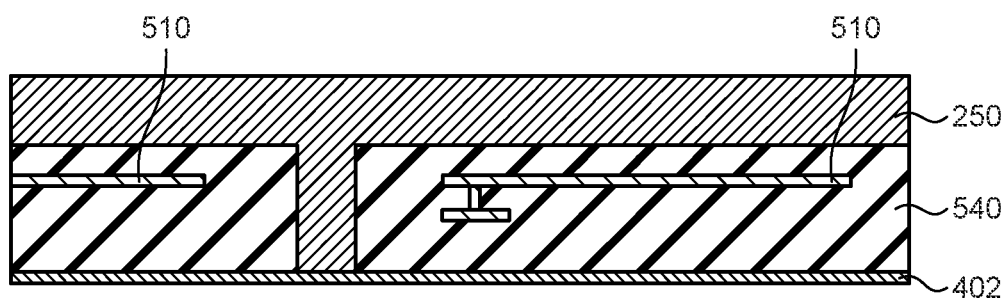
FIG. 23 is a cross-sectional view (2) for description of the manufacturing method for the solid-state image capturing element 100 according to the seventh embodiment of the present disclosure.
Figure 24:
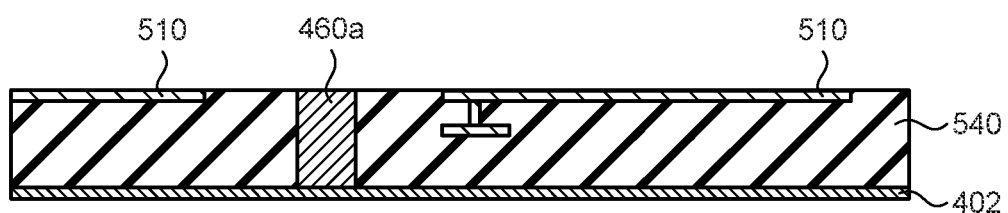
FIG. 24 is a cross-sectional view (3) for description of the manufacturing method for the solid-state image capturing element 100 according to the seventh embodiment of the present disclosure.

First, as illustrated in FIG. 22, the insulating film 540 is deposited on the semiconductor substrate 300 (not illustrated) on which the antireflection film 402 is formed, and the accumulation electrode 510 is formed on the insulating film 540. In addition, the insulating film 540 is embedded between the accumulation electrodes 510, and then a chemical mechanical polishing (CMP) method is applied to the surface to achieve flattening. Subsequently, as illustrated in FIG. 23, a via penetrating through the insulating film 540 is formed for the penetration electrode 460a, and a metal film (for example, a W film) 250 is deposited so that the via is embedded. Then, as illustrated in FIG. 24, flattening is performed to reach the surface of each accumulation electrode 510 by the CMP method to remove the metal film 250 protruding from the above-described via, thereby forming the penetration electrode 460a.

Figure 25:
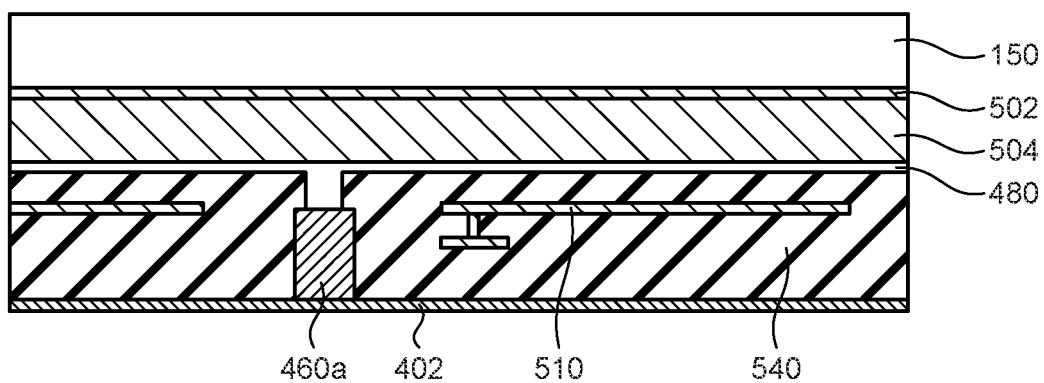
FIG. 25 is a cross-sectional view (4) for description of the manufacturing method for the solid-state image capturing element 100 according to the seventh embodiment of the present disclosure.

Then, the insulating film 540 is deposited on the accumulation electrode 510, and the deposited insulating film 540 is patterned by photolithography and dry etching to form, on the penetration electrode 460a, an opening through which the penetration electrode 460a is exposed from the insulating film 540. Then, the transparent conductive layer 480 is deposited to block the opening and cover the insulating film 540. In addition, as illustrated in FIG. 25, the photoelectric conversion film 504, the common electrode 502, and an organic film 150 are sequentially deposited on the transparent conductive layer 480.

Figure 26:
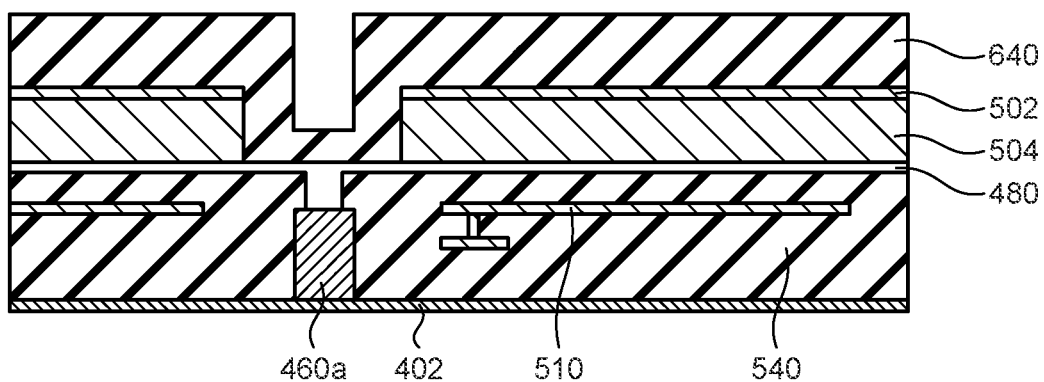
FIG. 26 is a cross-sectional view (5) for description of the manufacturing method for the solid-state image capturing element 100 according to the seventh embodiment of the present disclosure.

Subsequently, as illustrated in FIG. 26, a via penetrating through the common electrode 502 and the photoelectric conversion film 504 is formed for the penetration electrode 560a by photolithography and dry etching (specifically, etching to reach the surface of the transparent conductive layer 480), and the insulating film 640 is deposited to cover the sidewall of the via and the surface of the common electrode 502.

Figure 27:
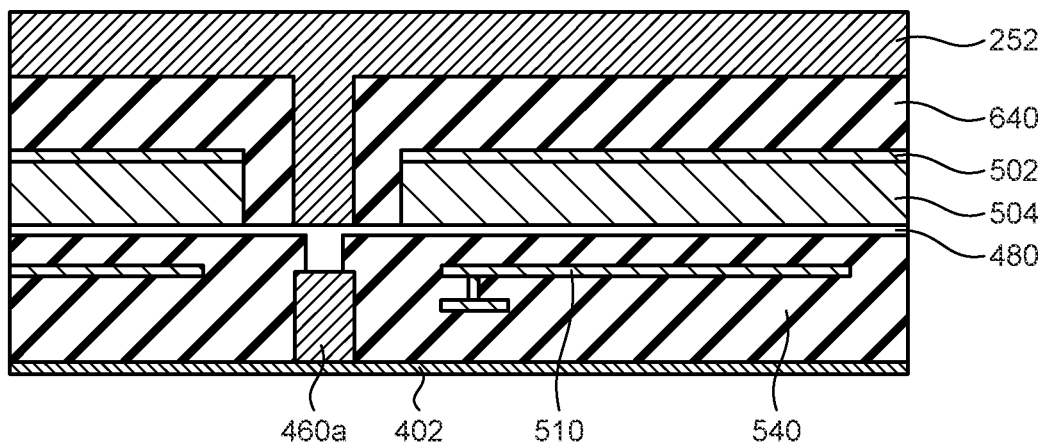
FIG. 27 is a cross-sectional view (6) for description of the manufacturing method for the solid-state image capturing element 100 according to the seventh embodiment of the present disclosure.
Figure 28:
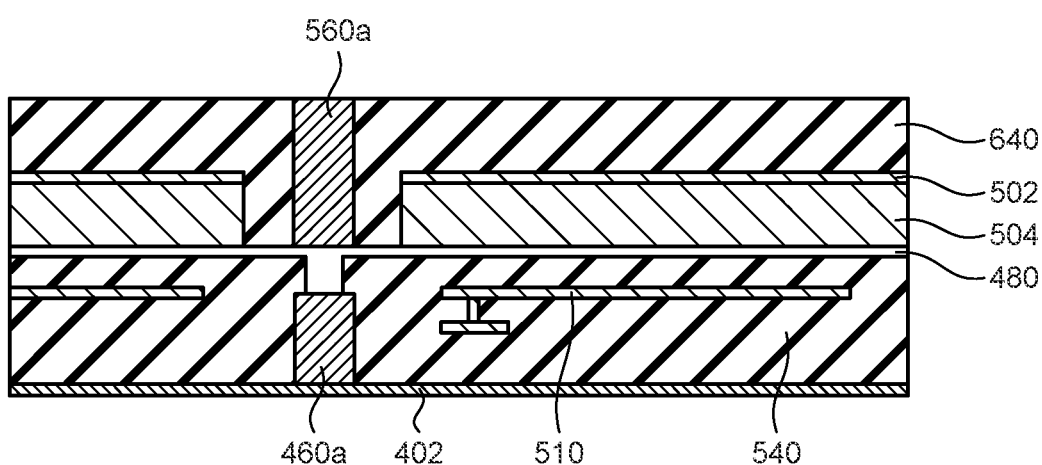
FIG. 28 is a cross-sectional view (7) for description of the manufacturing method for the solid-state image capturing element 100 according to the seventh embodiment of the present disclosure.

Then, as illustrated in FIG. 27, the insulating film 640 deposited at the bottom of the above-described via is removed by dry etching, and a metal film (for example, a W film) 252 is deposited to embed the via. In addition, as illustrated in FIG. 28, the metal film 252 protruding from the above-described via is removed by using the CMP method or a dry etching method to form the penetration electrode 560a. Thereafter, the reading electrode 608, the accumulation electrode 610, the transparent conductive layer 580, the photoelectric conversion film 604, and the common electrode 602 are formed to obtain the pixel array part 10g as illustrated in FIG. 17.

As described above, according to the present embodiment, an increase in the size of the reading electrode 508 can be avoided or the reading electrode 508 can be made unnecessary, and thus it is possible to avoid reduction of the above-described entrance surface.

Figure 29:
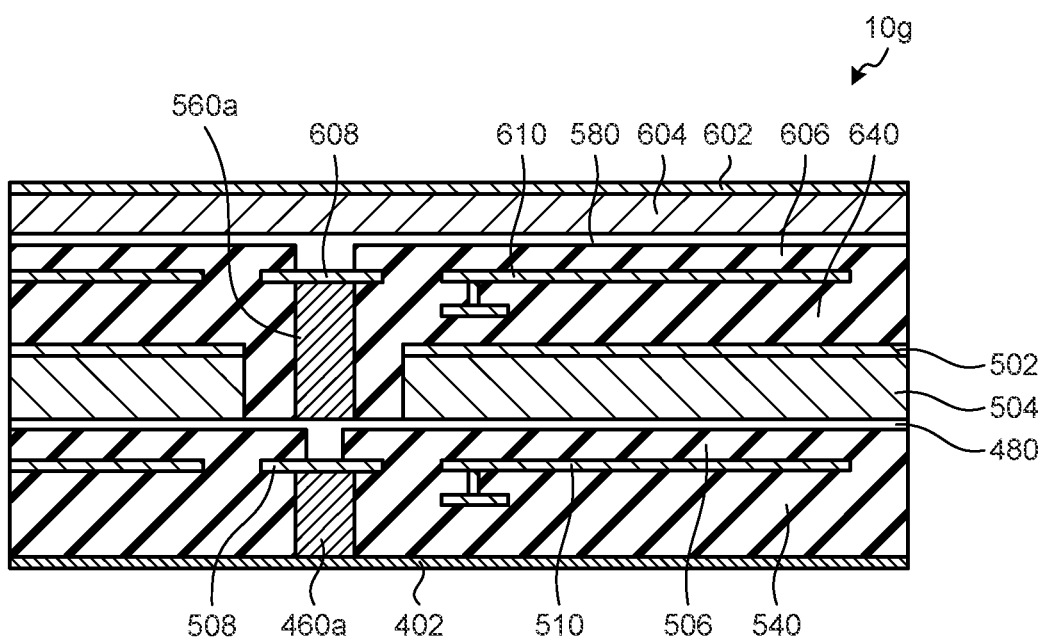
FIG. 29 is a cross-sectional view of a main part of the pixel array part 10g according to a first modification of the seventh embodiment of the present disclosure.

The present embodiment may be modified as illustrated in FIG. 29. A first modification of the exemplary structure of the present embodiment will be described with reference to FIG. 29. FIG. 29 is a cross-sectional view of a main part of the pixel array part 10g according to the first modification of the present embodiment. Specifically, in the present first modification, as illustrated in FIG. 29, the reading electrode 508 is provided, and the penetration electrode 560a and the penetration electrode 460a are electrically connected with each other through the reading electrode 508 and the transparent conductive layer 480. Similarly to the above-described embodiment, a structure according to the present first modification illustrated in FIG. 29 not only can avoid reduction of the entrance surface but can also be easily formed.

The following describes a manufacturing method for the solid-state image capturing element 100 according to the first modification of the present embodiment with reference to FIGS. 30 to 36. FIGS. 30 to 36 are cross-sectional views for description of the manufacturing method for the solid-state image capturing element 100 according to the first modification of the present embodiment, and only the main part of the present embodiment is illustrated in these drawings.

Figure 30:
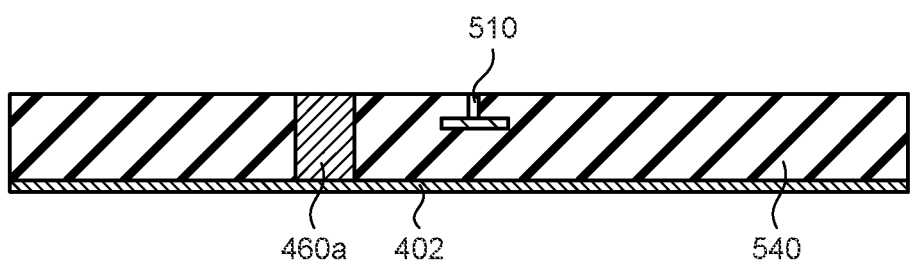
FIG. 30 is a cross-sectional view (1) for description of a manufacturing method for the solid-state image capturing element 100 according to the first modification of the seventh embodiment of the present disclosure.
Figure 31:
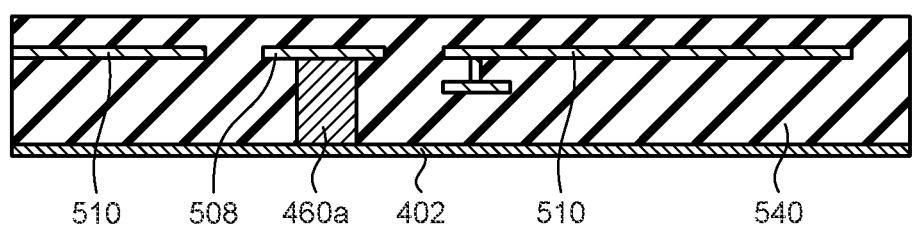
FIG. 31 is a cross-sectional view (2) for description of the manufacturing method for the solid-state image capturing element 100 according to the first modification of the seventh embodiment of the present disclosure.
Figure 32:
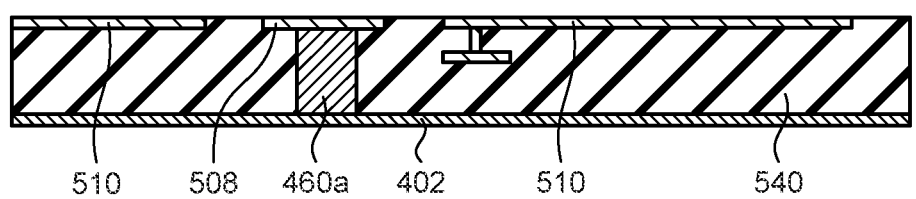
FIG. 32 is a cross-sectional view (3) for description of the manufacturing method for the solid-state image capturing element 100 according to the first modification of the seventh embodiment of the present disclosure.

First, similarly to the present embodiment, the insulating film 540 is deposited on the semiconductor substrate 300 (not illustrated) on which the antireflection film 402 is formed, and the accumulation electrode 510 is formed on the insulating film 540. After the insulating film 540 is deposited, a via penetrating through the insulating film 540 is formed for the penetration electrode 460a, and a metal film is deposited to embed the via. Then, as illustrated in FIG. 30, flattening is performed to reach the surface of the accumulation electrode 510 by the CMP method to remove the metal film protruding from the above-described via, thereby forming the penetration electrode 460a. Subsequently, as illustrated in FIG. 31, the reading electrode 508 and the accumulation electrode 510 are formed, and the insulating film 540 is deposited thereon. In addition, as illustrated in FIG. 32, the CMP method is performed until the surfaces of the reading electrode 508 and the accumulation electrode 510 are exposed, thereby achieving flattening.

Figure 33:
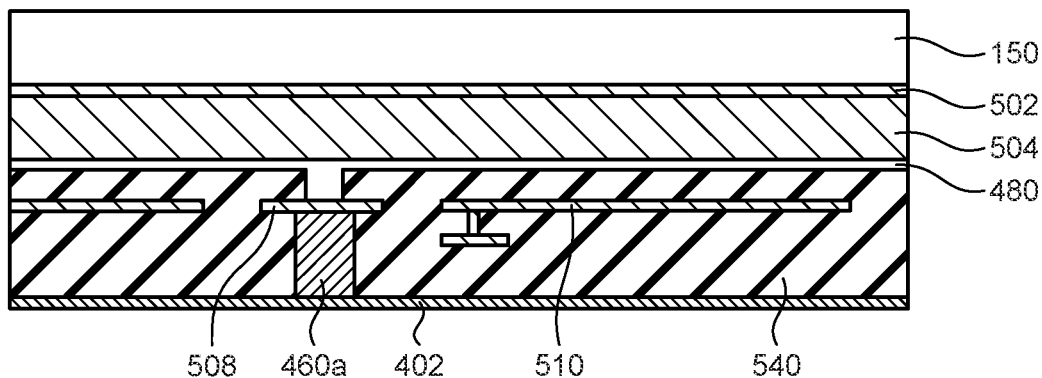
FIG. 33 is a cross-sectional view (4) for description of the manufacturing method for the solid-state image capturing element 100 according to the first modification of the seventh embodiment of the present disclosure.

Then, the insulating film 540 is deposited on the reading electrode 508 and the accumulation electrode 510, and an opening through which the surface of the reading electrode 508 on the penetration electrode 460a is exposed from the insulating film 540 is formed at the deposited insulating film 540. Then, the transparent conductive layer 480 is deposited to block the above-described opening and cover the insulating film 540. In addition, as illustrated in FIG. 33, the photoelectric conversion film 504, the common electrode 502, and the organic film 150 are sequentially deposited on the transparent conductive layer 480.

Figure 34:
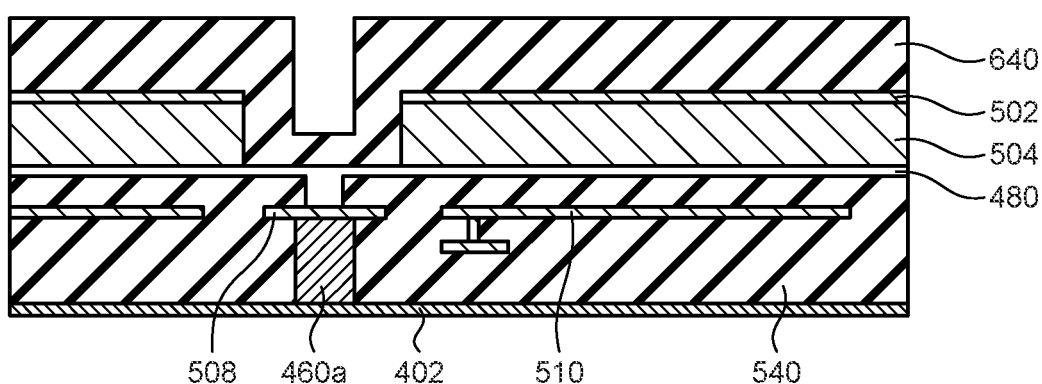
FIG. 34 is a cross-sectional view (5) for description of the manufacturing method for the solid-state image capturing element 100 according to the first modification of the seventh embodiment of the present disclosure.

Subsequently, as illustrated in FIG. 34, a via penetrating through the common electrode 502 and the photoelectric conversion film 504 is formed for the penetration electrode 560a by photolithography and dry etching (specifically, etching to reach the surface of the transparent conductive layer 480), and the insulating film 640 is deposited to cover the sidewall of the via and the surface of the common electrode 502.

Figure 35:
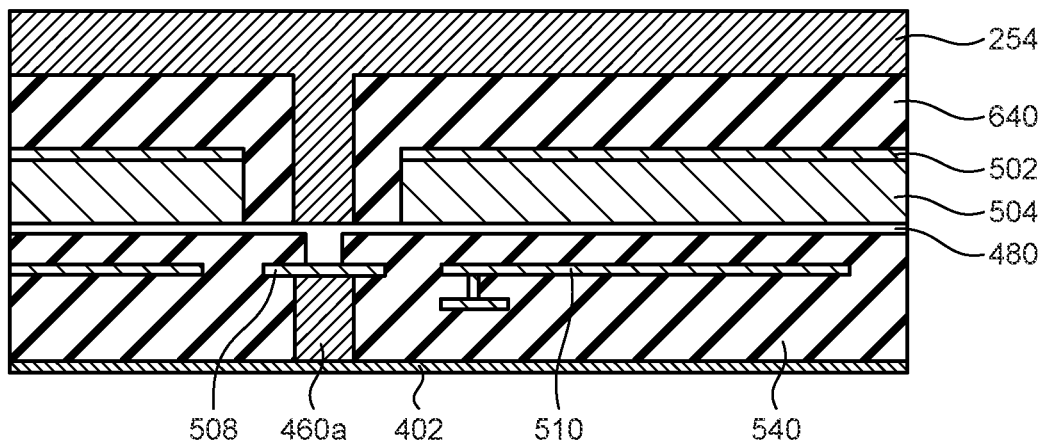
FIG. 35 is a cross-sectional view (6) for description of the manufacturing method for the solid-state image capturing element 100 according to the first modification of the seventh embodiment of the present disclosure.
Figure 36:
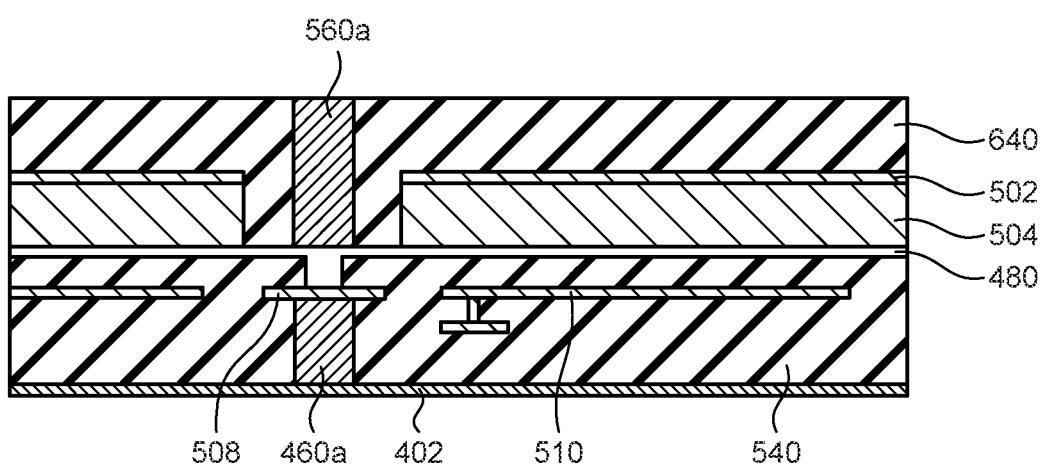
FIG. 36 is a cross-sectional view (7) for description of the manufacturing method for the solid-state image capturing element 100 according to the first modification of the seventh embodiment of the present disclosure.

Then, as illustrated in FIG. 35, the insulating film 640 deposited at the bottom of the above-described via is removed, and a metal film 254 is deposited to embed the via. In addition, as illustrated in FIG. 36, the metal film 254 protruding from the above-described via is removed to form the penetration electrode 560a. Thereafter, the reading electrode 608, the accumulation electrode 610, the transparent conductive layer 580, the photoelectric conversion film 604, and the common electrode 602 are formed to obtain the pixel array part 10g as illustrated in FIG. 29.

Figure 37:
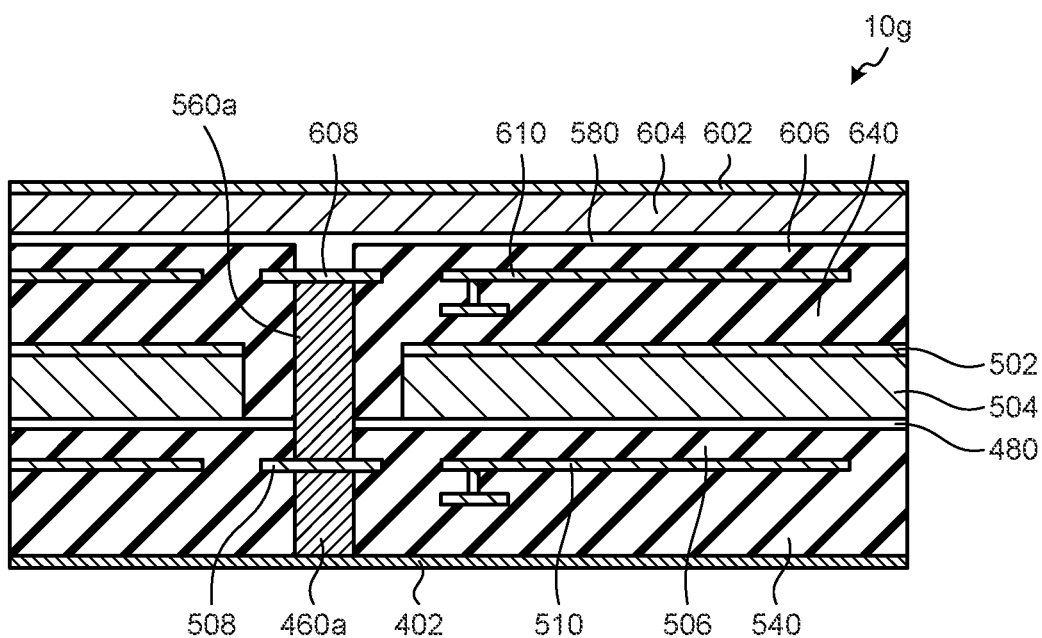
FIG. 37 is a cross-sectional view of the main part of the pixel array part 10g according to a second modification of the seventh embodiment of the present disclosure.

The present embodiment may be modified as illustrated in FIG. 37. A second modification of the exemplary structure of the present embodiment will be described with reference to FIG. 37. FIG. 37 is a cross-sectional view of the main part of the pixel array part 10g according to the second modification of the present embodiment. Specifically, in the present second modification, the penetration electrode 560a contacts the transparent conductive layer 480 not at the bottom surface of the penetration electrode 560a but at the side surface thereof to achieve electrical connection. Similarly to the above-described embodiment, a structure according to the present second modification illustrated in FIG. 37 can avoid reduction of the entrance surface.

The following describes a manufacturing method for the solid-state image capturing element 100 according to the second modification of the present embodiment with reference to FIGS. 38 to 41. FIGS. 38 to 41 are cross-sectional views for description of the manufacturing method for the solid-state image capturing element 100 according to the second modification of the present embodiment, and only the main part of the present embodiment is illustrated in these drawings. Note that the above description of FIGS. 30 to 32 in the first modification is common to the manufacturing method of the present second modification, and thus description of any common part is omitted.

Figure 38:
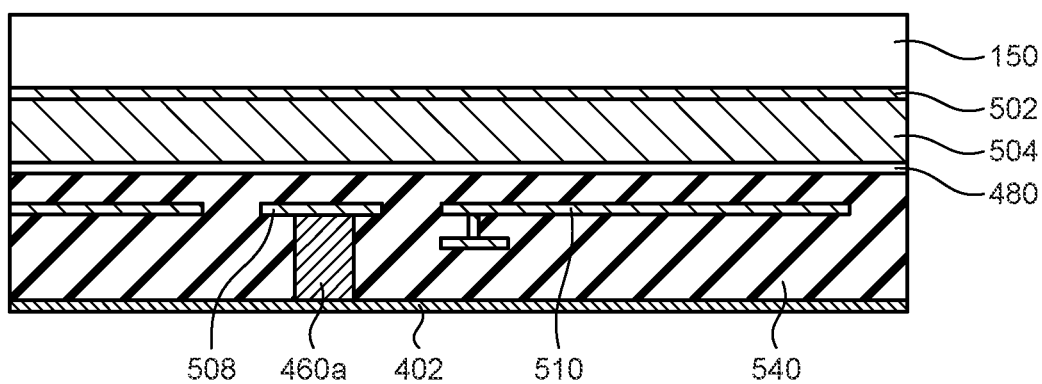
FIG. 38 is a cross-sectional view (1) for description of a manufacturing method for the solid-state image capturing element 100 according to the second modification of the seventh embodiment of the present disclosure.
Figure 39:
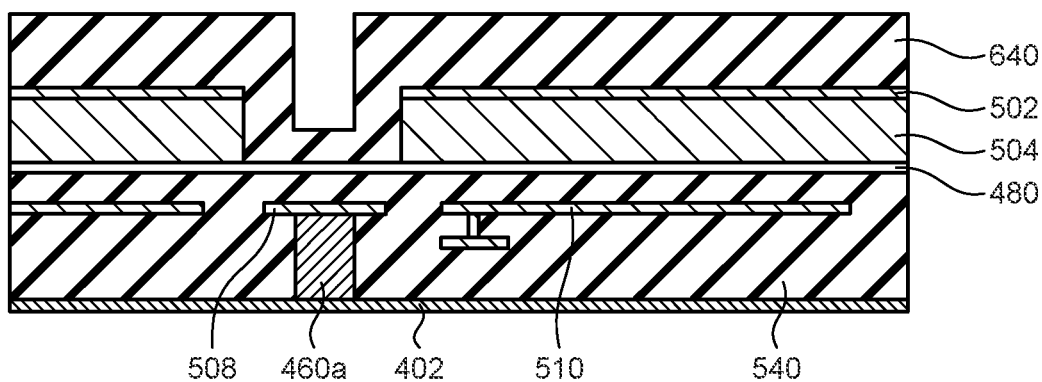
FIG. 39 is a cross-sectional view (2) for description of the manufacturing method for the solid-state image capturing element 100 according to the second modification of the seventh embodiment of the present disclosure.

In the present modification, after the processes illustrated in FIGS. 30 to 32, the insulating film 540, the transparent conductive layer 480, the photoelectric conversion film 504, the common electrode 502, and the organic film 150 are sequentially deposited on the reading electrode 508 and the accumulation electrode 510 as illustrated in FIG. 38. Subsequently, as illustrated in FIG. 39, a via penetrating through the common electrode 502 and the photoelectric conversion film 504 is formed for the penetration electrode 560a by photolithography and dry etching (specifically, etching to reach the surface of the transparent conductive layer 480), and the insulating film 640 is deposited to cover the sidewall of the via and the surface of the common electrode 502.

Figure 40:
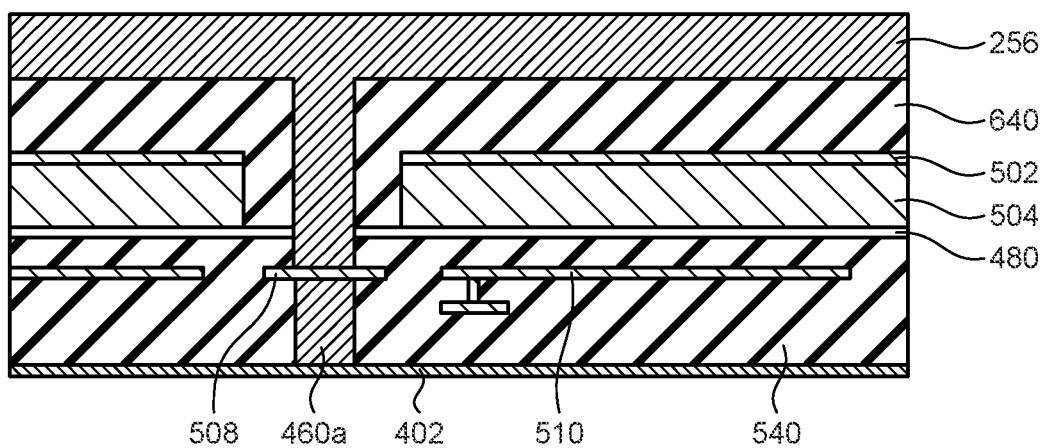
FIG. 40 is a cross-sectional view (3) for description of the manufacturing method for the solid-state image capturing element 100 according to the second modification of the seventh embodiment of the present disclosure.
Figure 41:
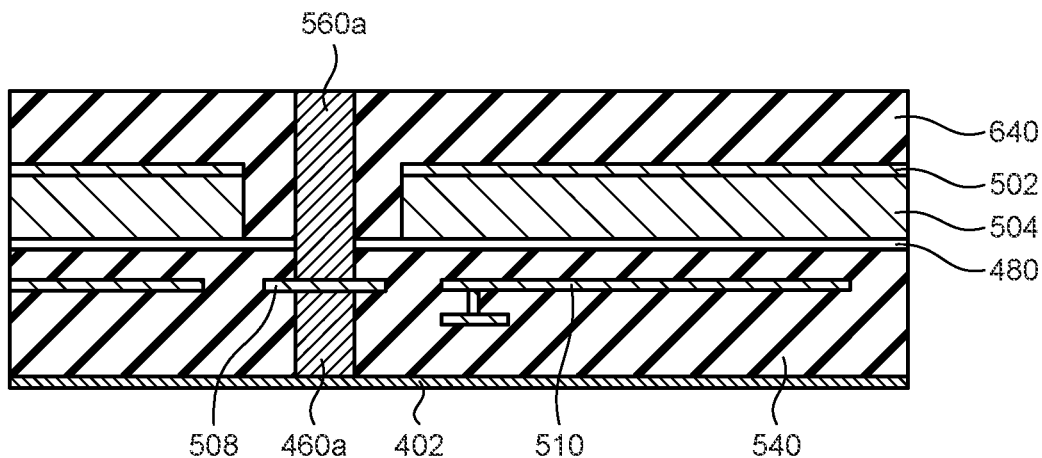
FIG. 41 is a cross-sectional view (4) for description of the manufacturing method for the solid-state image capturing element 100 according to the second modification of the seventh embodiment of the present disclosure.

Then, as illustrated in FIG. 40, the insulating film 640 deposited on the reading electrode 508 is removed by dry etching together with part of the transparent conductive layer 480, and a metal film 256 is deposited to embed the via. In addition, as illustrated in FIG. 41, the metal film 256 protruding from the above-described via is removed to form the penetration electrode 560a. Thereafter, the reading electrode 608, the accumulation electrode 610, the transparent conductive layer 580, the photoelectric conversion film 604, and the common electrode 602 are formed to obtain the pixel array part 10g as illustrated in FIG. 37.

Figure 42:
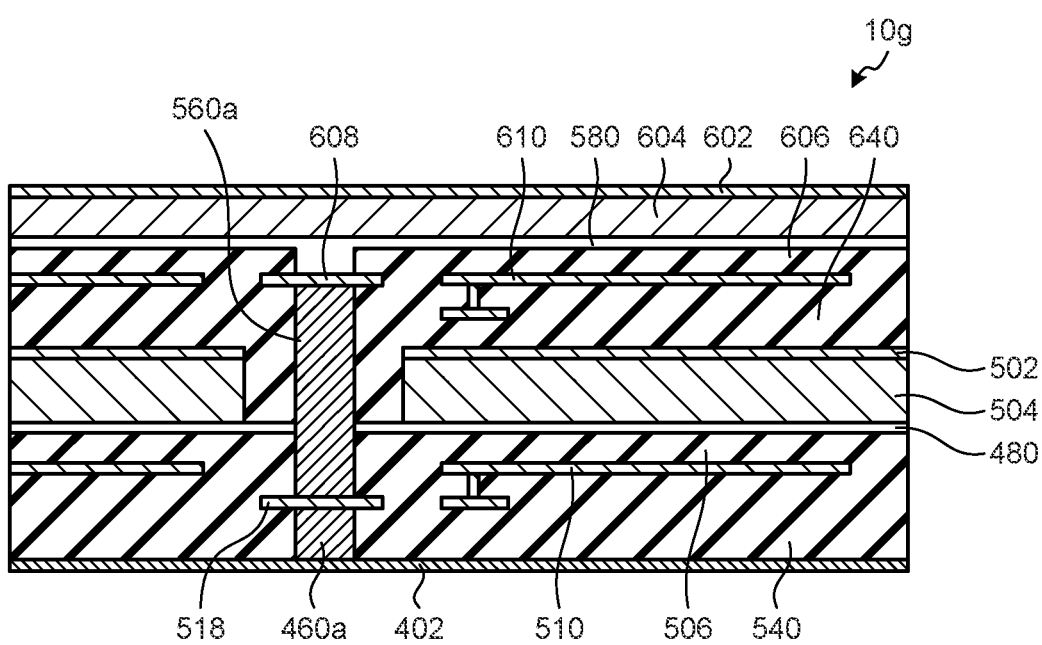
FIG. 42 is a cross-sectional view of the main part of the pixel array part 10g according to a third modification of the seventh embodiment of the present disclosure.

The present embodiment may be modified as illustrated in FIG. 42. A third modification of the exemplary structure of the present embodiment will be described with reference to FIG. 42. FIG. 42 is a cross-sectional view of the main part of the pixel array part 10g according to the third modification of the present embodiment. Specifically, in the present modification, a reading electrode 518 made of a metal film having low resistance is provided in place of the reading electrode 508. Thus, similarly to the above-described embodiment, a structure according to the present third modification illustrated in FIG. 42 not only can avoid reduction of the entrance surface but also can reduce connection resistance between the penetration electrode 560a and the penetration electrode 460a.

The following describes a manufacturing method for the solid-state image capturing element 100 according to the third modification of the present embodiment with reference to FIGS. 43 to 49. FIGS. 43 to 49 are cross-sectional views for description of the manufacturing method for the solid-state image capturing element 100 according to the third modification of the present embodiment, and only the main part of the present embodiment is illustrated in these drawings.

Figure 43:
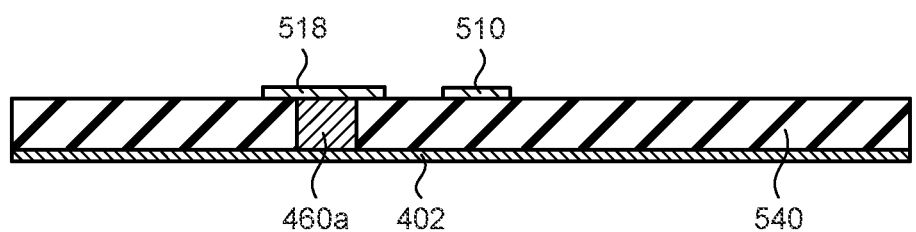
FIG. 43 is a cross-sectional view (1) for description of a manufacturing method for the solid-state image capturing element 100 according to the third modification of the seventh embodiment of the present disclosure.

First, similarly to the present embodiment, the insulating film 540 is deposited on the semiconductor substrate 300 (not illustrated) on which the antireflection film 402 is formed, and part of the accumulation electrode 510 is formed on the insulating film 540. In addition, a via penetrating through the insulating film 540 is formed for the penetration electrode 460a, and a metal film is deposited to embed the via, thereby forming the penetration electrode 460a. Then, as illustrated in FIG. 43, the reading electrode 518 made of a metal film is formed on the penetration electrode 460a by using photolithography and dry etching.

Figure 44:
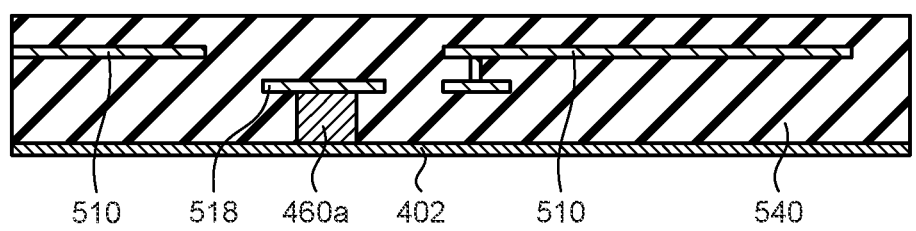
FIG. 44 is a cross-sectional view (2) for description of the manufacturing method for the solid-state image capturing element 100 according to the third modification of the seventh embodiment of the present disclosure.
Figure 45:
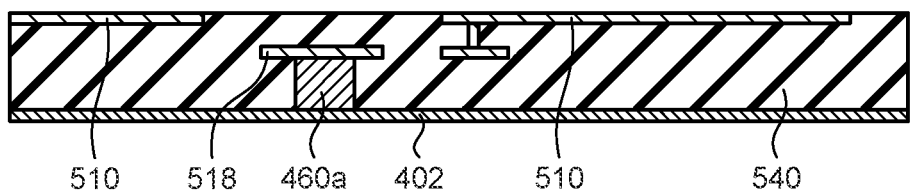
FIG. 45 is a cross-sectional view (3) for description of the manufacturing method for the solid-state image capturing element 100 according to the third modification of the seventh embodiment of the present disclosure.
Figure 46:
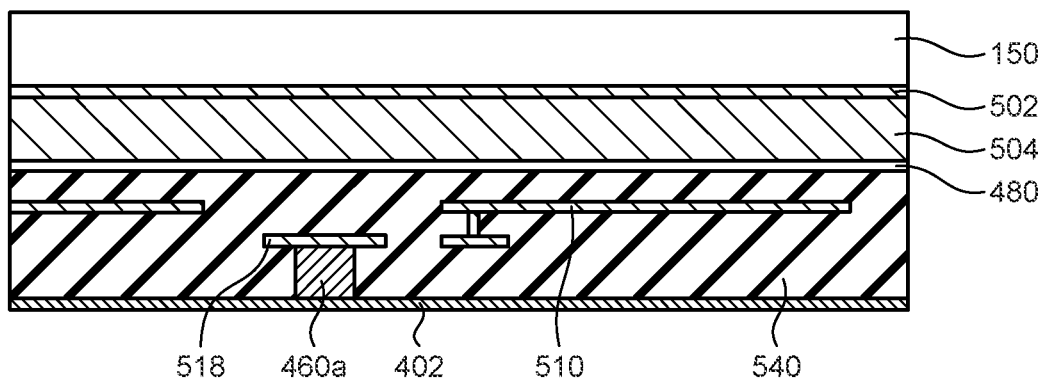
FIG. 46 is a cross-sectional view (4) for description of the manufacturing method for the solid-state image capturing element 100 according to the third modification of the seventh embodiment of the present disclosure.

Subsequently, as illustrated in FIG. 44, after the insulating film 540 is deposited, the accumulation electrode 510 is formed, and the insulating film 540 is further deposited thereon. In addition, as illustrated in FIG. 45, the CMP method is performed until the surface of the accumulation electrode 510 is exposed, thereby achieving flattening. Then, as illustrated in FIG. 46, the insulating film 540, the transparent conductive layer 480, the photoelectric conversion film 504, the common electrode 502, and the organic film 150 are sequentially deposited on the accumulation electrode 510.

Figure 47:
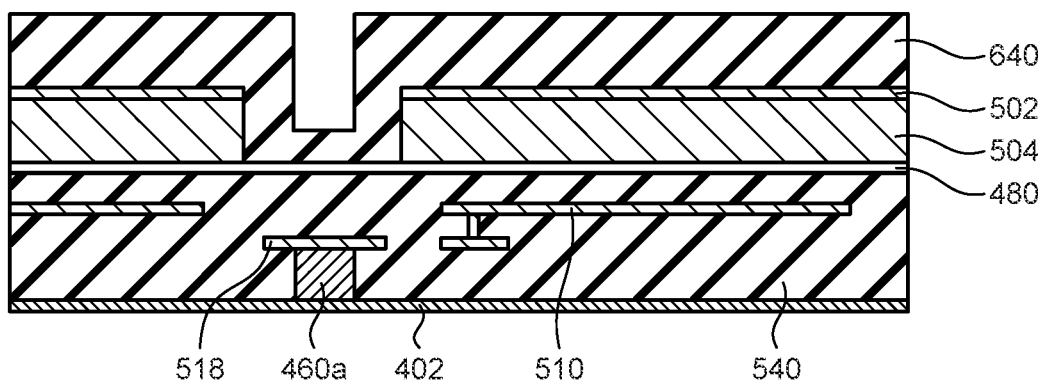
FIG. 47 is a cross-sectional view (5) for description of the manufacturing method for the solid-state image capturing element 100 according to the third modification of the seventh embodiment of the present disclosure.

Subsequently, as illustrated in FIG. 47, a via penetrating through the common electrode 502 and the photoelectric conversion film 504 is formed for the penetration electrode 560a by photolithography and dry etching (specifically, etching to reach the surface of the transparent conductive layer 480), and the insulating film 640 is deposited to cover the sidewall of the via and the surface of the common electrode 502.

Figure 48:
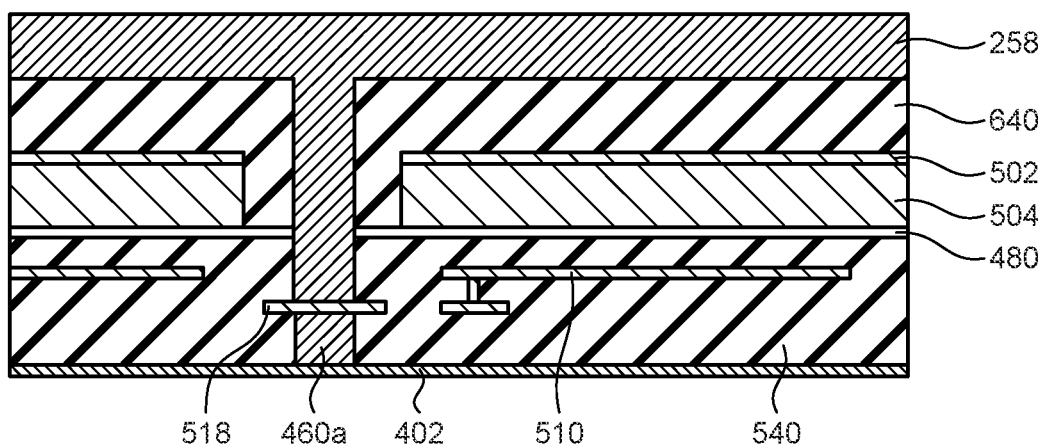
FIG. 48 is a cross-sectional view (6) for description of the manufacturing method for the solid-state image capturing element 100 according to the third modification of the seventh embodiment of the present disclosure.
Figure 49:
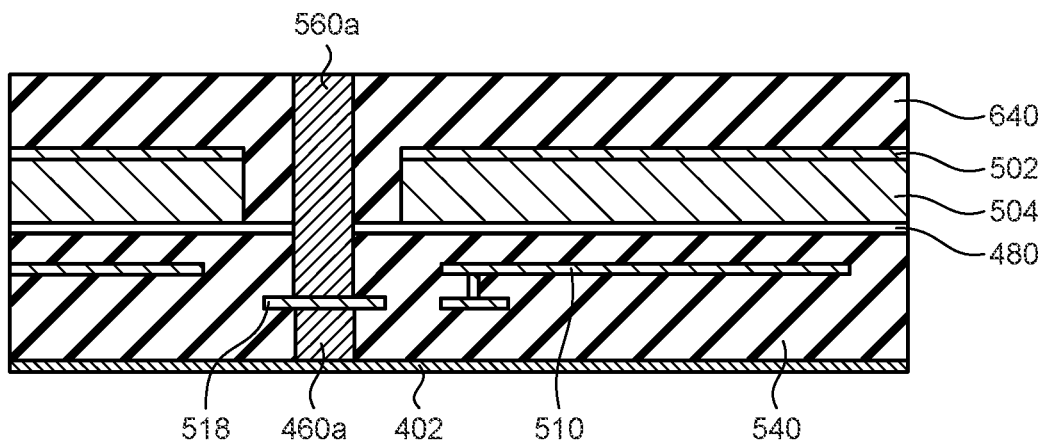
FIG. 49 is a cross-sectional view (7) for description of the manufacturing method for the solid-state image capturing element 100 according to the third modification of the seventh embodiment of the present disclosure.

Then, as illustrated in FIG. 48, the insulating film 640 deposited at the bottom of the above-described via is removed together with part of the transparent conductive layer 480, and a metal film 258 is deposited to embed the via. In addition, as illustrated in FIG. 49, the metal film 258 protruding from the above-described via is removed to form the penetration electrode 560a. Thereafter, the reading electrode 608, the accumulation electrode 610, the transparent conductive layer 580, the photoelectric conversion film 604, and the common electrode 602 are formed to obtain the pixel array part 10g as illustrated in FIG. 42.

Figure 50:
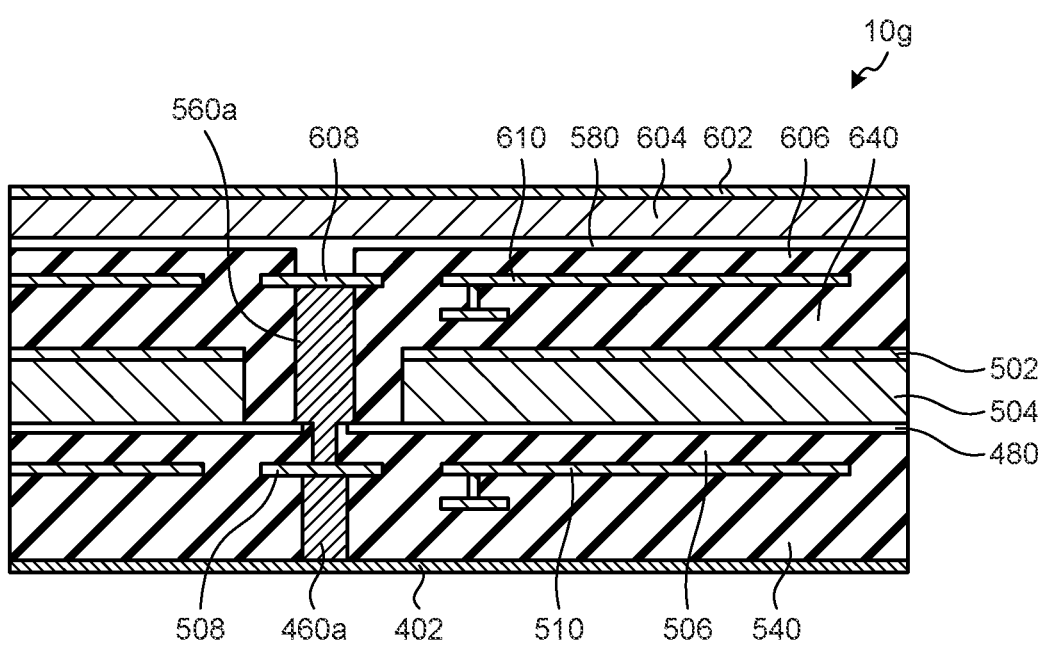
FIG. 50 is a cross-sectional view of the main part of the pixel array part 10g according to a fourth modification of the seventh embodiment of the present disclosure.

The present embodiment may be modified as illustrated in FIG. 50. A fourth modification of the exemplary structure of the present embodiment will be described with reference to FIG. 50. FIG. 50 is a cross-sectional view of the main part of the pixel array part 10g according to the fourth modification of the present embodiment. Specifically, in the present modification, the penetration electrode 560a has a narrow lower end, and the lower end is electrically connected with the penetration electrode 460a through the reading electrode 508. Similarly to the above-described embodiment, a structure according to the present fourth modification illustrated in FIG. 50 can avoid reduction of the entrance surface.

The following describes a manufacturing method for the solid-state image capturing element 100 according to the fourth modification of the present embodiment with reference to FIGS. 51 to 56. FIGS. 51 to 56 are cross-sectional views for description of the manufacturing method for the solid-state image capturing element 100 according to the fourth modification of the present embodiment, and only the main part of the present embodiment is illustrated in these drawings. Note that the above description of FIGS. 30 to 32 in the first modification and the above description of FIG. 38 in the second modification are common to the manufacturing method of the present fourth modification, and thus description of any common part is omitted.

Figure 51:
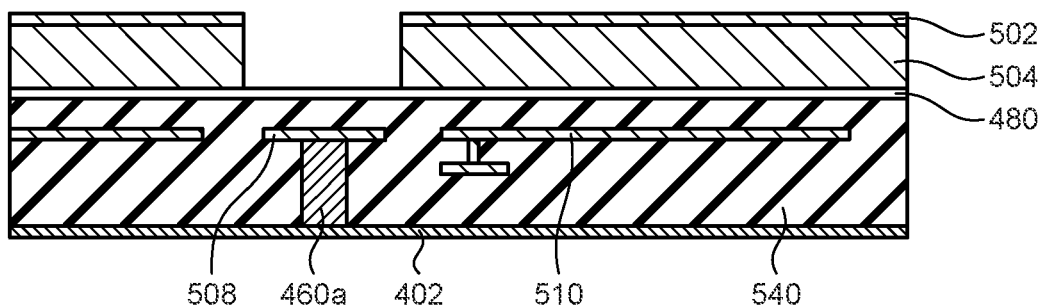
FIG. 51 is a cross-sectional view (1) for description of a manufacturing method for the solid-state image capturing element 100 according to the fourth modification of the seventh embodiment of the present disclosure.

In the present modification, after the processes illustrated in FIGS. 30 to 32 and the process illustrated in FIG. 38, a via penetrating through the common electrode 502 and the photoelectric conversion film 504 is formed for the penetration electrode 560a by photolithography and dry etching (specifically, etching to reach the surface of the transparent conductive layer 480) as illustrated in FIG. 51.

Figure 52:
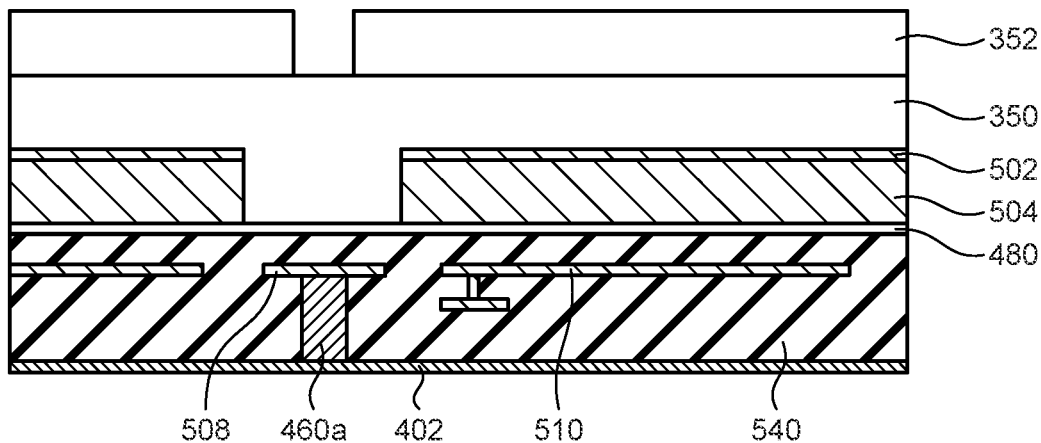
FIG. 52 is a cross-sectional view (2) for description of the manufacturing method for the solid-state image capturing element 100 according to the fourth modification of the seventh embodiment of the present disclosure.
Figure 53:
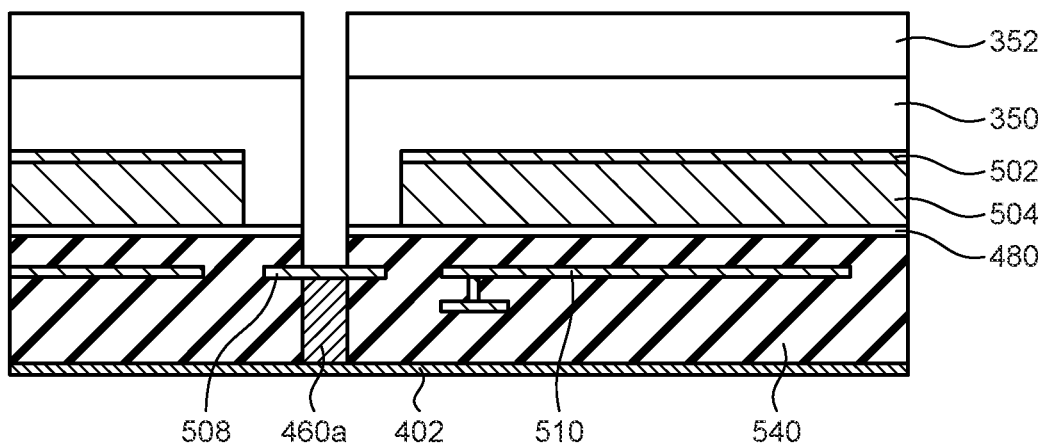
FIG. 53 is a cross-sectional view (3) for description of the manufacturing method for the solid-state image capturing element 100 according to the fourth modification of the seventh embodiment of the present disclosure.

Subsequently, as illustrated in FIG. 52, the formed via is embedded, an organic film 350 is formed on the common electrode 502, the surface thereof is flattened, and a patterned photoresist 352 is formed on the flattened surface. Then, as illustrated in FIG. 53, a via penetrating through the organic film 350, the transparent conductive layer 480, and the insulating film 540 is formed in accordance with the patterned photoresist 352 by using dry etching.

Figure 54:
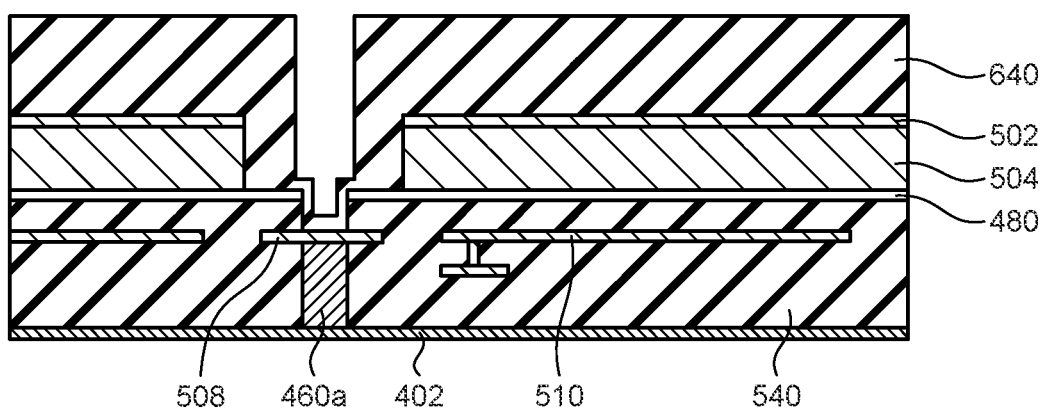
FIG. 54 is a cross-sectional view (4) for description of the manufacturing method for the solid-state image capturing element 100 according to the fourth modification of the seventh embodiment of the present disclosure.
Figure 55:
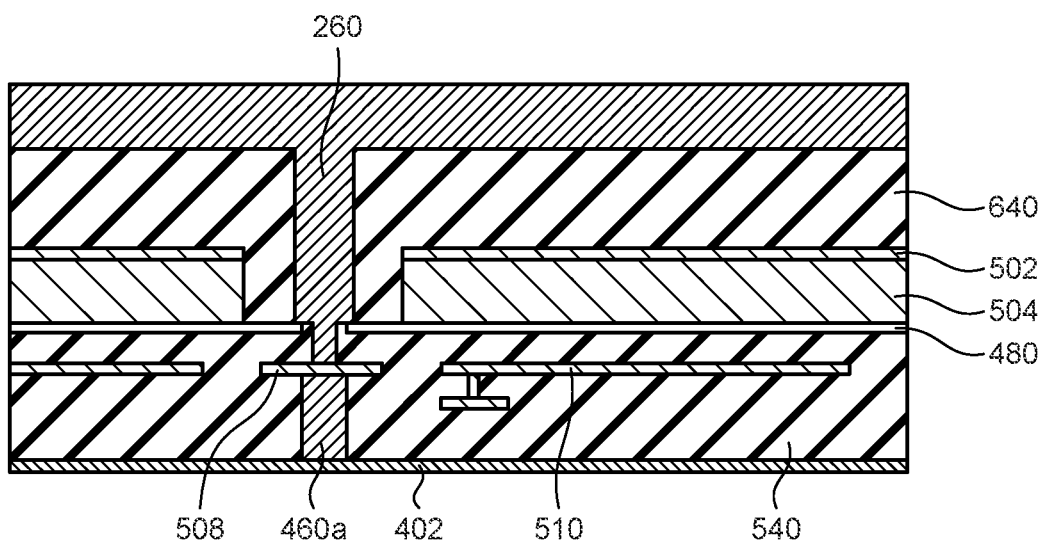
FIG. 55 is a cross-sectional view (5) for description of the manufacturing method for the solid-state image capturing element 100 according to the fourth modification of the seventh embodiment of the present disclosure.
Figure 56:
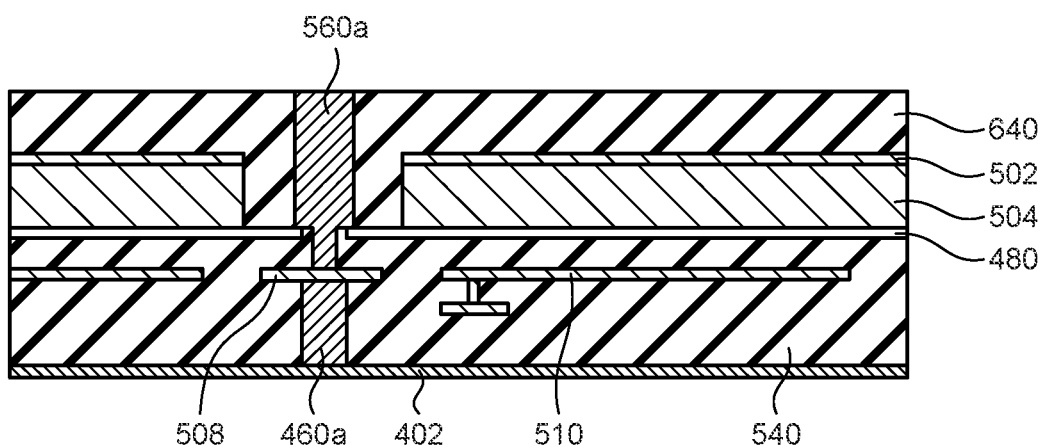
FIG. 56 is a cross-sectional view (6) for description of the manufacturing method for the solid-state image capturing element 100 according to the fourth modification of the seventh embodiment of the present disclosure.

Subsequently, as illustrated in FIG. 54, after the photoresist 352 and the organic film 350 are removed, the insulating film 640 is deposited to cover the surface of the reading electrode 508, the sidewall of the via, and the surface of the common electrode 502. Then, as illustrated in FIG. 55, the insulating film 640 deposited at the bottom of the above-described via is removed by dry etching, and a metal film 260 is deposited to embed the via. In addition, as illustrated in FIG. 56, the metal film 260 protruding from the above-described via is removed to form the penetration electrode 560a. Thereafter, the reading electrode 608, the accumulation electrode 610, the transparent conductive layer 580, the photoelectric conversion film 604, and the common electrode 602 are formed to obtain the pixel array part 10g as illustrated in FIG. 50.

Figure 57:
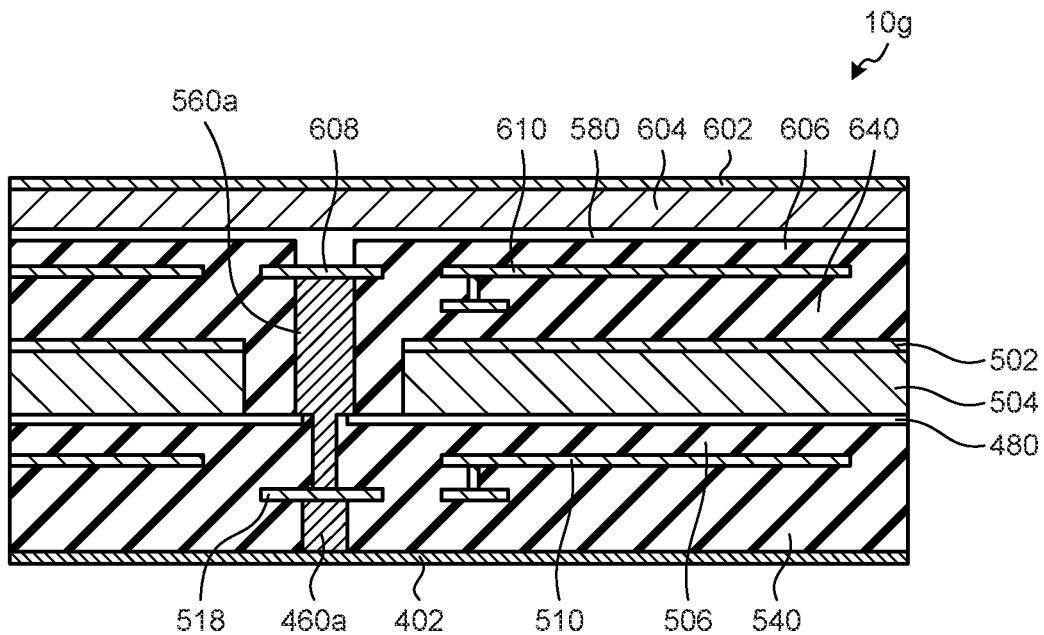
FIG. 57 is a cross-sectional view of the main part of the pixel array part 10g according to a fifth modification of the seventh embodiment of the present disclosure.

The present embodiment may be modified as illustrated in FIG. 57. A fifth modification of the exemplary structure of the present embodiment will be described with reference to FIG. 57. FIG. 57 is a cross-sectional view of the main part of the pixel array part 10g according to the fifth modification of the present embodiment. Specifically, in the present modification, the penetration electrode 560a has a narrow lower end, and the lower end is electrically connected with the penetration electrode 460a through the reading electrode 518 made of a metal film having low resistance. Similarly to the above-described embodiment, a structure according to the present fifth modification illustrated in FIG. 57 can avoid reduction of the entrance surface.

The following describes a manufacturing method for the solid-state image capturing element 100 according to the fifth modification of the present embodiment with reference to FIGS. 58 to 61. FIGS. 58 to 61 are cross-sectional views for description of the manufacturing method for the solid-state image capturing element 100 according to the fifth modification of the present embodiment, and only the main part of the present embodiment is illustrated in these drawings. Note that the above description of FIGS. 43 to 46 in the third modification is common to the manufacturing method of the present fifth modification, and thus description of any common part is omitted.

Figure 58:
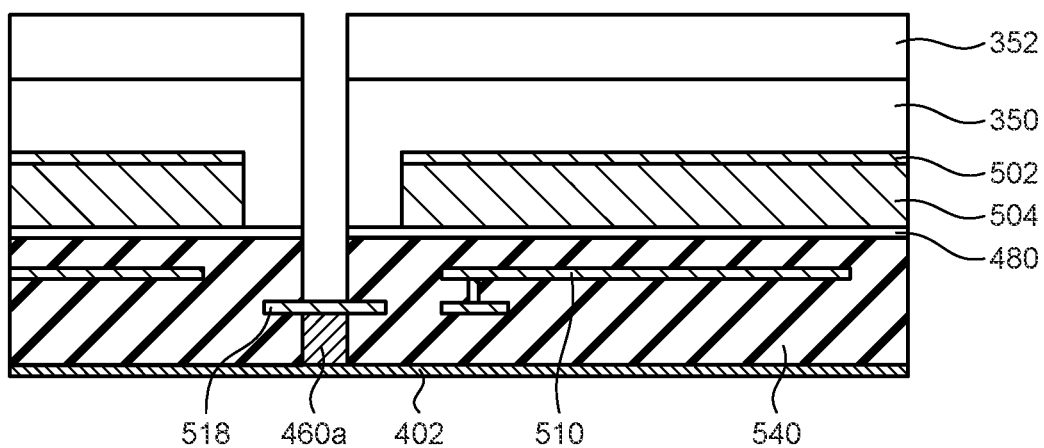
FIG. 58 is a cross-sectional view (1) for description of a manufacturing method for the solid-state image capturing element 100 according to the fifth modification of the seventh embodiment of the present disclosure.

In the present modification, after the processes illustrated in FIGS. 43 to 46, a via penetrating through the common electrode 502 and the photoelectric conversion film 504 is formed for the penetration electrode 560a by photolithography and dry etching (specifically, etching to reach the surface of the transparent conductive layer 480). Then, the formed via is embedded, the organic film 350 is formed on the common electrode 502, the surface thereof is flattened, and the patterned photoresist 352 is formed on the flattened surface. Then, as illustrated in FIG. 58, a via penetrating through the organic film 350, the transparent conductive layer 480, and the insulating film 540 is formed in accordance with the patterned photoresist 352.

Figure 59:
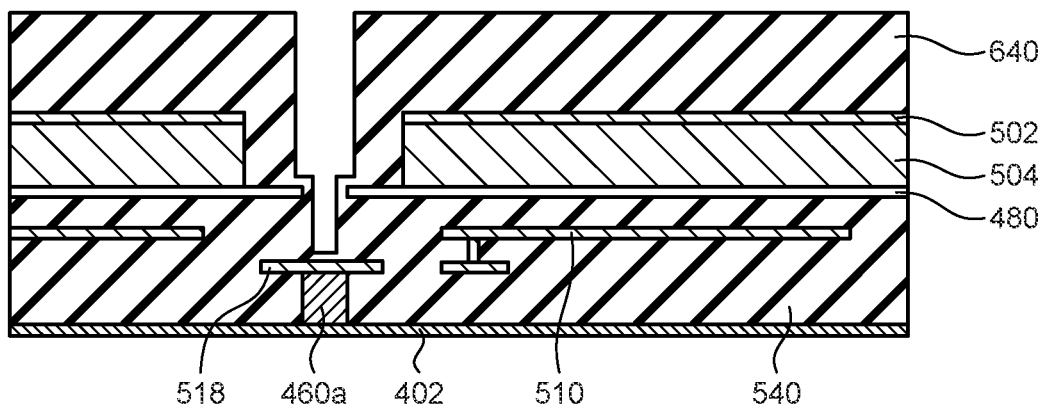
FIG. 59 is a cross-sectional view (2) for description of the manufacturing method for the solid-state image capturing element 100 according to the fifth modification of the seventh embodiment of the present disclosure.
Figure 60:
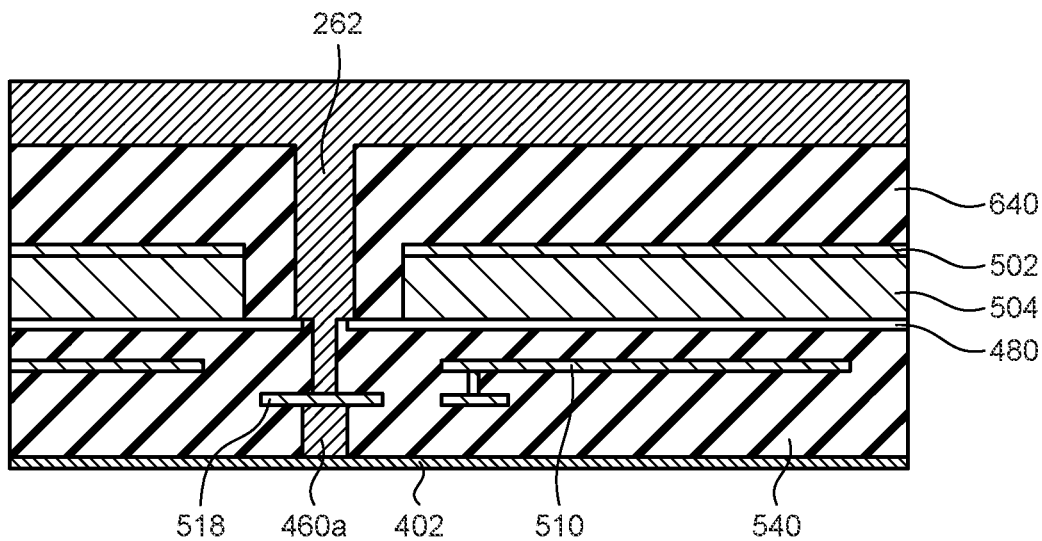
FIG. 60 is a cross-sectional view (3) for description of the manufacturing method for the solid-state image capturing element 100 according to the fifth modification of the seventh embodiment of the present disclosure.
Figure 61:
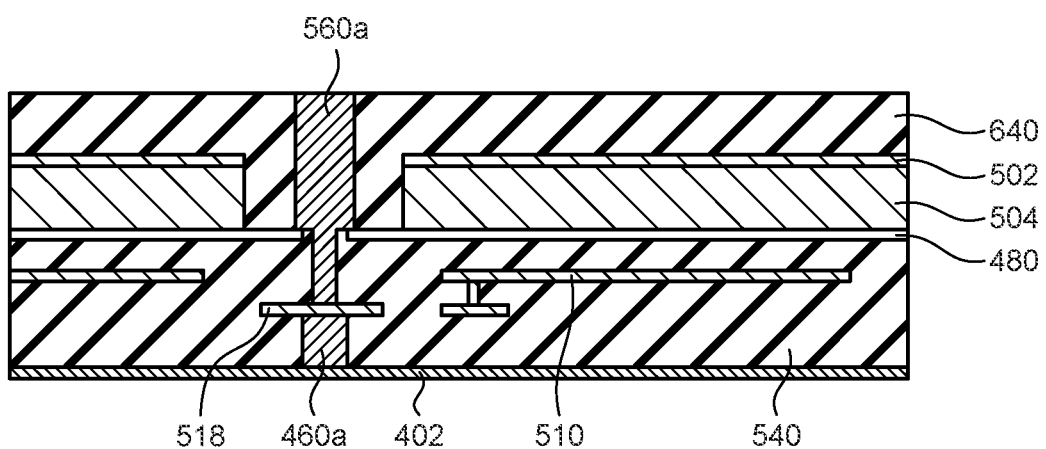
FIG. 61 is a cross-sectional view (4) for description of the manufacturing method for the solid-state image capturing element 100 according to the fifth modification of the seventh embodiment of the present disclosure.

Subsequently, as illustrated in FIG. 59, after the photoresist 352 and the organic film 350 are removed, the insulating film 640 is deposited to cover the surface of the reading electrode 518, the sidewall of the via, and the surface of the common electrode 502. Then, as illustrated in FIG. 60, the insulating film 640 deposited at the bottom of the above-described via is removed by dry etching, and a metal film 262 is deposited to embed the via. In addition, as illustrated in FIG. 61, the metal film 262 protruding from the above-described via is removed to form the penetration electrode 560a. Thereafter, the reading electrode 608, the accumulation electrode 610, the transparent conductive layer 580, the photoelectric conversion film 604, and the common electrode 602 are formed to obtain the pixel array part 10g as illustrated in FIG. 57.

9. Exemplary Application to Endoscope Operation System

The technology (present technology) of the present disclosure is applicable to various products. For example, the technology of the present disclosure may be applied to an endoscope operation system.

Figure 62:
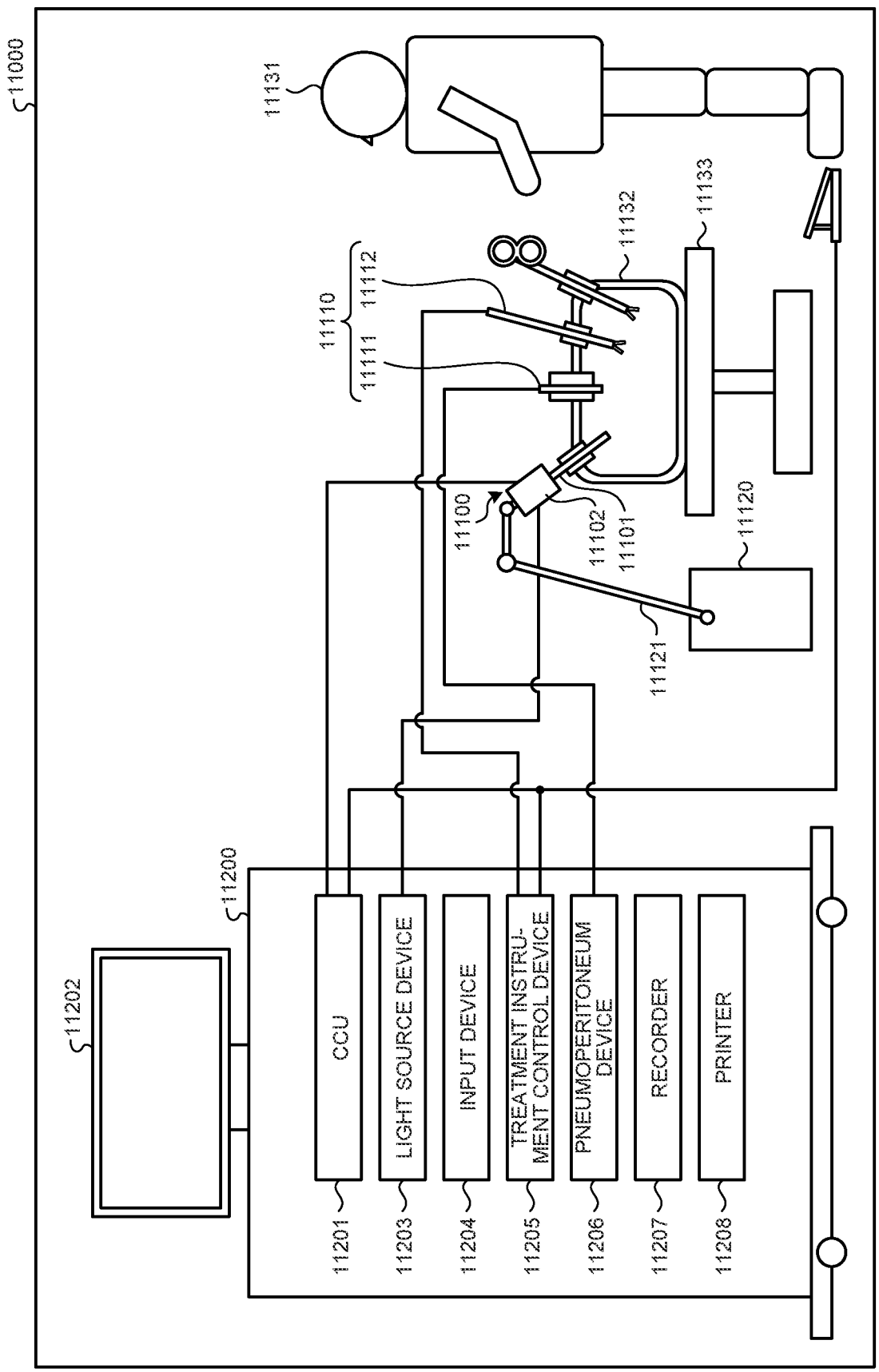
FIG. 62 is a diagram illustrating an exemplary schematic configuration of an endoscope operation system.

FIG. 62 is a diagram illustrating an exemplary schematic configuration of an endoscope operation system to which the technology (present technology) of the present disclosure is applicable.

FIG. 62 illustrates a situation in which an operator (doctor) 11131 performs a medical operation on a patient 11132 on a patient bed 11133 by using this endoscope operation system 11000. As illustrated in FIG. 62, the endoscope operation system 11000 includes an endoscope 11100, other operation instruments 11110 such as a pneumoperitoneum tube 11111 and an energy treatment instrument 11112, a support arm device 11120 supporting the endoscope 11100, and a cart 11200 on which various devices for an endoscopic medical operation are mounted.

The endoscope 11100 includes a lens barrel 11101, a region of which extending from the leading end by a predetermined length is inserted into the body cavity of the patient 11132, and a camera head 11102 connected with the base end of the lens barrel 11101. In the illustrated example, the endoscope 11100 is configured as what is called a rigid scope including the lens barrel 11101 that is rigid, but the endoscope 11100 may be configured as what is called a flexible scope including a flexible lens barrel.

An opening to which an objective lens is fitted is provided at the leading end of the lens barrel 11101. A light source device 11203 is connected with the endoscope 11100, and light generated by the light source device 11203 is guided to the leading end of the lens barrel 11101 by a light guide extending inside the lens barrel 11101 and is emitted toward an observation target in the body cavity of the patient 11132 through the objective lens. Note that the endoscope 11100 may be a direct-view scope, an oblique-view scope, or a side-view scope.

An optical system and an image capturing element are provided inside the camera head 11102, and reflected light (observation light) from the observation target is condensed onto the image capturing element through the optical system. The observation light is photoelectrically converted by the image capturing element, and an electric signal corresponding to the observation light, in other words, an image signal corresponding to an observation image is generated. The image signal is transmitted to a camera control unit (CCU) 11201 as RAW data.

The CCU 11201 includes a central processing unit (CPU) and a graphics processing unit (GPU), and collectively controls operation of the endoscope 11100 and a display device 11202. In addition, the CCU 11201 receives the image signal from the camera head 11102 and provides the image signal with various image processing, such as image development processing (demosaic processing), for displaying an image based on the image signal.

The display device 11202 displays, under control of the CCU 11201, an image based on the image signal provided with the image processing by the CCU 11201.

The light source device 11203 includes a light source such as a light emitting diode (LED) and supplies, to the endoscope 11100, irradiation light for image capturing of an operation site or the like.

An input device 11204 is an input interface for the endoscope operation system 11000. A user can input various kinds of information and instructions to the endoscope operation system 11000 through the input device 11204. For example, the user inputs an instruction to change image capturing conditions (such as irradiation light kind, magnification, and focal length) of the endoscope 11100.

A treatment instrument control device 11205 controls drive of the energy treatment instrument 11112 for tissue cauterization, incision, blood vessel sealing, or the like. A pneumoperitoneum device 11206 feeds gas into the body cavity through the pneumoperitoneum tube 11111 so that the body cavity of the patient 11132 is inflated to obtain a visual field of the endoscope 11100 and a work space for an operator. A recorder 11207 is a device capable of recording various kinds of information related to the medical operation. A printer 11208 is a device capable of printing various kinds of information related to the medical operation in various formats of text, image, graph, and the like.

Note that the light source device 11203 that supplies irradiation light for image capturing of an operation site to the endoscope 11100 may be achieved by a white light source configured as, for example, an LED, a laser beam source, or a combination thereof. When the white light source is configured as a combination of RGB laser beam sources, the output intensity and output timing of each color (wavelength) can be highly accurately controlled, and thus the white balance of a captured image can be adjusted at the light source device 11203. In addition, in this case, an image corresponding to each of RGB can be captured in a time divisional manner by irradiating an observation target with laser beams from the respective RGB laser beam sources in a time divisional manner and controlling drive of the image capturing elements of the camera head 11102 in synchronization with the timings of irradiation. With this method, a color image can be obtained without providing color filters to the image capturing elements.

In addition, drive of the light source device 11203 may be controlled so that the intensity of output light is changed in every predetermined time. Drive of the image capturing elements of the camera head 11102 is controlled in synchronization with the timing of the light intensity change to acquire images in a time divisional manner. The images can be synthesized to generate a high dynamic range image without what are called underexposure and overexposure.

The light source device 11203 may be capable of supplying light in a predetermined wavelength band for special light observation. In the special light observation, for example, what is called narrow band light observation (narrow band imaging) is performed in which an image of a predetermined tissue such as a blood vessel on the surface layer of mucous membrane is captured at high contrast through irradiation with light in a band narrower than the band of irradiation light (in other words, white light) in normal observation by using the wavelength dependency of light absorption in a body tissue. Alternatively, in the special light observation, fluorescence observation may be performed in which an image is obtained by using fluorescence generated through irradiation with excitation light. In the fluorescence observation, for example, a body tissue is irradiated with excitation light to observe fluorescence from the body tissue (self-fluorescence observation), or a reagent such as indocyanine green (ICG) is locally injected into a body tissue and the body tissue is irradiated with excitation light corresponding to the fluorescence wavelength of the reagent to obtain a fluorescence image. The light source device 11203 may be capable of supplying the narrow band light and/or excitation light corresponding to such special light observation.

Figure 63:
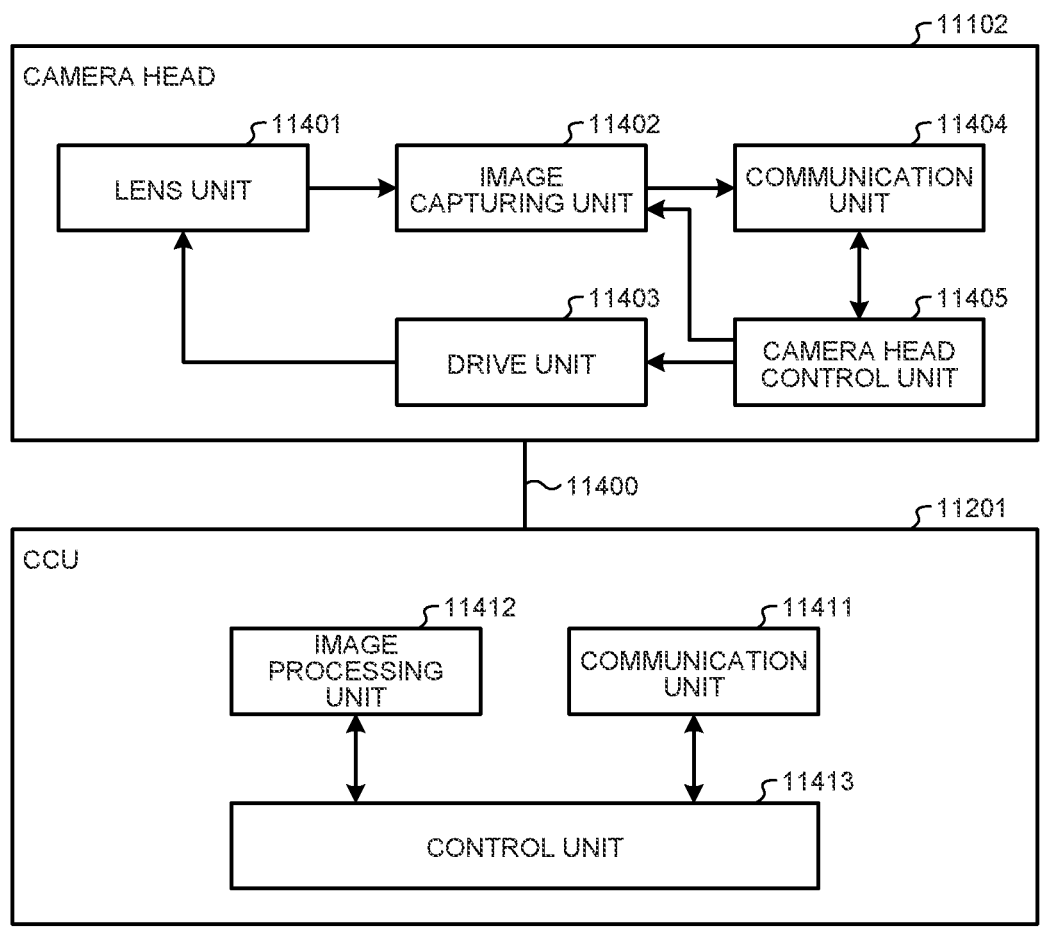
FIG. 63 is a block diagram illustrating exemplary functional configurations of a camera head and a CCU.

FIG. 63 is a block diagram illustrating exemplary functional configurations of the camera head 11102 and the CCU 11201 illustrated in FIG. 62.

The camera head 11102 includes a lens unit 11401, an image capturing unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected with each other through a transmission cable 11400 to perform communication therebetween.

The lens unit 11401 is an optical system provided at a connection part with the lens barrel 11101. The observation light acquired from the leading end of the lens barrel 11101 is guided to the camera head 11102 and incident on the lens unit 11401. The lens unit 11401 is formed by combining a plurality of lenses including a zoom lens and a focus lens.

The image capturing unit 11402 includes an image capturing element. The image capturing unit 11402 may include one image capturing element (what is called a single-plate configuration) or a plurality of image capturing elements (what is called a multiple-plate configuration). When the image capturing unit 11402 has the multiple-plate configuration, for example, image signals corresponding to RGB may be generated by the respective image capturing elements and synthesized to obtain a color image. Alternatively, the image capturing unit 11402 may include a pair of image capturing elements for acquiring right-eye and left-eye image signals, respectively, for three-dimensional (3D) display. When 3D display is performed, the operator 11131 can more accurately understand the depth of a living body tissue at an operation site. Note that when the image capturing unit 11402 has the multiple-plate configuration, a plurality of lens units 11401 are provided for the respective image capturing elements.

The image capturing unit 11402 does not necessarily need to be provided to the camera head 11102. For example, the image capturing unit 11402 may be provided right after the objective lens inside the lens barrel 11101.

The drive unit 11403 is achieved by an actuator and moves each of the zoom and focus lenses of the lens unit 11401 along the optical axis by a predetermined distance under control of the camera head control unit 11405. Accordingly, the magnification and focal point of an image captured by the image capturing unit 11402 can be adjusted as appropriate.

The communication unit 11404 is achieved by a communication device for communicating various kinds of information with the CCU 11201. The communication unit 11404 transmits an image signal acquired from the image capturing unit 11402 to the CCU 11201 through the transmission cable 11400 as RAW data.

The communication unit 11404 receives a control signal for controlling drive of the camera head 11102 from the CCU 11201, and supplies the control signal to the camera head control unit 11405. The control signal includes information related to image capturing conditions, such as information on specification of the frame rate of a captured image, information on specification of an exposure value at image capturing, and/or information on specification of the magnification and focal point of the captured image.

Note that the above-described image capturing conditions such as the frame rate, the exposure value, the magnification, and the focal point may be specified by the user as appropriate or may be automatically set by the control unit 11413 of the CCU 11201 based on the acquired image signal. In the latter case, the endoscope 11100 has what are called an auto exposure (AE) function, an auto focus (AF) function, and an auto white balance (AWB) function.

The camera head control unit 11405 controls drive of the camera head 11102 based on the control signal received from the CCU 11201 through the communication unit 11404.

The communication unit 11411 is achieved by a communication device for communicating various kinds of information with the camera head 11102. The communication unit 11411 receives an image signal transmitted from the camera head 11102 through the transmission cable 11400.

The communication unit 11411 transmits a control signal for controlling drive of the camera head 11102 to the camera head 11102. The image signal and the control signal may be transmitted by electrical communication, optical communication, and the like.

The image processing unit 11412 performs various kinds of image processing on an image signal as RAW data transmitted from the camera head 11102.

The control unit 11413 performs various kinds of control related to image capturing of an operation site or the like by the endoscope 11100 and display of a captured image obtained through image capturing of an operation site or the like. For example, the control unit 11413 generates a control signal for controlling drive of the camera head 11102.

In addition, the control unit 11413 causes the display device 11202 to display a captured image of an operation site or the like based on the image signal on which the image processing is performed by the image processing unit 11412. In this case, the control unit 11413 may recognize various objects in the captured image by using various image recognition technologies. For example, the control unit 11413 detects the edge shape, color, and the like of each object included in the captured image to recognize for example, an operation instrument such as forceps, a particular living body site, bleeding, and mist when the energy treatment instrument 11112 is used. When causing the display device 11202 to display the captured image, the control unit 11413 uses a result of the recognition to display various kinds of operation support information on the image of the operation site in a superimposing manner. When the operation support information is displayed in a superimposing manner and presented to the operator 11131, a load on the operator 11131 can be reduced, and the operator 11131 can reliably perform a medical operation.

The transmission cable 11400 connecting the camera head 11102 and the CCU 11201 is an electric signal cable compatible with electric signal communication, an optical fiber compatible with optical communication, or a composite cable thereof.

In the illustrated example, communication is performed in a wired manner by using the transmission cable 11400, but communication between the camera head 11102 and the CCU 11201 may be performed in a wireless manner.

The above description is made on an examples of the endoscope operation system to which the technology of the present disclosure is applicable. The technology of the present disclosure is applicable to, for example, the endoscope 11100, the camera head 11102 (the image capturing unit 11402 thereof), and the CCU 11201 (the image processing unit 11412 thereof) among the above-described components.

Note that the above description is made on an example of an endoscope operation system, but the technology of the present disclosure may be applied to, for example, a microscope operation system.

10. Exemplary Application to Moving Object

The technology (present technology) of the present disclosure is applicable to various products. For example, the technology of the present disclosure may be achieved as a device mounted on any kind of a moving object such as an automobile, an electric vehicle, a hybrid electric vehicle, an automatic two-wheel vehicle, a bicycle, a personal mobility, an airplane, a drone, a ship, or a robot.

Figure 64:
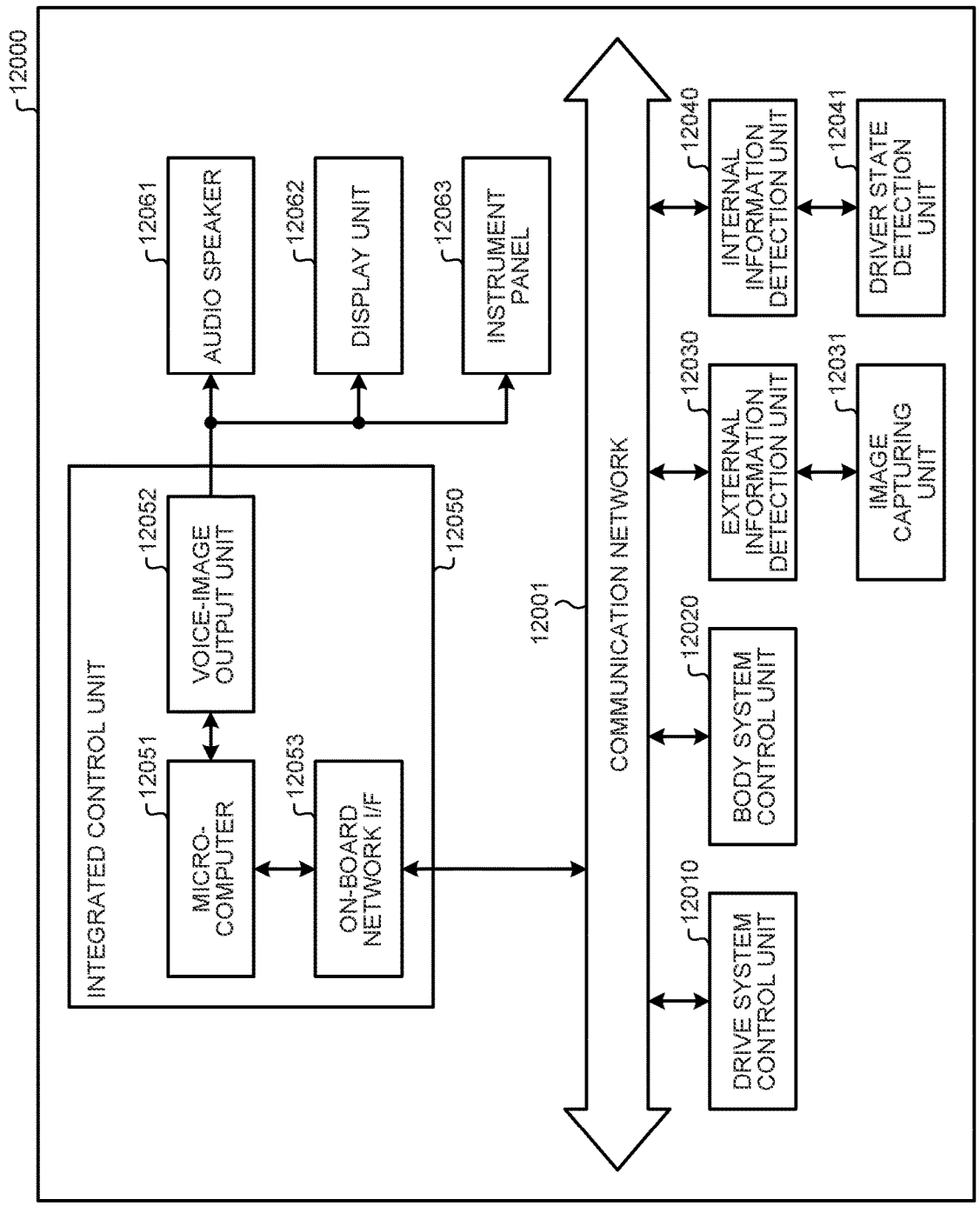
FIG. 64 is a block diagram illustrating an exemplary schematic configuration of a vehicle control system.

FIG. 64 is a block diagram illustrating an exemplary schematic configuration of a vehicle control system as an exemplary moving object control system to which the technology of the present disclosure is applicable.

This vehicle control system 12000 includes a plurality of electronic control units connected with each other through a communication network 12001. In the example illustrated in FIG. 64, the vehicle control system 12000 includes a drive system control unit 12010, a body system control unit 12020, an external information detection unit 12030, an internal information detection unit 12040, and an integrated control unit 12050. In addition, a microcomputer 12051, a voice-image output unit 12052, and an on-board network I/F (interface) 12053 are illustrated as a functional configuration of the integrated control unit 12050.

The drive system control unit 12010 controls operation of devices related to a drive system of a vehicle in accordance with various computer programs. For example, the drive system control unit 12010 functions as a control device for a drive power generation device, such as an internal combustion engine or a drive motor, for generating drive power of the vehicle, a drive power transmission mechanism for transferring the drive power to wheels, a steering mechanism configured to adjust the rudder angle of the vehicle, a braking device configured to generate braking force of the vehicle, and the like.

The body system control unit 12020 controls operation of various devices installed on a vehicle body in accordance with various computer programs. For example, the body system control unit 12020 functions as a control device for a keyless entry system, a smart key system, a power window device, and various lamps such as a head lamp, a rear lamp, a brake lamp, an indicator, and a fog lamp. In this case, the body system control unit 12020 can receive radio wave transmitted from a portable device serving as a key, or various switch signals. The body system control unit 12020 receives input of the radio wave or signals and controls a door lock device, a power window device, a lamp, and the like of the vehicle.

The external information detection unit 12030 detects information on the outside of the vehicle on which the vehicle control system 12000 is mounted. For example, the external information detection unit 12030 is connected with an image capturing unit 12031. The external information detection unit 12030 causes the image capturing unit 12031 to capture an external image and receives the captured image. The external information detection unit 12030 may perform, based on the received image, object detection processing or distance detection processing for a person, a car, an obstacle, a sign, a character on a road surface, and the like.

The image capturing unit 12031 is a light sensor configured to receive light and output an electric signal in accordance with the received-light quantity of the light. The image capturing unit 12031 may output the electric signal as an image or may output the electric signal as distance measurement information. Light received by the image capturing unit 12031 may be visible light or invisible light such as infrared.

The internal information detection unit 12040 detects internal information. The internal information detection unit 12040 is connected with, for example, a driver state detection unit 12041 configured to detect the state of a driver. The driver state detection unit 12041 includes a camera configured to capture an image of the driver, for example, and the internal information detection unit 12040 may calculate the degree of fatigue or concentration of the driver or determine whether the driver is dozing based on detection information input from the driver state detection unit 12041.

The microcomputer 12051 can calculate a control target value of the drive power generation device, the steering mechanism, or the braking device based on the internal and external information acquired by the external information detection unit 12030 and the internal information detection unit 12040, and can output a control command to the drive system control unit 12010. For example, the microcomputer 12051 can perform cooperative control to achieve functions of an advanced driver assistance system (ADAS) including collision avoidance or impact reduction of the vehicle, follow travel based on inter-vehicular distance, vehicle speed maintaining travel, warning for collision of the vehicle, warning for lane deviation of the vehicle, or the like.

The microcomputer 12051 can perform cooperative control for, for example, automated driving of autonomously traveling independently from operation by the driver by controlling the drive power generation device, the steering mechanism, the braking device, and the like based on information on surroundings of the vehicle, which is acquired by the external information detection unit 12030 and the internal information detection unit 12040.

The microcomputer 12051 can output a control command to the body system control unit 12020 based on the external information acquired by the external information detection unit 12030. For example, the microcomputer 12051 can control the head lamp in accordance with the position of a preceding vehicle or oncoming vehicle sensed by the external information detection unit 12030, and can perform cooperative control to achieve dimming such as switching from high beam to low beam.

The voice-image output unit 12052 transmits an output signal of at least one of voice and image to an output device capable of visually or audibly giving notification of information to a person on board the vehicle or the outside. In the example of FIG. 64, an audio speaker 12061, a display unit 12062, and an instrument panel 12063 are exemplarily illustrated as the output device. The display unit 12062 may include, for example, at least one of an on-board display and a head-up display.

Figure 65:
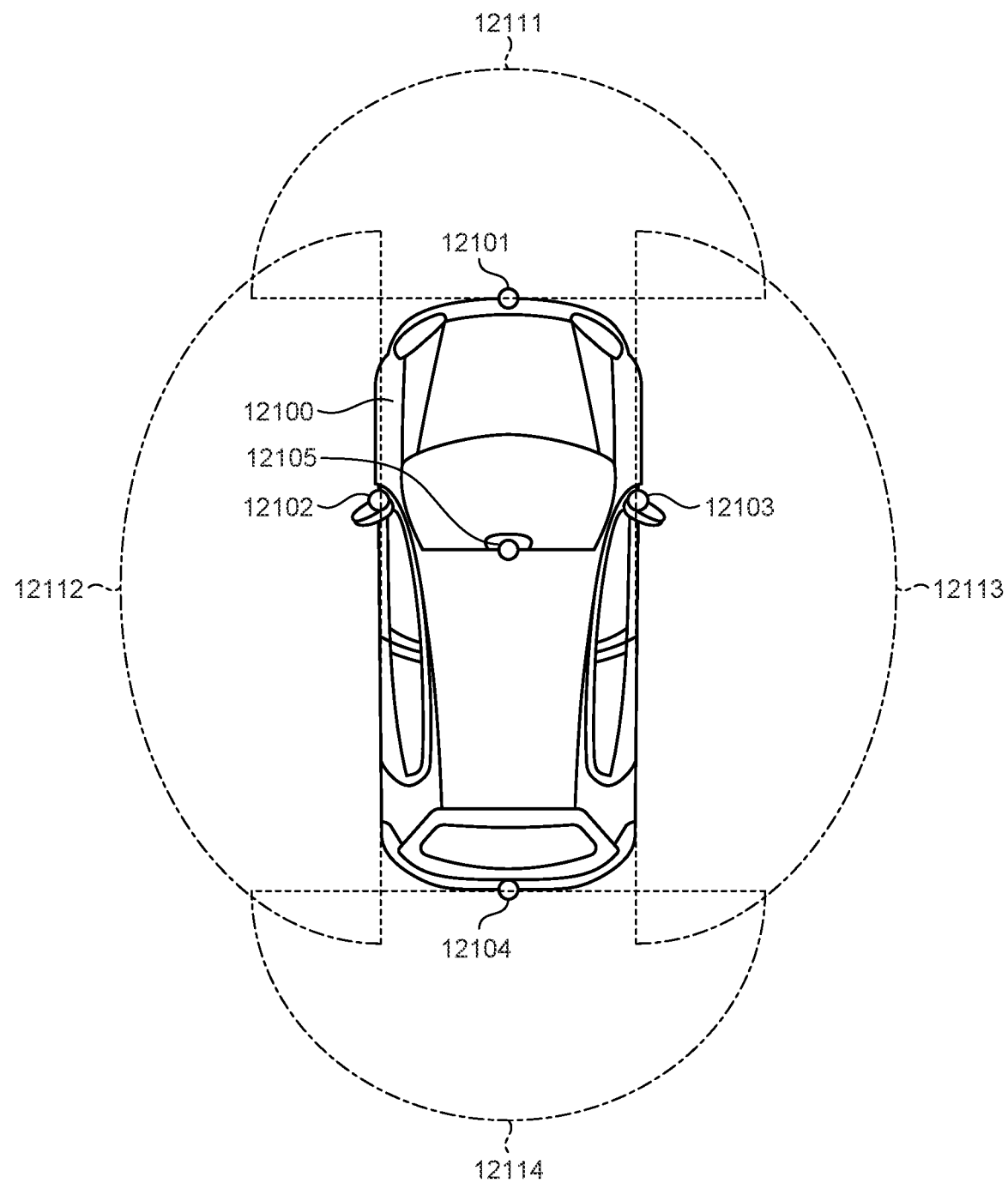
FIG. 65 is an explanatory diagram illustrating exemplary installation positions of an external information detection unit and an image capturing unit.

FIG. 65 is a diagram illustrating an exemplary installation position of the image capturing unit 12031.

In FIG. 65, a vehicle 12100 includes, as the image capturing unit 12031, image capturing units 12101, 12102, 12103, 12104, and 12105.

The image capturing units 12101, 12102, 12103, 12104, and 12105 are provided at positions, for example, the front nose, the side mirrors, the rear bumper, and the rear door of the vehicle 12100, an upper part of the front glass in the vehicle, and the like. The image capturing unit 12101 provided at the front nose and the image capturing unit 12105 provided at the upper part of the front glass in the vehicle mainly acquire images of the front side of the vehicle 12100. The image capturing units 12102 and 12103 provided at the side mirrors mainly acquire images of the sides of the vehicle 12100. The image capturing unit 12104 provided at the rear bumper or the rear door mainly acquires an image of the back side of the vehicle 12100. The front-side images acquired by the image capturing units 12101 and 12105 are mainly used to detect a preceding vehicle, a pedestrian, an obstacle, a traffic light, a traffic sign, a lane, or the like.

Note that FIG. 65 illustrates exemplary image capturing ranges of the image capturing units 12101 to 12104. An image capturing range 12111 indicates the image capturing range of the image capturing unit 12101 provided at the front nose, image capturing ranges 12112 and 12113 indicate the image capturing ranges of the image capturing units 12102 and 12103 provided at the respective side mirrors, and an image capturing range 12114 indicates the image capturing range of the image capturing unit 12104 provided at the rear bumper or the rear door. For example, image data captured by the image capturing units 12101 to 12104 can be placed together to obtain a panoramic image when the vehicle 12100 is viewed from above.

At least one of the image capturing units 12101 to 12104 may have a function of acquiring distance information. For example, at least one of the image capturing units 12101 to 12104 may be a stereo camera made of a plurality of image capturing elements or may be an image capturing element including pixels for phase difference detection.

For example, the microcomputer 12051 calculates the distance to each stereoscopic object in the image capturing ranges 12111 to 12114 and temporal change (speed relative to the vehicle 12100) of the distance based on distance information obtained from the image capturing units 12101 to 12104, thereby extracting, as a preceding vehicle, in particular, a stereoscopic object that is nearest on the traveling path of the vehicle 12100 and traveling at a predetermined speed (for example, equal to or higher than 0 km/h) in a direction substantially same as that of the vehicle 12100. In addition, the microcomputer 12051 sets an inter-vehicular distance to be ensured to a preceding vehicle in advance, thereby performing automatic brake control (including follow stop control), automatic acceleration control (including follow start control), and the like. In this manner, it is possible to perform cooperative control for, for example, automated driving of autonomously traveling independently from operation by the driver.

For example, the microcomputer 12051 can classify, based on distance information obtained from the image capturing units 12101 to 12104, stereoscopic object data related to a stereoscopic object into a two-wheel vehicle, a standard-size vehicle, a large-size vehicle, a pedestrian, a utility pole, and other stereoscopic objects, extract the stereoscopic object data, and use the stereoscopic object data for obstacle automatic avoidance. For example, the microcomputer 12051 identifies an obstacle in surroundings of the vehicle 12100 as an obstacle that is visually recognizable by the driver of the vehicle 12100 or an obstacle difficult to be visually recognized. Then, the microcomputer 12051 determines a collision risk indicating a danger degree of collision with each obstacle, and in a situation in which the collision risk is equal to or larger than a set value and collision is likely to happen, the microcomputer 12051 can perform operation support for collision avoidance by outputting an alert to the driver through the audio speaker 12061 and the display unit 12062 or performing forced deceleration and avoidance steering through the drive system control unit 12010.

At least one of the image capturing units 12101 to 12104 may be an infrared camera configured to detect infrared. For example, the microcomputer 12051 can recognize a pedestrian by determining whether the pedestrian exists in images captured by the image capturing units 12101 to 12104. This pedestrian recognition is performed through, for example, a procedure of extracting feature points in images captured by the image capturing units 12101 to 12104 as infrared cameras, and a procedure of determining whether an object is a pedestrian by performing pattern matching processing on a series of feature points indicating the outline of the object. When the microcomputer 12051 determines that a pedestrian exists in the images captured by the image capturing units 12101 to 12104 and recognizes the pedestrian, the voice-image output unit 12052 controls the display unit 12062 to display the recognized pedestrian in superimposition with a rectangular outline line for enhancement. The voice-image output unit 12052 may control the display unit 12062 to display an icon or the like illustrating the pedestrian at a desired position.

The above description is made on an example of the vehicle control system to which the technology of the present disclosure is applicable. The technology of the present disclosure is applicable to, for example, the image capturing unit 12031 among the above-described components.

11. Summary

As described above, according to each embodiment of the present disclosure, it is possible to provide the solid-state image capturing element 100, the solid-state image capturing device 1, and the reading method for the solid-state image capturing element 100, which are capable of avoiding an increase in manufacturing cost as well as degradation of characteristics.

Note that although each embodiment of the present disclosure describes above the solid-state image capturing element 100 in which the first conduction type is the P-type, the second conduction type is the N-type, and an electron is used as signal electric charge, the embodiments of the present disclosure are not limited to such an example. For example, each embodiment is applicable to the solid-state image capturing element 100 in which the first conduction type is the N-type, the second conduction type is the P-type, and a hole is used as a signal electric charge.

In each embodiment of the present disclosure described above, the semiconductor substrate 300 does not necessarily need to be a silicon substrate but may be another substrate (for example, a silicon-on insulator (SOI) substrate or a SiGe substrate). The above-described the semiconductor substrate 300 may be obtained by forming semiconductor structures and the like on such various kinds of substrates.

The solid-state image capturing element 100 according to each embodiment of the present disclosure is not limited to a solid-state image capturing element configured to sense distribution of the incident amount of visible light and capture an image of the distribution. For example, the present embodiment is applicable to a solid-state image capturing element configured to capture an image of distribution of the incident amount of infrared, X-rays, particles, or the like, and a solid-state image capturing element (physical quantity distribution sensing device) such as a fingerprint detection sensor configured to sense distribution of another physical quantity such as pressure or capacitance and capture an image of the distribution.

The solid-state image capturing element 100 according to each embodiment of the present disclosure can be manufactured by using methods, devices, and conditions used to manufacture a typical semiconductor device. Specifically, the solid-state image capturing element 100 according to each embodiment can be manufactured by using an existing semiconductor-device manufacturing process.

Note that examples of the above-described methods include the PVD method, the CVD method, and the ALD method. Examples of the PVD method include a vacuum evaporation method, an electron beam (EB) evaporation coating method, various sputtering methods (a magnetron sputtering method, a RF-DC coupled bias sputtering method, an electron cyclotron resonance (ECR) sputtering method, a facing target sputtering method, a high frequency sputtering method, an ion plating method, a laser ablation method, a molecular beam epitaxy method (MBE method), and a laser transfer method. Examples of the CVD method include a plasma CVD method, a thermal CVD method, an organic metal (MO) CVD method, and an optical CVD method. Other methods are an electrolytic plating method, a non-electrolytic plating method, a spin coat method; an immersion method; a cast method; a micro contact print method; a drop cast method; various printing methods such as a screen printing method, an ink jet printing method, an offset printing method, a gravure printing method, and a flexographic printing method; a stamp method; a spray method; and various coating methods such as an air coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Examples of patterning methods include chemical etching such as shadow mask, laser transfer, and photolithography, physical etching using ultraviolet or laser, and the like. Examples of flattening technologies include the CMP method, a laser flattening method, and a reflow method.

12. Supplement

Preferable embodiments of the present disclosure are described above in detail with reference to the accompanying drawings, but the technical scope of the present disclosure is not limited to such examples. Various changes and modifications could be thought of by a person having typical knowledge in the technical field of the present disclosure within the range of the technical idea written in the claims, and it should be understood that these changes and modifications belong to the technical scope of the present disclosure.

Effects stated in the present specification are explanatory or exemplary but not restrictive. Thus, the technology according to the present disclosure achieves, together with or in place of the above-described effects, any other effect that is obvious to the skilled person in the art from description of the present specification.

Configurations as described below belong to the technical scope of the present disclosure.

(1)

A solid-state image capturing element comprising:
a semiconductor substrate;
a first photoelectric conversion part provided above the semiconductor substrate and configured to convert light into electric charge; and
a second photoelectric conversion part provided above the first photoelectric conversion part and configured to convert light into electric charge, wherein
the first and the second photoelectric conversion parts each have a laminated structure including
an upper electrode,
a lower electrode,
a photoelectric conversion film sandwiched between the upper electrode and the lower electrode, and
an accumulation electrode facing the upper electrode through the photoelectric conversion film and an insulating film, and
the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate.

(2)

The solid-state image capturing element according to (1), wherein the lower electrode of each of the first and the second photoelectric conversion parts is electrically connected with a common pixel transistor through the common penetration electrode, the common pixel transistor being provided in common to the first and the second photoelectric conversion parts in the semiconductor substrate.

(3)

The solid-state image capturing element according to (1) or (2), further comprising a first wiring layer sandwiched between the semiconductor substrate and the first photoelectric conversion part, wherein the lower electrode of each of the first and the second photoelectric conversion parts is electrically connected with the common penetration electrode through a first wire included in the first wiring layer.

(4)

The solid-state image capturing element according to any one of (1) to (3), wherein the lower electrode of the second photoelectric conversion part is electrically connected with the lower electrode of the first photoelectric conversion part through a first penetration electrode penetrating through the first photoelectric conversion part.

(5)

The solid-state image capturing element according to (4), further comprising a second wiring layer sandwiched between the first photoelectric conversion part and the second photoelectric conversion part, wherein
 the lower electrode of the second photoelectric conversion part is electrically connected with the first penetration electrode through a second wire included in the second wiring layer.

(6)

The solid-state image capturing element according to (5), wherein the first penetration electrode penetrates through the second wiring layer and the first photoelectric conversion part from the second wire to the lower electrode of the first photoelectric conversion part.

(7)

The solid-state image capturing element according to (2), further comprising a third photoelectric conversion part provided above the second photoelectric conversion part and configured to convert light into electric charge, wherein
 the third photoelectric conversion part has the laminated structure, and
 the lower electrode of the third photoelectric conversion part is electrically connected with the common electric charge accumulation part through the common penetration electrode.

(8)

The solid-state image capturing element according to (7), wherein the lower electrode of the third photoelectric conversion part is electrically connected with the common pixel transistor through the common penetration electrode.

(9)

The solid-state image capturing element according to (7) or (8), wherein the lower electrode of the third photoelectric conversion part is electrically connected with the lower electrode of the second photoelectric conversion part through a second penetration electrode penetrating through the second photoelectric conversion part.

(10)

The solid-state image capturing element according to (9), further comprising a third wiring layer sandwiched between the second photoelectric conversion part and the third photoelectric conversion part, wherein
 the lower electrode of the third photoelectric conversion part is electrically connected with the second penetration electrode through a third wire included in the third wiring layer.

(11)

The solid-state image capturing element according to (10), wherein the second penetration electrode penetrates through the third wiring layer and the second photoelectric conversion part from the third wire to the lower electrode of the second photoelectric conversion part.

(12)

The solid-state image capturing element according to any one of (1) to (11), wherein the laminated structure further includes a transfer electrode provided between the lower electrode and the accumulation electrode and facing the upper electrode through the photoelectric conversion film and the insulating film.

(13)

The solid-state image capturing element according to any one of (1) to (12), wherein the photoelectric conversion film includes an organic material.

(14)

The solid-state image capturing element according to any one of (1) to (13), further comprising a fourth photoelectric conversion part provided in the semiconductor substrate and configured to convert light into electric charge.

(15)

The solid-state image capturing element according to any one of (4) to (6), wherein when the solid-state image capturing element is viewed from above,
 a first exposure region that is exposed through an opening provided at the insulating film of the first photoelectric conversion part and contacts the photoelectric conversion film of the first photoelectric conversion part is provided at part of the lower electrode of the first photoelectric conversion part, and
 a first contact region contacting the first penetration electrode is provided at a remaining part of the lower electrode of the first photoelectric conversion part.

(16)

The solid-state image capturing element according to (15), wherein when the solid-state image capturing element is viewed from above,
 a second exposure region that is exposed through an opening provided at the insulating film of the second photoelectric conversion part and contacts the photoelectric conversion film of the second photoelectric conversion part is provided at the lower electrode of the second photoelectric conversion part, and
 a second contact region electrically connected with the first penetration electrode is provided at part of the second exposure region.

(17)

A solid-state image capturing device comprising a plurality of solid-state image capturing elements disposed in a matrix,
 each of the solid-state image capturing elements including
  a semiconductor substrate,
  a first photoelectric conversion part provided above the semiconductor substrate and configured to convert light into electric charge, and
  a second photoelectric conversion part provided above the first photoelectric conversion part and configured to convert light into electric charge, wherein
 the first and the second photoelectric conversion parts each have a laminated structure including
  an upper electrode,
  a lower electrode,
  a photoelectric conversion film sandwiched between the upper electrode and the lower electrode, and
  an accumulation electrode facing the upper electrode through the photoelectric conversion film and an insulating film, and
 the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate.

(18)

The solid-state image capturing device according to (17), further comprising a third penetration electrode provided at an outer peripheral part surrounding a pixel region in which the plurality of solid-state image capturing elements are disposed, wherein the lower electrode of the second photoelectric conversion part is electrically connected with the common penetration electrode through the third penetration electrode.

(19)

The solid-state image capturing device according to (17) or (18), wherein each of the solid-state image capturing elements further includes a shield electrode provided between the solid-state image capturing elements adjacent to each other when the solid-state image capturing device is viewed from above.

(20)

A solid-state image capturing element reading method, the solid-state image capturing element including
  a semiconductor substrate,
  a first photoelectric conversion part provided above the semiconductor substrate and configured to convert light into electric charge, and
  a second photoelectric conversion part provided above the first photoelectric conversion part and configured to convert light into electric charge,
  the first and the second photoelectric conversion parts each having a laminated structure including
    an upper electrode,
    a lower electrode,
    a photoelectric conversion film sandwiched between the upper electrode and the lower electrode, and
    an accumulation electrode facing the upper electrode through the photoelectric conversion film and an insulating film, and
  the lower electrode of each of the first and the second photoelectric conversion parts being electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate,
the solid-state image capturing element reading method comprising:
  controlling the accumulation electrode of each of the first and the second photoelectric conversion parts to sequentially transfer electric charge accumulated in the photoelectric conversion film of each of the first and the second photoelectric conversion parts to the lower electrode of each of the first and the second photoelectric conversion parts in a temporally sequential manner; and
  sequentially accumulating the electric charge sequentially transferred to the lower electrode of each of the first and the second photoelectric conversion parts in the common electric charge accumulation part and sequentially reading the accumulated electric charge.

REFERENCE SIGNS LIST 1 solid-state image capturing device
10, 10a, 10b, 10c, 10d, 10e, 10f, 10g, 80 pixel array part
32 vertical drive circuit part
34 column signal processing circuit part
36 horizontal drive circuit part
38 output circuit part
40 control circuit part
42 pixel drive wire
44 vertical signal line
46 horizontal signal line
48 input-output terminal
50 outer peripheral part
100, 100a, 100b, 100c, 800 solid-state image capturing element
150, 350 organic film
200, 520, 620, 720 wiring layer
230, 530, 570, 572, 630, 630a, 670, 672, 730, 770, 772 wire
232, 530a electrode
240 interlayer insulating film
250, 252, 254, 256, 258, 260, 262 metal film
300 semiconductor substrate
310, 312, 410 semiconductor region
314, 814 floating diffusion part
342 separation insulating film
352 photoresist
400, 500, 600, 700, 802, 804, 806 photoelectric conversion element
402 antireflection film
404a, 404b waveguide
406a, 406b inner lens
408a, 408b partition
480, 580 transparent conductive layer
450, 462, 506, 540, 562, 606, 640, 662, 706, 740, 762, 780 insulating film
460, 460a, 560, 560a, 660, 760, 860 penetration electrode
502, 602, 702 common electrode
504, 604, 704 photoelectric conversion film
506a, 606a opening
508, 518, 608, 708 reading electrode
508a, 608a exposure region
508b, 608b contact region
512, 612 transfer electrode
514, 614 shield electrode
510, 610, 710 accumulation electrode
590, 690 shield pattern
790 on-chip lens
900 electronic device
902 image capturing device
910 optical lens
912 shutter mechanism
914 drive circuit unit
916 signal processing circuit unit

What is claimed is:

1. A solid-state image capturing element comprising:
  a semiconductor substrate;
  a first photoelectric conversion part provided above the semiconductor substrate and configured to convert light into electric charge; and
  a second photoelectric conversion part provided above the first photoelectric conversion part and configured to convert light into electric charge, wherein
  the first and the second photoelectric conversion parts each have a laminated structure including
    an upper electrode,
    a lower electrode,
    a photoelectric conversion film sandwiched between the upper electrode and the lower electrode, and
    an accumulation electrode facing the upper electrode through the photoelectric conversion film and an insulating film, and
  the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate.

2. The solid-state image capturing element according to claim 1, wherein the lower electrode of each of the first and the second photoelectric conversion parts is electrically connected with a common pixel transistor through the common penetration electrode, the common pixel transistor being provided in common to the first and the second photoelectric conversion parts in the semiconductor substrate.

3. The solid-state image capturing element according to claim 1, further comprising a first wiring layer sandwiched between the semiconductor substrate and the first photoelectric conversion part, wherein
the lower electrode of each of the first and the second photoelectric conversion parts is electrically connected with the common penetration electrode through a first wire included in the first wiring layer.

4. The solid-state image capturing element according to claim 1, wherein the lower electrode of the second photoelectric conversion part is electrically connected with the lower electrode of the first photoelectric conversion part through a first penetration electrode penetrating through the first photoelectric conversion part.

5. The solid-state image capturing element according to claim 4, further comprising a second wiring layer sandwiched between the first photoelectric conversion part and the second photoelectric conversion part, wherein
the lower electrode of the second photoelectric conversion part is electrically connected with the first penetration electrode through a second wire included in the second wiring layer.

6. The solid-state image capturing element according to claim 5, wherein the first penetration electrode penetrates through the second wiring layer and the first photoelectric conversion part from the second wire to the lower electrode of the first photoelectric conversion part.

7. The solid-state image capturing element according to claim 2, further comprising a third photoelectric conversion part provided above the second photoelectric conversion part and configured to convert light into electric charge, wherein
the third photoelectric conversion part has the laminated structure, and
the lower electrode of the third photoelectric conversion part is electrically connected with the common electric charge accumulation part through the common penetration electrode.

8. The solid-state image capturing element according to claim 7, wherein the lower electrode of the third photoelectric conversion part is electrically connected with the common pixel transistor through the common penetration electrode.

9. The solid-state image capturing element according to claim 7, wherein the lower electrode of the third photoelectric conversion part is electrically connected with the lower electrode of the second photoelectric conversion part through a second penetration electrode penetrating through the second photoelectric conversion part.

10. The solid-state image capturing element according to claim 9, further comprising a third wiring layer sandwiched between the second photoelectric conversion part and the third photoelectric conversion part, wherein
the lower electrode of the third photoelectric conversion part is electrically connected with the second penetration electrode through a third wire included in the third wiring layer.

11. The solid-state image capturing element according to claim 10, wherein the second penetration electrode penetrates through the third wiring layer and the second photoelectric conversion part from the third wire to the lower electrode of the second photoelectric conversion part.

12. The solid-state image capturing element according to claim 1, wherein the laminated structure further includes a transfer electrode provided between the lower electrode and the accumulation electrode and facing the upper electrode through the photoelectric conversion film and the insulating film.

13. The solid-state image capturing element according to claim 1, wherein the photoelectric conversion film includes an organic material.

14. The solid-state image capturing element according to claim 1, further comprising a fourth photoelectric conversion part provided in the semiconductor substrate and configured to convert light into electric charge.

15. The solid-state image capturing element according to claim 4, wherein when the solid-state image capturing element is viewed from above,
a first exposure region that is exposed through an opening provided at the insulating film of the first photoelectric conversion part and contacts the photoelectric conversion film of the first photoelectric conversion part is provided at part of the lower electrode of the first photoelectric conversion part, and
a first contact region contacting the first penetration electrode is provided at a remaining part of the lower electrode of the first photoelectric conversion part.

16. The solid-state image capturing element according to claim 15, wherein when the solid-state image capturing element is viewed from above,
a second exposure region that is exposed through an opening provided at the insulating film of the second photoelectric conversion part and contacts the photoelectric conversion film of the second photoelectric conversion part is provided at the lower electrode of the second photoelectric conversion part, and
a second contact region electrically connected with the first penetration electrode is provided at part of the second exposure region.

17. A solid-state image capturing device comprising a plurality of solid-state image capturing elements disposed in a matrix,
each of the solid-state image capturing elements including
a semiconductor substrate,
a first photoelectric conversion part provided above the semiconductor substrate and configured to convert light into electric charge, and
a second photoelectric conversion part provided above the first photoelectric conversion part and configured to convert light into electric charge, wherein
the first and the second photoelectric conversion parts each have a laminated structure including
an upper electrode,
a lower electrode,
a photoelectric conversion film sandwiched between the upper electrode and the lower electrode, and
an accumulation electrode facing the upper electrode through the photoelectric conversion film and an insulating film, and the lower electrode of each of the first and the second photoelectric conversion parts is electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate.

18. The solid-state image capturing device according to claim 17, further comprising a third penetration electrode provided at an outer peripheral part surrounding a pixel region in which the plurality of solid-state image capturing elements are disposed, wherein
the lower electrode of the second photoelectric conversion part is electrically connected with the common penetration electrode through the third penetration electrode.

19. The solid-state image capturing device according to claim 17, wherein each of the solid-state image capturing elements further includes a shield electrode provided between the solid-state image capturing elements adjacent to each other when the solid-state image capturing device is viewed from above.

20. A solid-state image capturing element reading method, the solid-state image capturing element including
a semiconductor substrate,
a first photoelectric conversion part provided above the semiconductor substrate and configured to convert light into electric charge, and
a second photoelectric conversion part provided above the first photoelectric conversion part and configured to convert light into electric charge,
the first and the second photoelectric conversion parts each having a laminated structure including
an upper electrode,
a lower electrode,
a photoelectric conversion film sandwiched between the upper electrode and the lower electrode, and
an accumulation electrode facing the upper electrode through the photoelectric conversion film and an insulating film, and
the lower electrode of each of the first and the second photoelectric conversion parts being electrically connected with a common electric charge accumulation part through a common penetration electrode provided in common to the first and the second photoelectric conversion parts and penetrating through the semiconductor substrate, the common electric charge accumulation part being provided in common to the first and the second photoelectric conversion parts in the semiconductor substrate,
the solid-state image capturing element reading method comprising:
controlling the accumulation electrode of each of the first and the second photoelectric conversion parts to sequentially transfer electric charge accumulated in the photoelectric conversion film of each of the first and the second photoelectric conversion parts to the lower electrode of each of the first and the second photoelectric conversion parts in a temporally sequential manner; and
sequentially accumulating the electric charge sequentially transferred to the lower electrode of each of the first and the second photoelectric conversion parts in the common electric charge accumulation part and sequentially reading the accumulated electric charge.

\* \* \* \* \*